US012564057B2

(12) United States Patent \
Hou et al.

(10) Patent No.: US 12,564,057 B2 \
(45) Date of Patent: Feb. 24, 2026

(54) CHIPLET INTERPOSER

(71) Applicant: Taiwan Semiconductor Manufacturing Co., Ltd., Hsinchu (TW)

(72) Inventors: Shang-Yun Hou, Jubei (TW); Weiming Chris Chen, Hsinchu (TW); Kuo-Chiang Ting, Hsinchu (TW); Hsien-Pin Hu, Zhubei (TW); Wen-Chih Chiou, Zhunan Township (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/635,315

(22) Filed: Apr. 15, 2024

(65) Prior Publication Data

US 2024/0266303 A1     Aug. 8, 2024

Related U.S. Application Data

(62) Division of application No. 17/339,745, filed on Jun. 4, 2021, now Pat. No. 11,996,371.

(Continued)

(51) Int. Cl. \
*H01L 23/31*        (2006.01) \
*H01L 21/48*        (2006.01) \
(Continued)

(52) U.S. Cl. \
CPC ........ *H01L 23/562* (2013.01); *H01L 21/4853* (2013.01); *H01L 21/4857* (2013.01); \
(Continued)

(58) Field of Classification Search \
CPC .............. H01L 23/562; H01L 21/4853; H01L 21/4857; H01L 21/563; H01L 21/565; H01L 21/568; H01L 21/6835; H01L 23/3128; H01L 23/3135; H01L 23/5383; H01L 23/5385; H01L 23/5386; H01L 24/16; H01L 25/0655; H01L 25/50; H01L 2221/6835; H01L 2224/16227; H01L 2924/3511; H01L 2924/35121; H01L 25/16; H01L 25/18; H01L 21/486; \
(Continued)

(56) References Cited

U.S. PATENT DOCUMENTS

| | | |
|---|---|---|
| 6,150,840 A | 11/2000 | Patel et al. |
| 8,993,380 B2 | 3/2015 | Hou et al. |

(Continued)

FOREIGN PATENT DOCUMENTS

| | | |
|---|---|---|
| CN | 106997153 A | 8/2017 |
| CN | 109524384 A | 3/2019 |

(Continued)

*Primary Examiner* — Evan G Clinton \
(74) *Attorney, Agent, or Firm* — Slater Matsil, LLP

(57) ABSTRACT

Embodiments include packages and methods for forming packages which include interposers having a substrate made of a dielectric material. The interposers may also include a redistribution structure over the substrate which includes metallization patterns which are stitched together in a patterning process which includes multiple lateral overlapping patterning exposures.

20 Claims, 51 Drawing Sheets

Related U.S. Application Data

(60) Provisional application No. 63/148,636, filed on Feb. 12, 2021.

(51) Int. Cl.

| | |
|---|---|
| *H01L 21/56* | (2006.01) |
| *H01L 21/683* | (2006.01) |
| *H01L 23/00* | (2006.01) |
| *H01L 23/538* | (2006.01) |
| *H01L 25/00* | (2006.01) |
| *H01L 25/065* | (2023.01) |

(52) U.S. Cl.
CPC .......... *H01L 21/563* (2013.01); *H01L 21/565* (2013.01); *H01L 21/568* (2013.01); *H01L 21/6835* (2013.01); *H01L 23/3128* (2013.01); *H01L 23/3135* (2013.01); *H01L 23/5383* (2013.01); *H01L 23/5385* (2013.01); *H01L 23/5386* (2013.01); *H01L 24/16* (2013.01); *H01L 25/0655* (2013.01); *H01L 25/50* (2013.01); *H01L 2221/6835* (2013.01); *H01L 2224/16227* (2013.01); *H01L 2924/3511* (2013.01); *H01L 2924/35121* (2013.01)

(58) Field of Classification Search
CPC . H01L 2224/16225; H01L 2224/32225; H01L 2924/18161; H01L 23/49816; H01L 23/5384; H01L 2224/73204; H01L 23/49838; H01L 23/3107; H01L 23/49822; H01L 23/49827; H01L 24/02; H01L 24/97; H01L 2021/60015; H01L 2224/03001; H01L 2224/97
See application file for complete search history.

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,163,856 B2 | 12/2018 | Chen et al. | |
| 10,515,888 B2 | 12/2019 | Ting et al. | |
| 2011/0291288 A1 | 12/2011 | Wu et al. | |
| 2013/0105213 A1 | 5/2013 | Hu et al. | |
| 2013/0242493 A1 | 9/2013 | Shenoy et al. | |
| 2014/0001645 A1 | 1/2014 | Lin et al. | |
| 2014/0070424 A1 | 3/2014 | Chuang et al. | |
| 2014/0077387 A1 | 3/2014 | Chuang et al. | |
| 2015/0194361 A1 | 7/2015 | Hou et al. | |
| 2016/0300817 A1 | 10/2016 | Do et al. | |
| 2017/0125379 A1 | 5/2017 | Chen et al. | |
| 2017/0213798 A1* | 7/2017 | Wei | H01L 24/06 |
| 2019/0088582 A1 | 3/2019 | Ting et al. | |
| 2019/0096794 A1 | 3/2019 | Liao | |
| 2020/0381374 A1 | 12/2020 | Chen et al. | |
| 2021/0043570 A1 | 2/2021 | Ganesan et al. | |
| 2021/0043571 A1 | 2/2021 | Hou et al. | |
| 2022/0068663 A1* | 3/2022 | Huang | H01L 23/50 |

FOREIGN PATENT DOCUMENTS

| | | | |
|---|---|---|---|
| CN | 111446177 | A | 7/2020 |
| DE | 102016100523 | A1 | 5/2017 |
| DE | 102017126181 | A1 | 2/2019 |
| KR | 20140001085 | A | 1/2014 |
| KR | 20140147588 | A | 12/2014 |
| KR | 20160100196 | A | 8/2016 |
| KR | 20200002630 | A | 1/2020 |
| KR | 20200083398 | A | 7/2020 |

* cited by examiner

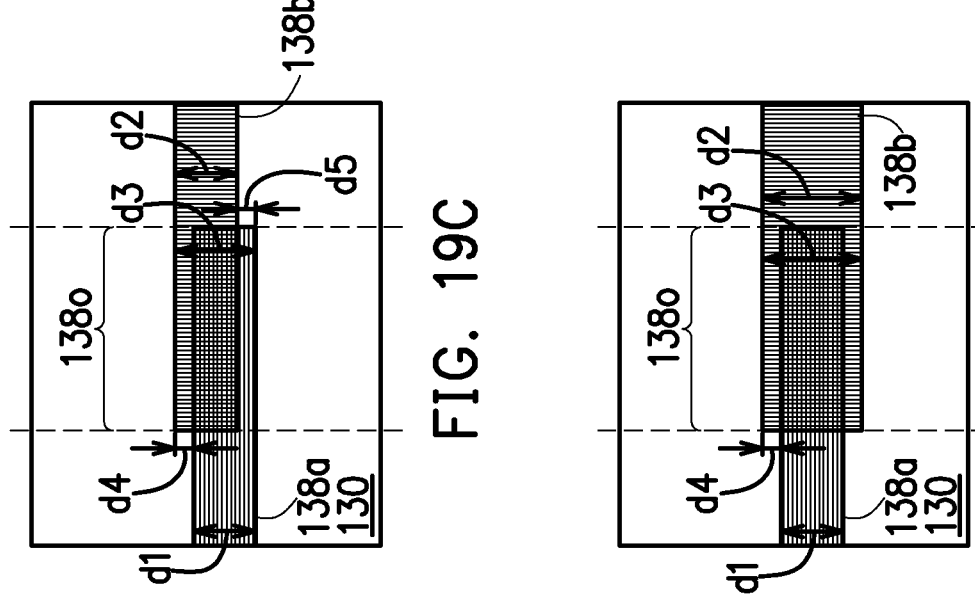
FIG. 19C
FIG. 19D
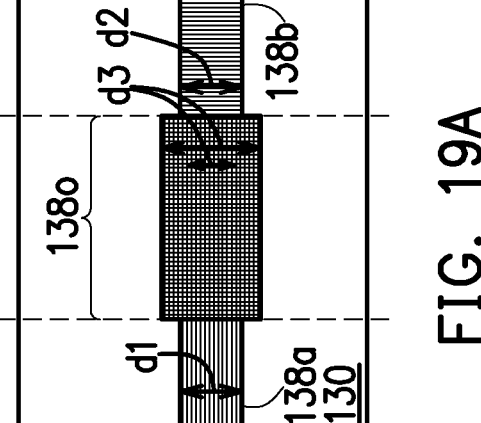
FIG. 19A
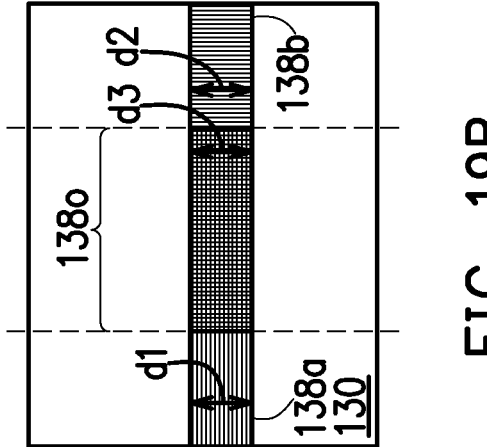
FIG. 19B

210

202

CHIPLET INTERPOSER

PRIORITY CLAIM AND CROSS-REFERENCE

This patent is a divisional of U.S. application Ser. No. 17/339,745, filed on Jun. 4, 2021, now U.S. Pat. No. 11,996,371, issued May 28, 2024, which claims priority to U.S. Provisional Application No. 63/148,636, filed on Feb. 12, 2021, each application is hereby incorporated by reference herein as if reproduced in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. Another example is a Chip-On-Wafer-On-Substrate (CoWoS) structure. In some embodiments, to from a CoWoS structure, a plurality of semiconductor chips are attached to a wafer, and a dicing process is performed next to separate the wafer into a plurality of interposers, where each of the interposers has one or more semiconductor chips attached thereto. The interposer with semiconductor chips(s) attached is referred to as a Chip-On-Wafer (CoW) structure. The CoW structure is then attached to a substrate (e.g., a printed circuit board) to form a CoWoS structure. These and other advanced packaging technologies enable production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 22 illustrate cross-sectional and top down views of intermediate steps during a process for forming a chiplet interposer, in accordance with some embodiments.

DETAILED DESCRIPTION

Figure 1:
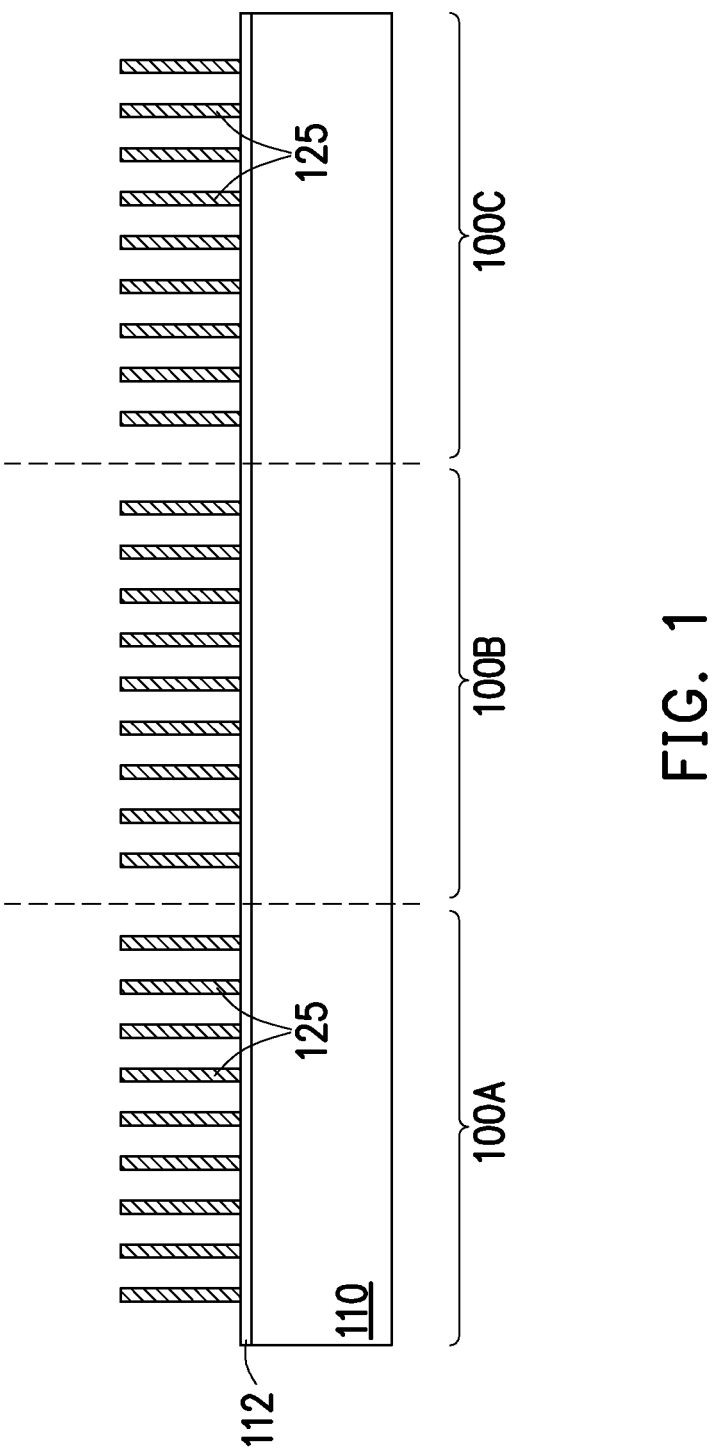

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a chiplet interposer is formed which includes a dielectric fill layer acting as a substrate layer, rather than, for example, a silicon layer or a preformed substrate core layer. Utilizing a dielectric fill layer as the substrate layer is cost effective and advantageously provides a lower stress concentration than using a silicon substrate layer or the like. The chiplet interposer has attached a carrier substrate which can be removed after placing the chiplet interposer in a package device. The chiplet interposer may also incorporate a redistribution structure, and in some embodiments, the redistribution structure can be formed through multiple side-by-side patterning processes in a stitching process which provides the ability to combine several patterns side-by-side in a larger metallization pattern of a particular layer of the redistribution structure.

FIGS. 1 through 21 illustrate cross-sectional and top down views of intermediate steps in a process of forming a dielectric interposer. A dielectric interposer advantageously does not utilize a silicon substrate and instead uses a dielectric substrate. As a result, the dielectric interposer may be produced in a more cost-effective manner than a silicon-based interposer. Also, the dielectric interposer can have a more desirable stress concentration effect, thereby reducing stress of the resulting package.

In FIG. 1 a carrier substrate 110 is provided. In some embodiments, a release layer 112 (omitted in further Figures for the sake of simplicity) is formed on the carrier substrate 110. Other embodiments may omit the release layer 112. The carrier substrate 110 may be a glass carrier substrate, a ceramic carrier substrate, or the like. The carrier substrate 110 may be a silicon based substrate, such as a silicon bulk. The carrier substrate 110 will be removed in a subsequent step, such as by decomposing the release layer 112 or grinding the carrier substrate 110 away. The carrier substrate 110 may be a wafer, such as illustrated in FIG. 1, such that multiple interposers can be formed on the carrier substrate 110 simultaneously. It should be understood that while three sites are illustrated in FIG. 1, corresponding to an interposer region 100A, interposer region 100B, and interposer region 100C, any number of sites may be used over the carrier substrate 110 simultaneously.

The release layer 112, if used, may be formed of a polymer-based material, which may be removed along with the carrier substrate 110 from the overlying structures that will be formed in subsequent steps. In some embodiments, the release layer 112 is an epoxy-based thermal-release material, which loses its adhesive property when heated, such as a light-to-heat-conversion (LTHC) release coating. In other embodiments, the release layer 112 may be an ultra-violet (UV) glue, which loses its adhesive property when exposed to UV lights. The release layer 112 may be dispensed as a liquid and cured, may be a laminate film laminated onto the carrier substrate 110, or may be the like. The top surface of the release layer 112 may be leveled and may have a high degree of planarity.

Through vias 125 are formed over the carrier substrate 110 and extend away from the carrier substrate 110. As an example to form the through vias 125, a seed layer (not shown) is formed over the carrier substrate 110 (e.g., on the release layer 112 or directly on the carrier substrate 110). In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 125.

Figure 2:
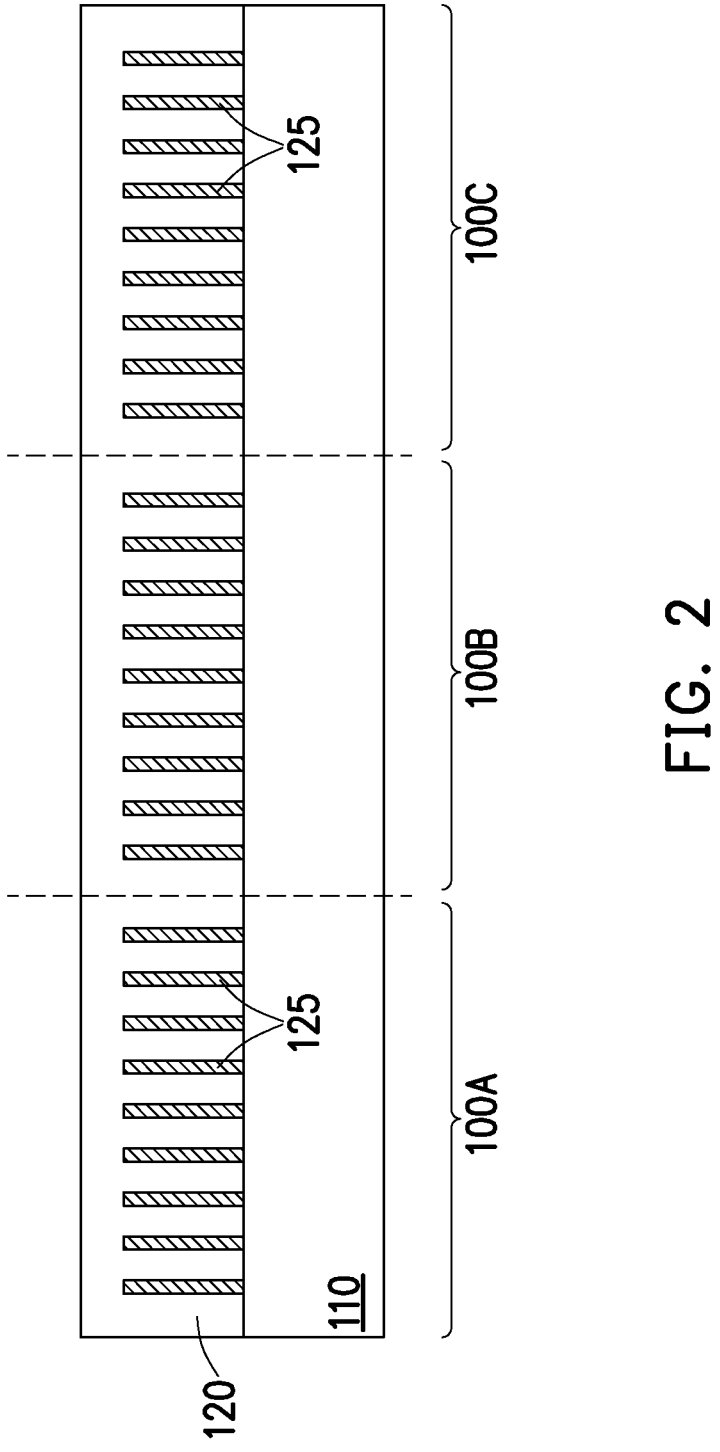

In FIG. 2, a dielectric fill 120 is formed over and around the through vias 125. In some embodiments, the dielectric fill 120 may comprise a non-polymer like silicon dioxide, silicon nitride, or the like, such as another oxide or nitride or other insulating material, which is deposited using any suitable process. For example, the dielectric fill 120 may be formed by CVD, PECVD or ALD deposition process, FCVD, or a spin-on-glass process. However, any suitable material and any suitable deposition process may be utilized. The dielectric fill 120 may be formed to have a thickness, for example, between about 1 μm and about 30 μm thick. In the completed chiplet interposer, the dielectric fill 120 will be the thickest layer of the chiplet interposer when the carrier substrate 110 is removed.

Figure 3:
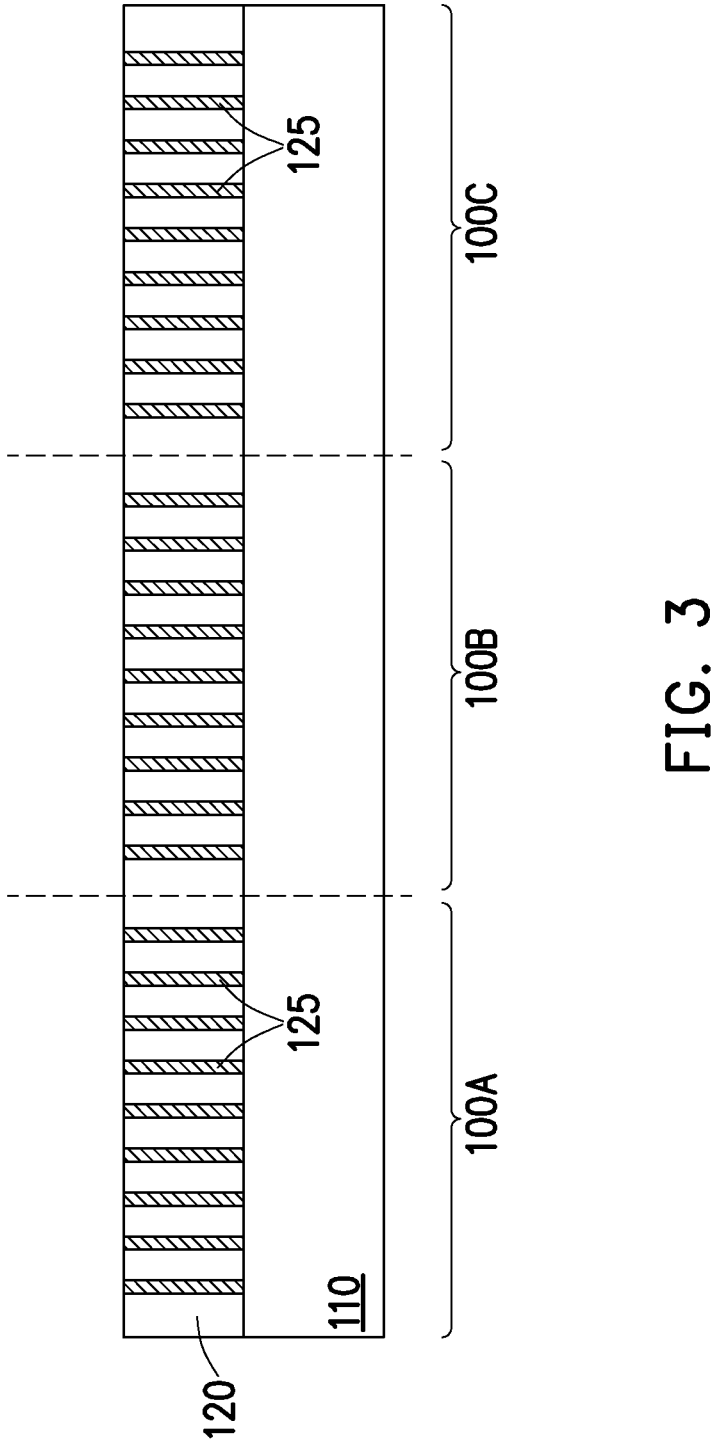

In FIG. 3, a planarization process is performed on the dielectric fill 120 to expose the through vias 125. Top surfaces of the through vias 125 and the dielectric fill 120 are substantially coplanar after the planarization process within process variations. The planarization process may be, for example, a chemical-mechanical polish (CMP), a grinding process, or the like. In some embodiments, the planarization may be omitted, for example, if the through vias 125 are already exposed. The through vias 125 may be used to route signals from one side of the dielectric fill 120 to the opposite side of the dielectric fill 120. Because the through vias 125 traverse the dielectric fill 120, they may be referred to as through dielectric vias or TDVs.

Still referring to FIG. 3, in another embodiment, the dielectric fill 120 may be deposited prior to forming the through vias 125. In such an embodiment, once the dielectric fill 120 has been placed, a photolithographic masking and etching process may be used to form openings through the dielectric fill 120 in order to expose the underlying release layer 112 or carrier substrate 110. Once the openings have been formed, the openings may be filled with a conductive material including, in some embodiments, a liner layer and/or barrier layer. Then, the remainder of the openings may be filled with conductive material. The conductive material may include any of those discussed above for the through vias 125. The conductive material may be formed by electroplating copper onto a seed layer, filling and overfilling the openings. Once the openings have been filled, excess liner, barrier layer, seed layer, and conductive material outside of the openings may be removed through a planarization process such as chemical mechanical polishing (CMP), although any suitable removal process may be used. In such embodiments, the through vias 125 may have a tapered shape, being wider at the top than the bottom (closer to the carrier substrate 110).

Figure 4:
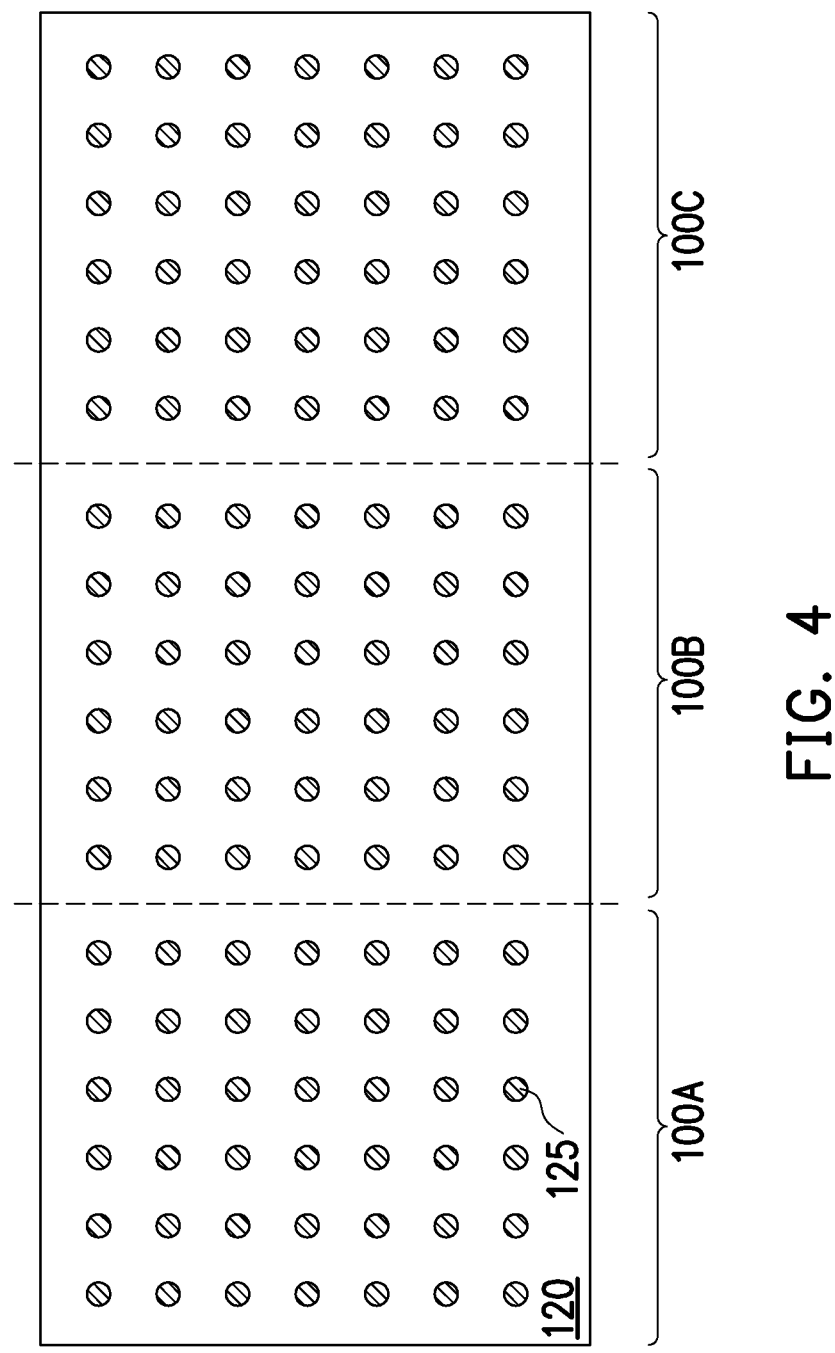

FIG. 4 illustrates an example top down view of the structure of FIG. 3, in accordance with some embodiments. As illustrated in FIG. 4, the dielectric fill 120 is illustrated as well as tops of the through vias 125. Although the through vias 125 are illustrated as being circular, they may be other shapes as well. For example, they may be circular, square, rectangular, elliptical, oblong, rectangular with rounded ends, the like, and or combinations thereof.

Figure 20:
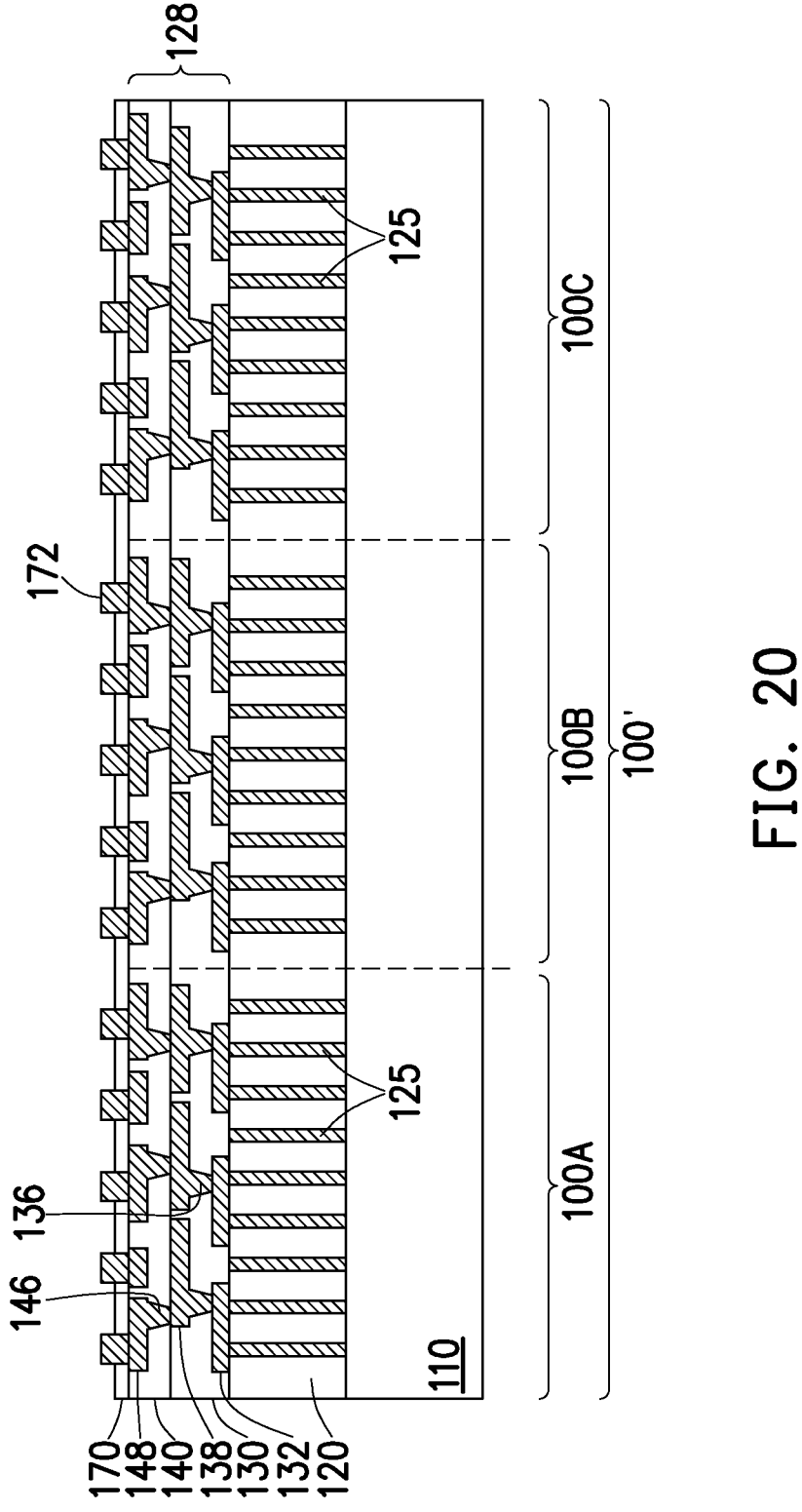

FIGS. 5 through 21 illustrate various views of intermediate steps of a process of forming a redistribution structure 128 (see FIG. 19) over the through vias 125. Referring briefly to FIG. 20, the redistribution structure 128 includes dielectric layers 130 and 140, optional metallization patterns 132, metallization patterns 138 and 148, and vias 136 and 146.

Figure 5:
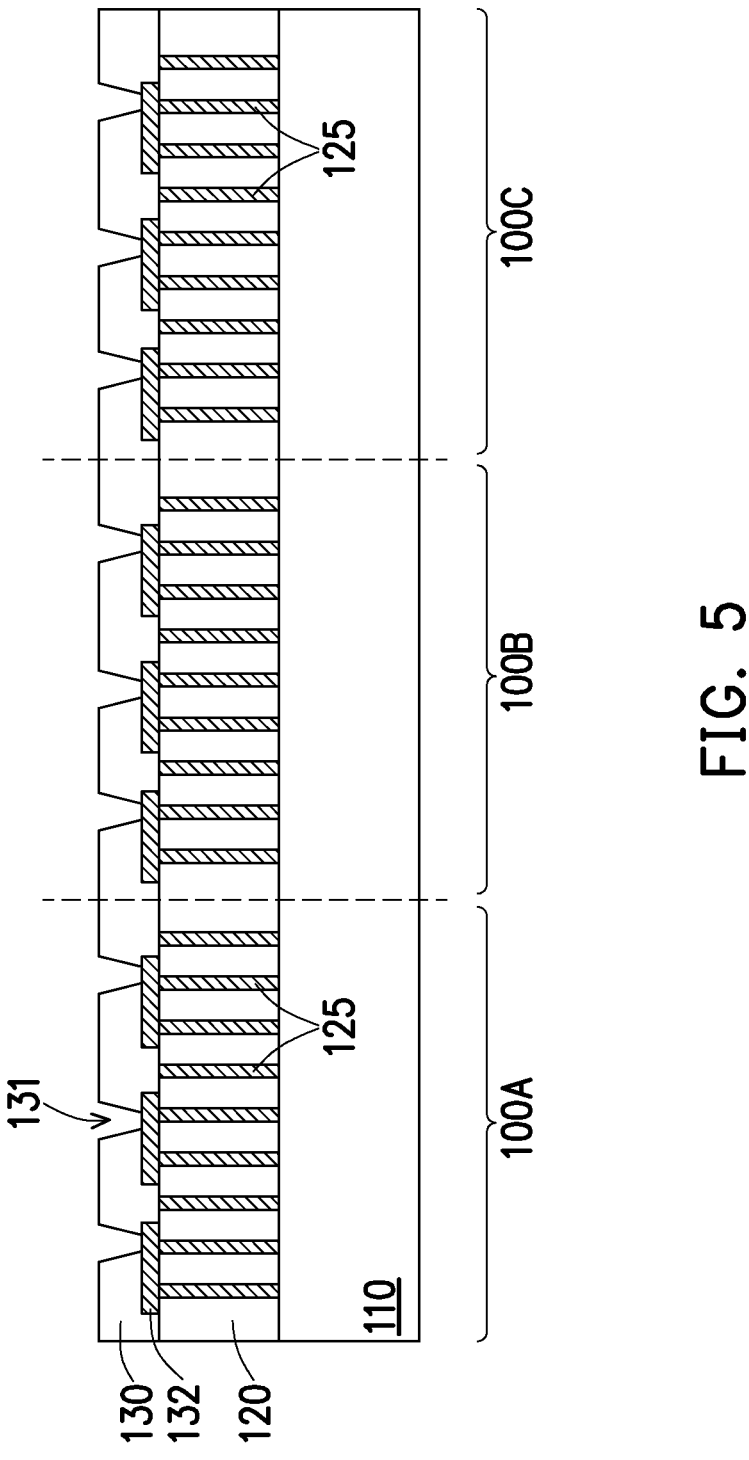

In FIG. 5, the optional metallization pattern 132 may be formed on the dielectric fill 120. As an example to form metallization pattern 132, a seed layer is formed over the dielectric fill 120. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern 132. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 132.

The dielectric layer 130 may be formed on the dielectric fill 120 and over the optional metallization pattern 132. The bottom surface of the dielectric layer 130 may be in contact with the top surface of the dielectric fill 120, the upper surface of the optional metallization pattern 132, and upper surfaces of the through vias 125. In some embodiments, the dielectric layer 130 is formed of a polymer, which may be a photo-sensitive material such as PBO, polyimide, BCB, or the like, that may be patterned using a lithography mask. In other embodiments, the dielectric layer 130 is formed of a nitride such as silicon nitride; an oxide such as silicon oxide, PSG, BSG, BPSG; or the like. The dielectric layer 130 may be formed by spin coating, lamination, CVD, the like, or a combination thereof.

The dielectric layer 130 is then patterned to form via openings 131 exposing portions of the optional metallization pattern 132 and/or through vias 125. The patterning may be formed by an acceptable process, such as by exposing the dielectric layer 130 to light when the dielectric layer 130 is a photo-sensitive material or by etching using, for example, an anisotropic etch. If the dielectric layer 130 is a photo-sensitive material, the dielectric layer 130 can be developed after the exposure.

Figure 6:
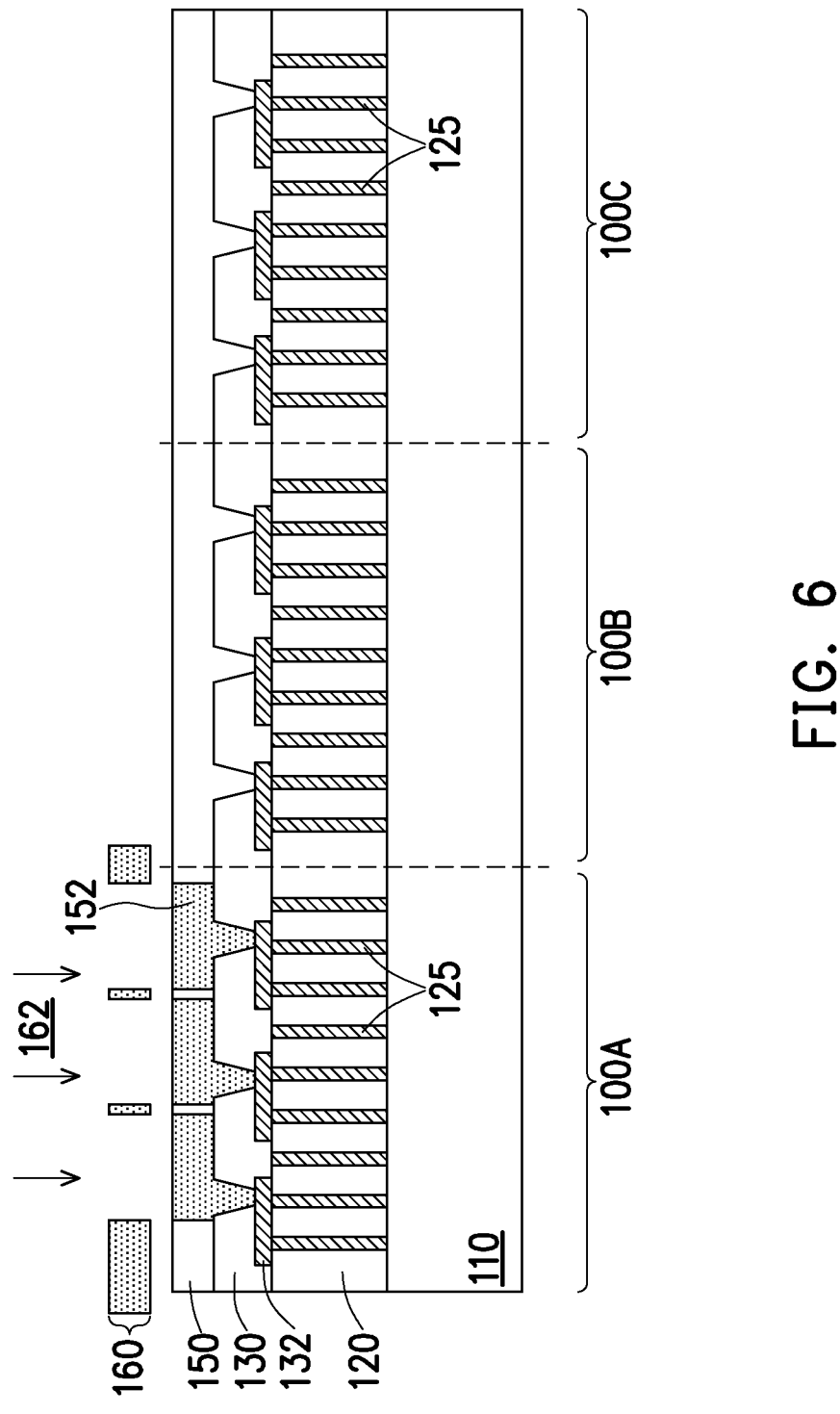

In FIG. 6, after forming the via openings 131, the dielectric layer 130 may be patterned to form openings 156 (FIG. 8) therein in which will be formed a metallization pattern. In an example of forming the openings 156, a photomask 150 is formed over the dielectric layer 130 and in the via openings 131. The photomask 150 is exposed in a light exposure process 162 which passes light through a light mask 160, such as a reticle. In the example illustrated embodiment, the exposed portions of the photomask 150 result in exposed areas 152 which are removed through the developing process of the photomask 150. Other embodiments may use a negative photomask 150 which results in retaining the exposed areas 152 of the photomask.

Figure 7:
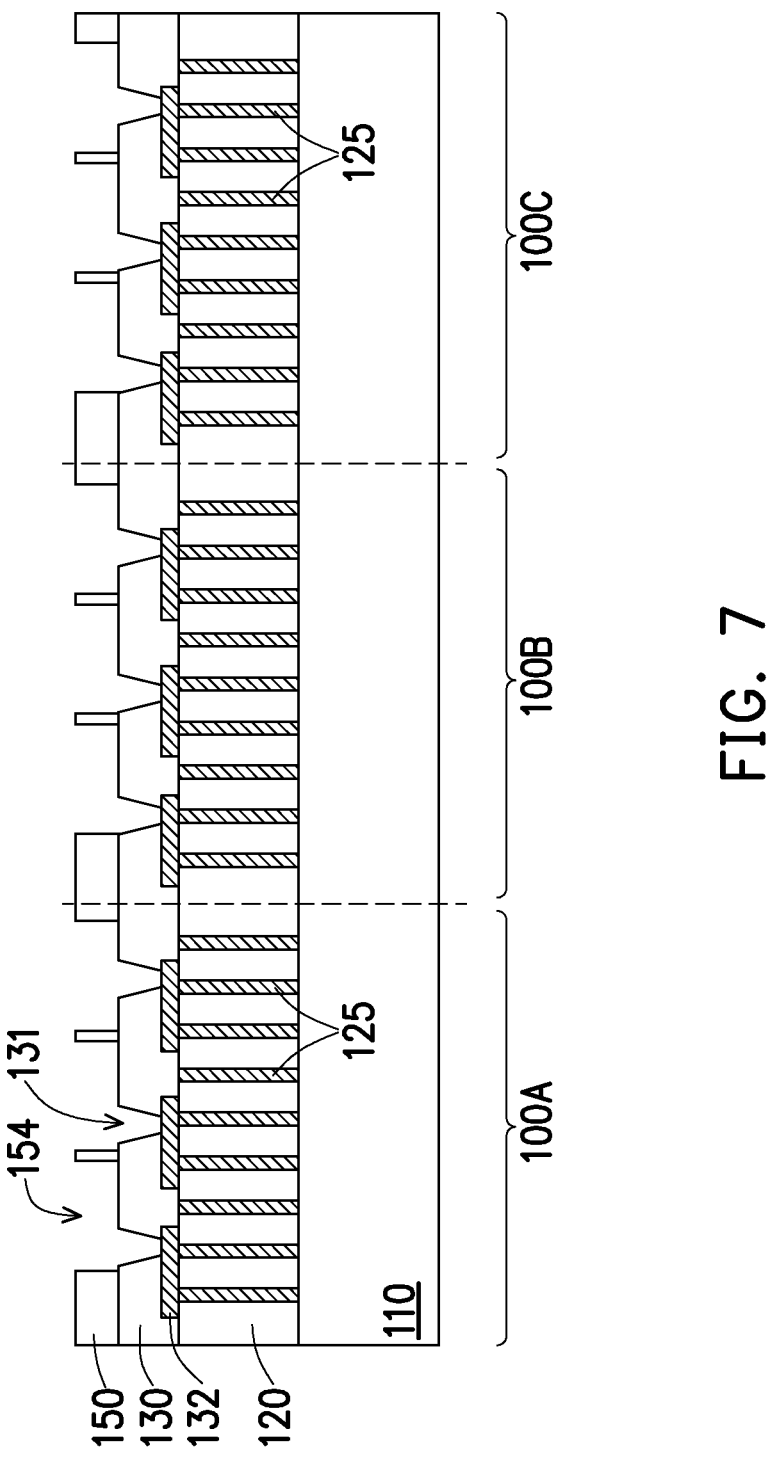

In FIG. 7, after the photomask 150 has been exposed through the light exposure process 162 in each of the interposer regions 100A, 100B, and 100C, the photomask 150 is developed and the exposed areas 152 are removed, leaving openings 154 in the photomask 150. The openings 154 may expose the openings 131 and the underlying optional metallization pattern 132 and/or through vias 125.

Figure 8:
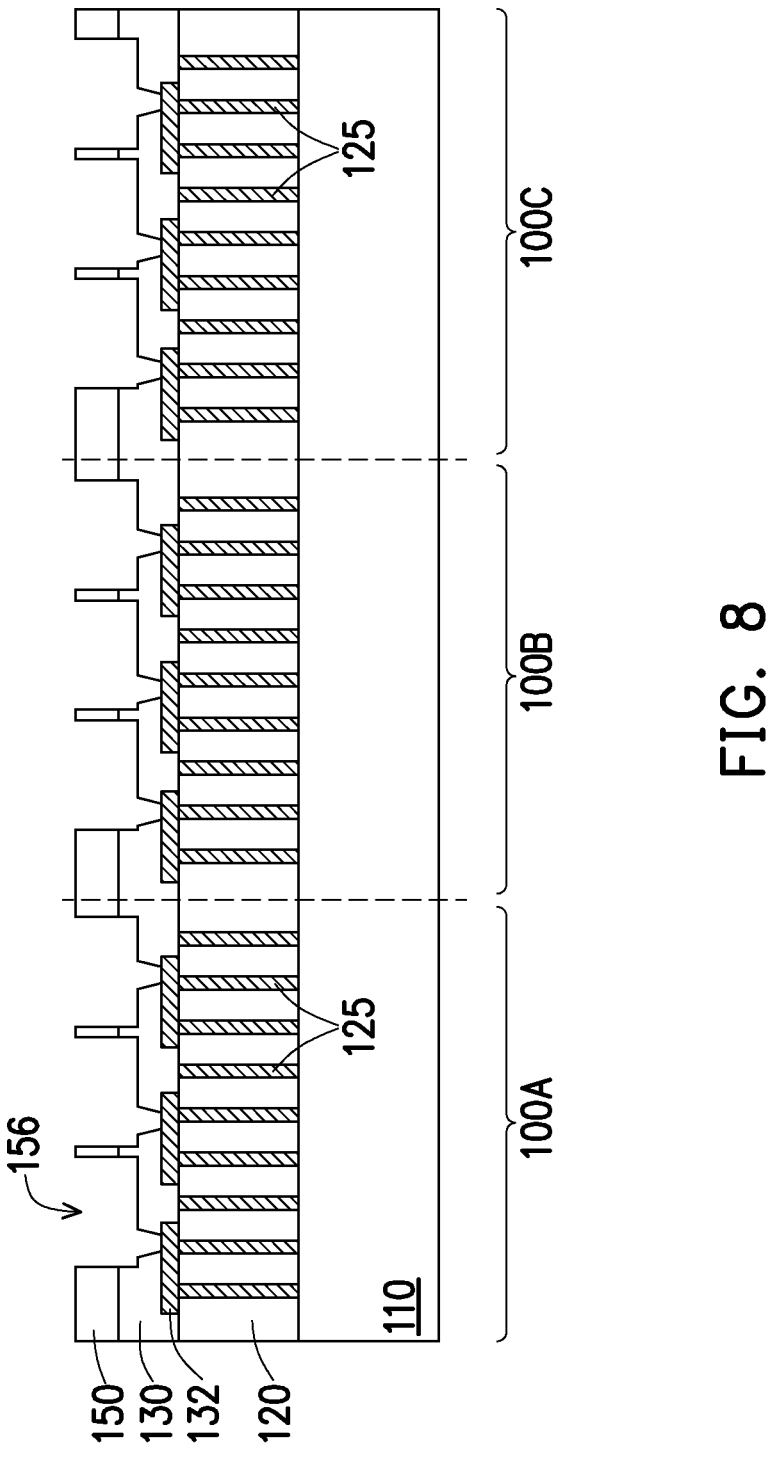

In FIG. 8, the photomask 150 is used as an etch mask and the openings 154 are transferred to the underlying dielectric layer 130 through a suitable etch process to form the openings 156 in the dielectric layer 130.

Figure 9:
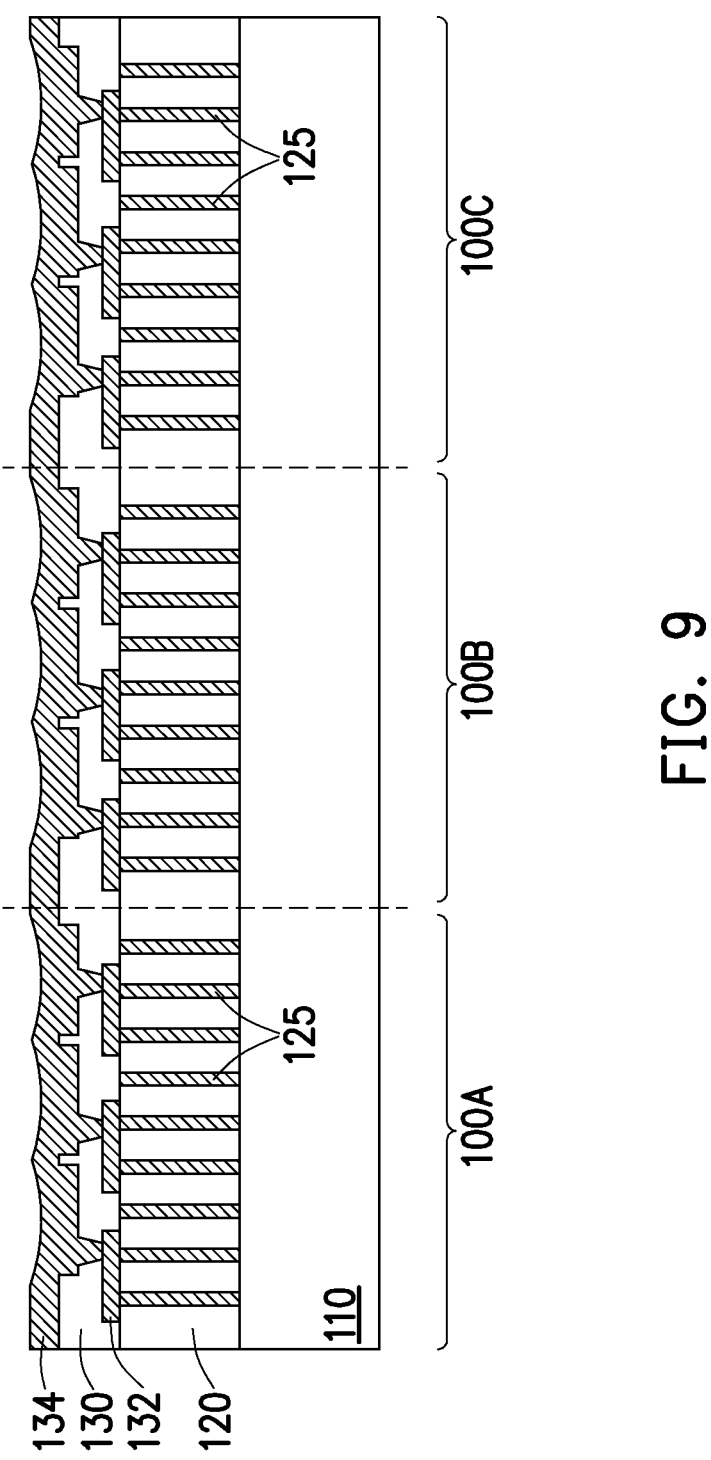
Figure 10:
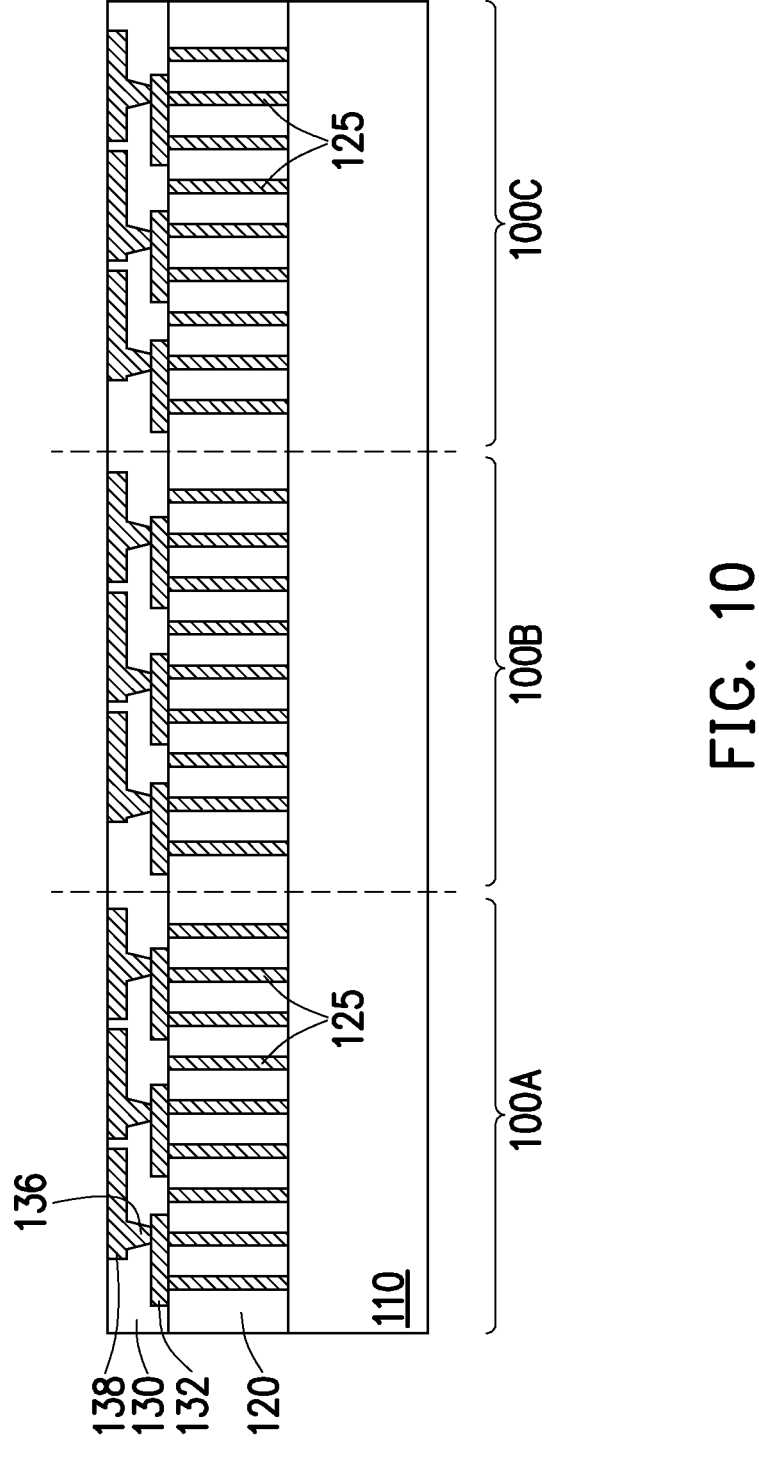

In FIG. 9, the photomask 150 is removed by an acceptable ashing or stripping process, such as by using an oxygen plasma or the like. Next, a conductive material 134 is deposited into the openings 156 to form the metallization pattern 138 (FIG. 10). As an example to form metallization pattern 138, an optional barrier layer may be formed over the dielectric layer 130 and in the openings 156 and in openings 131. The optional barrier layer may include titanium, titanium nitride, tantalum, tantalum nitride, or the like, or combinations thereof, and may be formed using any suitable method, including by PVD, CVD, or the like. The optional barrier layer may line the openings 131 and the openings 156 and may cover upper surfaces of the dielectric layer 130. Next, a seed layer may be formed over the dielectric layer 130 and in the openings 156 and in the openings 131. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. Next, a conductive material 134 is formed in the openings 131 and in the openings 156 and over the dielectric layer 130. The conductive material 134 may be formed by any suitable process, such as by PVD, CVD, plating, such as electroplating or electroless plating, or the like. The conductive material 134 may comprise a metal, like copper, titanium, tungsten, aluminum, or the like.

In FIG. 10, the conductive material 134 is planarized to form the metallization pattern 138. In the planarization process, excess material of the conductive material 134 is removed and the upper surface of the conductive material becomes level with the upper surface of the dielectric layer 130. Where the dielectric layer 130 separates portions of the conductive material 134 the conductive pattern 138 emerges. The planarization process may include any suitable process such as a chemical mechanical polishing (CMP), etch back process, the like, or combinations thereof.

Figure 11:
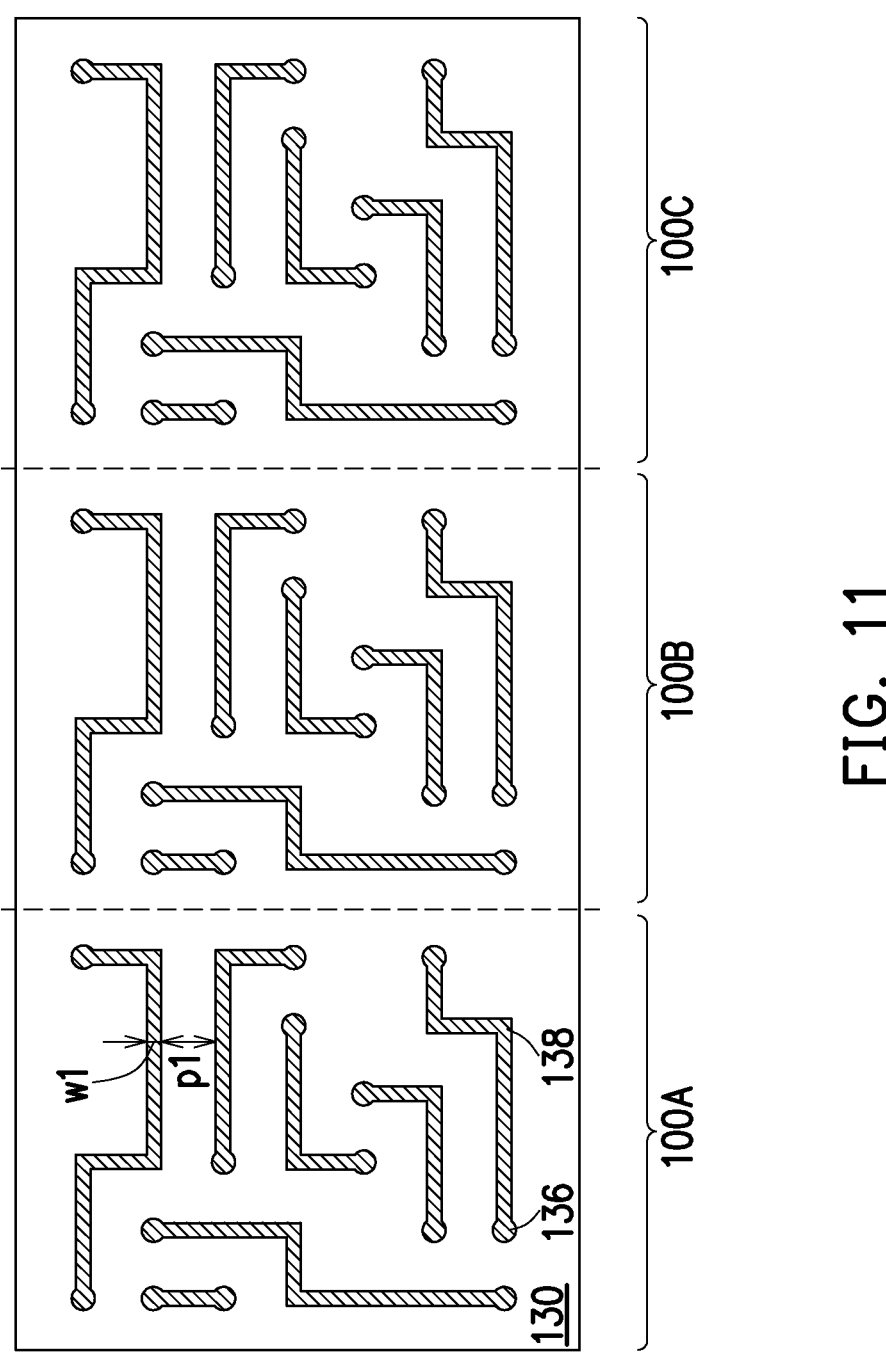

FIG. 11 illustrates a top down view of the structure of FIG. 10, in accordance with some embodiments. FIG. 11 illustrates metallization pattern 138, vias 136, and the dielectric layer 130. It should be understood that FIG. 11 is for illustration purposes only and is not intended to be limiting. The metallization pattern 138 may run predominantly horizontally, vertically, or a mix between the horizontal and vertical (as shown). The vias 136 may be the same size as, smaller than, or larger than the width w1 of the metallization pattern 138. The width w1 of the metallization pattern 138 may be between 0.5 μm and 5 μm. The pitch p1 of the metallization pattern 138 may be between 0.1 μm and 10 μm. In some embodiments, the width w1 may be the same as the pitch p1.

FIGS. 12 through 19 illustrate the forming of a single metallization pattern using a stitching process across multiple package regions, such as across the first interposer region 100A, the second interposer region 100B, and the third interposer region 100C. Thus, the super chiplet interposer 100' may include multiple interposer regions. In such embodiments, these may also be referred to as patterning regions or interposer/patterning regions. Stitching together or merging multiple interposer regions or patterning regions to form the super chiplet interposer 100' provides the ability to form a metallization that has a greater footprint than available for the light mask used to expose the photomask. For example, multiple light mask patterns may be stitched together to form a conductive line as part of a metallization pattern that extends from the first interposer/patterning region 100A to the second interposer/patterning region 100B. The stitching process provides for the formation of a metallization pattern which is larger than the light mask used to make it. The size of the light mask is determined by the exposure tool (e.g., ultraviolet or extreme ultraviolet light source). The stitching process combines multiple exposures into a single continuous pattern, without having to modify the exposure tool to accommodate a larger light mask.

Figure 12:
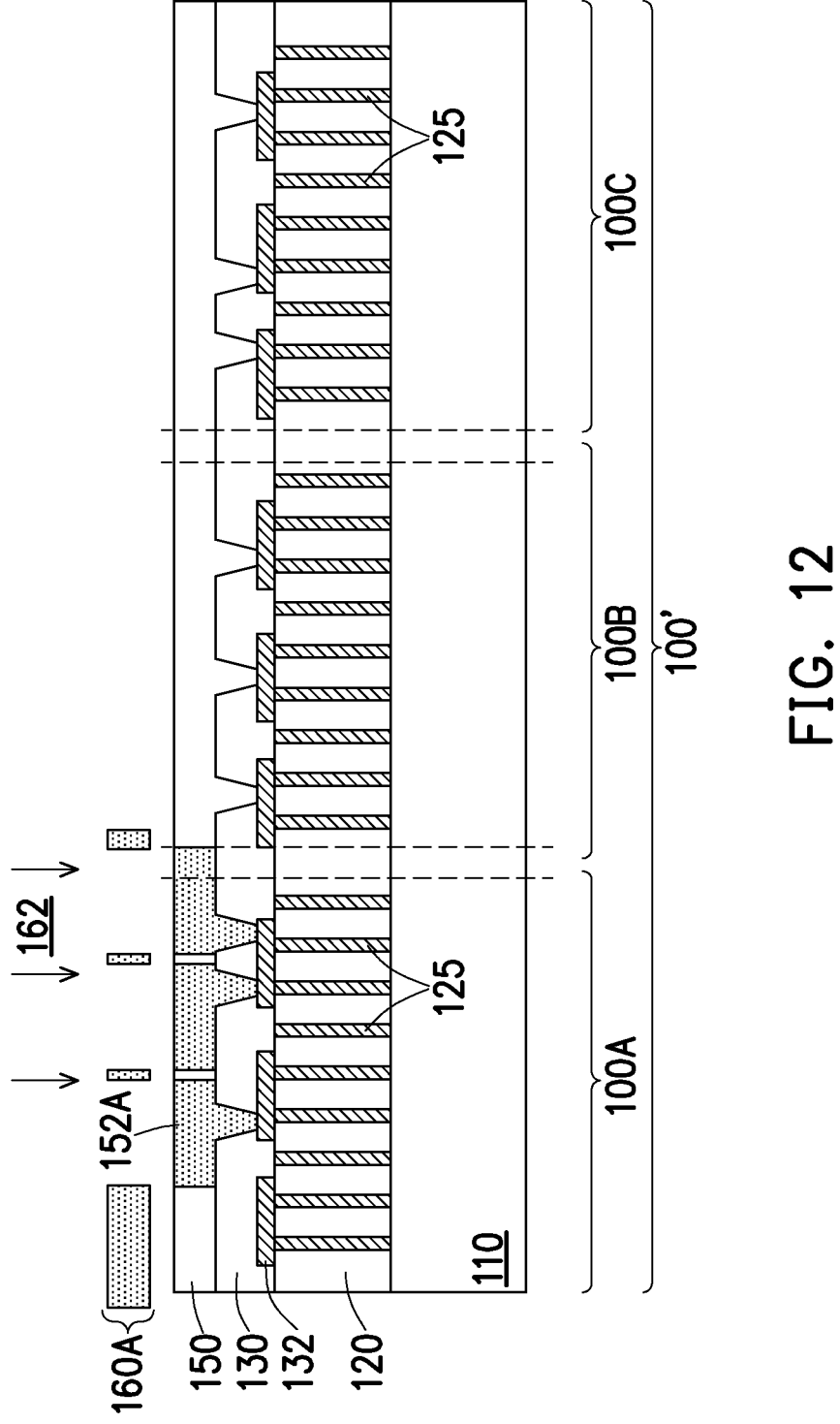

In FIG. 12, after forming the via openings 131 (see FIG. 5), the dielectric layer 130 may be patterned to form openings 156 (FIG. 16) therein which will be used to form a metallization pattern. FIGS. 12 through 15 illustrate an example use of a stitching process. A photomask 150 is formed over the dielectric layer 130 and in the via openings 131. The photomask 150 is exposed in a light exposure process 162 which passes light through a light mask 160A, such as a reticle. In the example illustrated, the exposed portions of the photomask 150 result in exposed areas 152A which are subsequently removed through the developing process of the photomask 150. Other embodiments may use a negative photomask 150 which results in retaining the exposed areas 152A of the photomask 150. Notably, the photomask 150 is only exposed in the first interposer region 100A.

Figure 13:
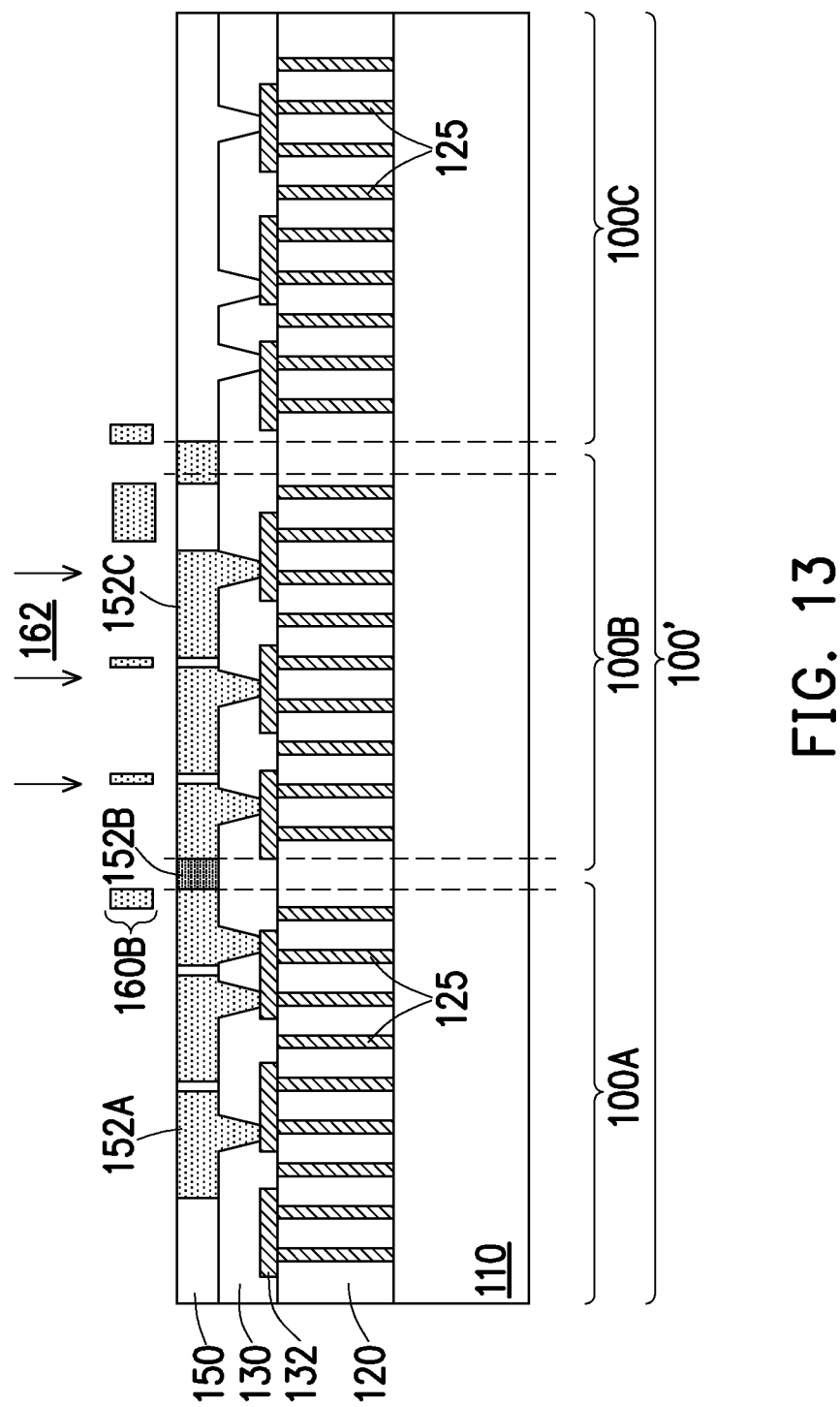

In FIG. 13, the photomask 150 is exposed in another light exposure process 162 which passes light through a light mask 160B. The light mask 160B may be the same light mask as light mask 160A or may be a different light mask. In the example illustrated, the exposed portions of the photomask 150 result in double exposed areas 152B and exposed areas 152C which are subsequently removed through the developing process of the photomask 150. Other embodiments may use a negative photomask 150 which results in retaining the double exposed areas 152B and exposed areas 152C of the photomask 150. The double exposed area 152B has been exposed in the light exposure process 162 twice. It was exposed the first time through the light mask 160A and a second time through the light mask 160B. The overlapping area between the two exposures is the double exposed area 152B.

Figure 14:
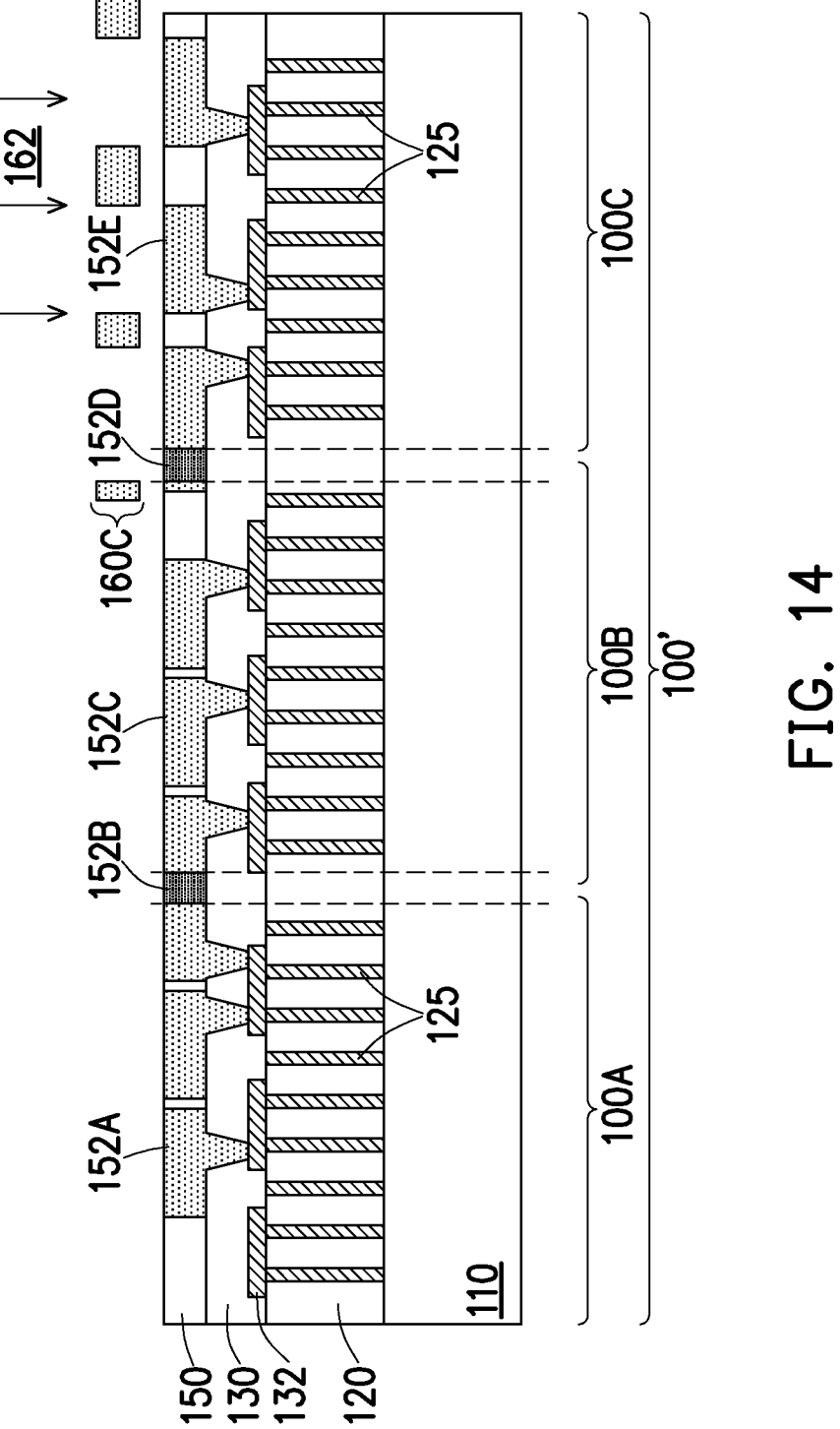

In FIG. 14, the photomask 150 is exposed in another light exposure process 162 which passes light through a light mask 160C. The light mask 160C may be the same light mask as light mask 160A and/or light mask 160B or may be a different light mask. In the example illustrated, the exposed portions of the photomask 150 result in double exposed areas 152D and exposed areas 152E which are subsequently removed through the developing process of the photomask 150. Other embodiments may use a negative photomask 150 which results in retaining the double exposed areas 152D and exposed areas 152E of the photomask 150. The double exposed area 152D has been exposed in the light exposure process 162 twice. It was exposed the first time through the light mask 160B and a second time through the light mask 160C. The overlapping area between the two exposures is the double exposed area 152D.

Figure 15:
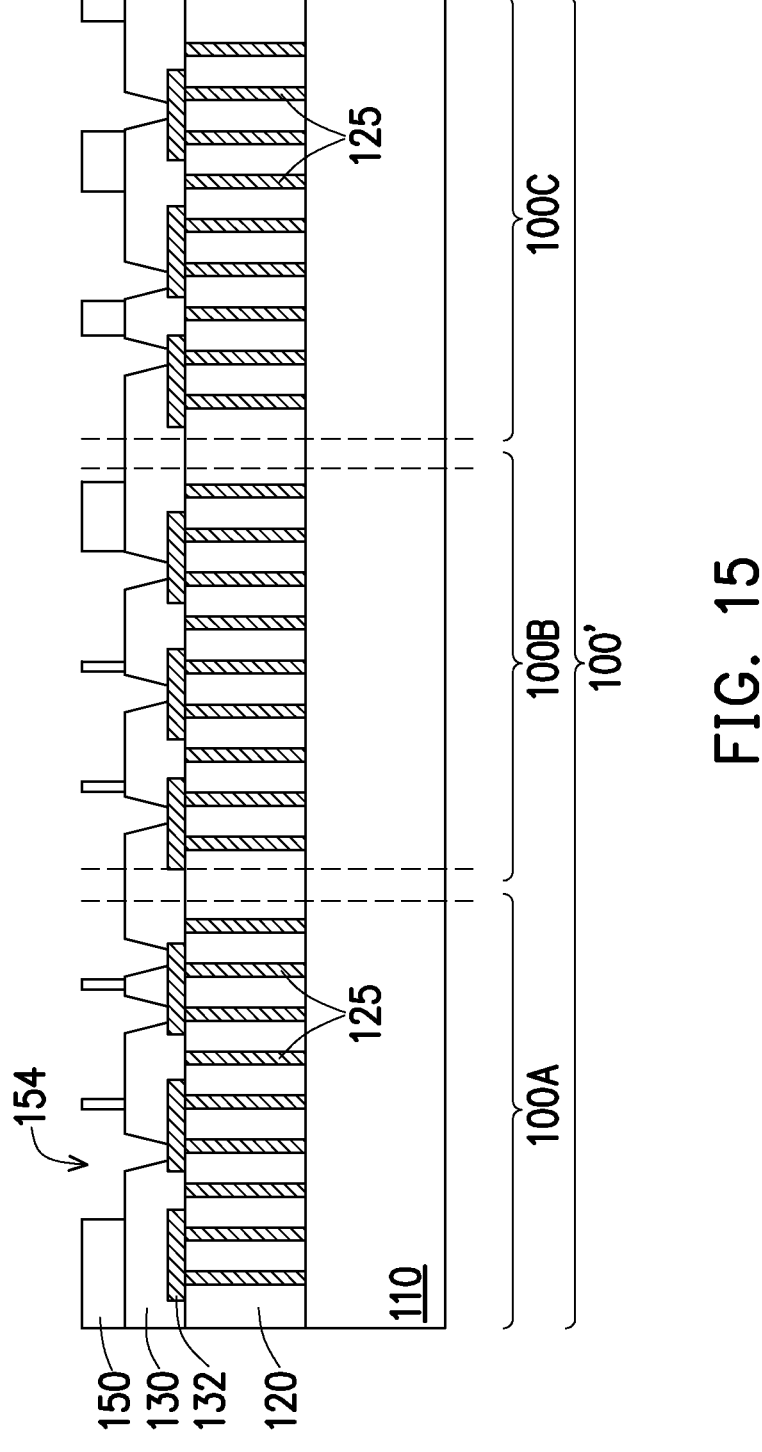

In FIG. 15, after the photomask 150 has been exposed through the light exposure process 162 in each of the interposer regions 100A, 100B, and 100C, the photomask 150 is developed and the exposed areas 152A, 152C, and 152E and the double exposed areas 152B and 152D are removed, leaving openings 154 in the photomask 150. The openings 154 may expose the openings 131 and the underlying optional metallization pattern 132 and/or through vias 125.

Figure 16:
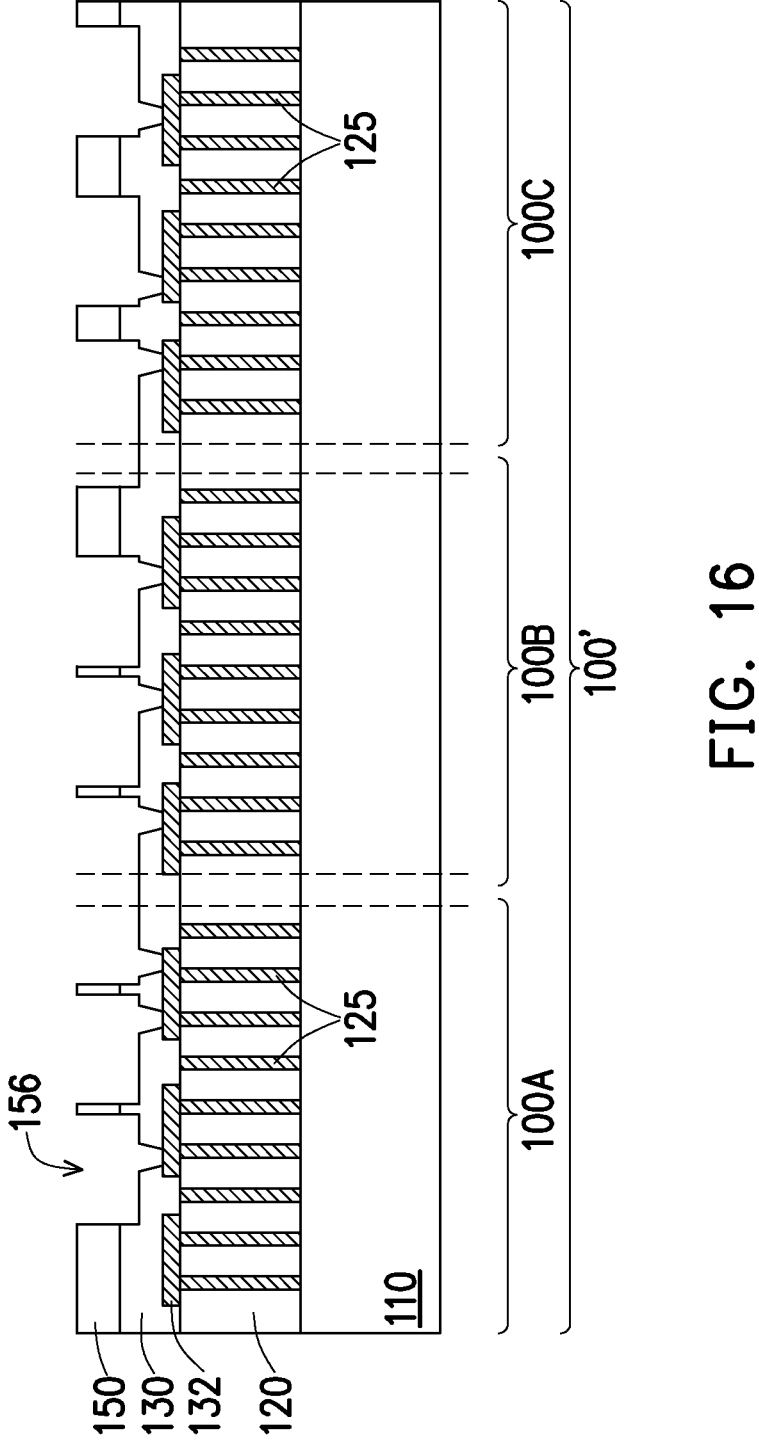

In FIG. 16, the photomask 150 is used as an etch mask and the openings 154 are transferred to the underlying dielectric layer 130 through a suitable etch process to form the openings 156 in the dielectric layer 130.

Figure 17:
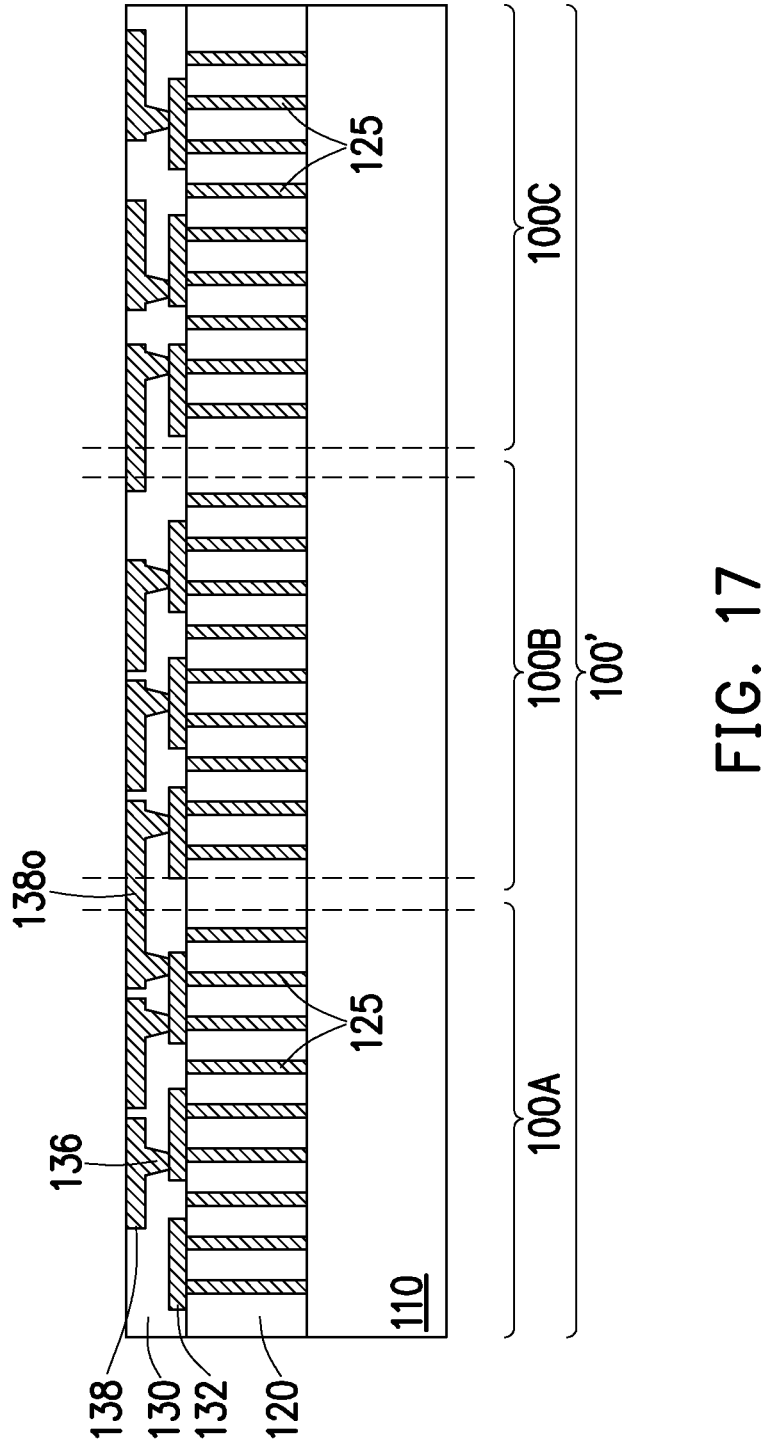

In FIG. 17, the photomask 150 is removed by an acceptable ashing or stripping process, such as by using an oxygen plasma or the like. Next, a conductive material is deposited into the openings 156 to form the metallization pattern 138 and overlapping areas 138o. These may be formed using processes and materials similar to those discussed above with respect to FIGS. 9 and 10. Notably, the overlapping areas 138o of the metallization pattern 138 may bridge between package regions, for example, between the interposer region 100A and the interposer region 100B to form super chiplet interposer 100'.

Figure 18:
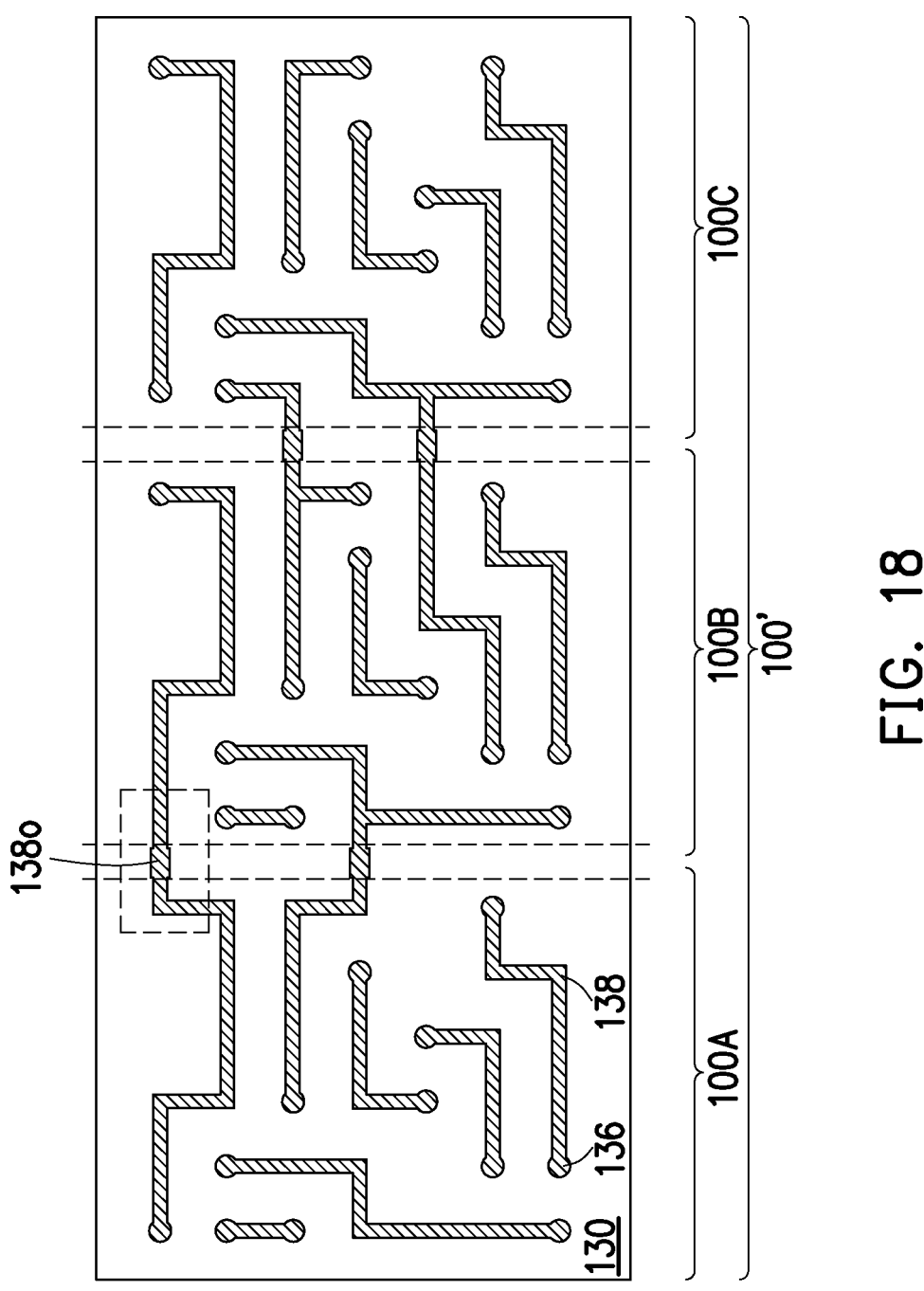

FIG. 18 illustrates a top down view of the structure of FIG. 17, in accordance with some embodiments. FIG. 18 illustrates metallization pattern 138, vias 136, and the dielectric layer 130. FIG. 18 also illustrates the overlapping areas 138o. It should be understood that FIG. 18 is for illustration purposes only and is not intended to be limiting. The metallization pattern 138 may run predominantly horizontally, vertically, or a mix between the horizontal and vertical (as shown). The vias 136 may be the same size as, smaller than, or larger than the width w1 of the lines of the metallization pattern 138. The width w1 of the metallization pattern 138 may be between 0.5 μm and 5 μm. The pitch p1 of the metallization pattern 138 may be between 0.5 μm and 5 μm. In some embodiments, the width w1 may be the same as the pitch p1. The width w2 of the line in the overlapping areas 138o may be the same size as the width w1 or slightly larger than the width w1. The width w2 may be larger than the width w1

FIGS. 19A through 19D illustrate top down views of different embodiments for the overlapping areas 138o of FIGS. 17 and 18 when a stitching process is used. Each of the embodiments of FIGS. 19A through 19D may be present in a single metallization pattern 138. In FIG. 19A a line width d1 of the metallization pattern 138a coming from a first patterning process may have the same line width d2 of the metallization pattern 138b coming from a second patterning process. The overlapping areas 138o may have a line width d3 which is about 5% to 50% wider than the line width d2 and/or line width d3. This increase in line width d3 may result from double exposing the overlapping area of the photomask (e.g., photomask 150 of FIG. 12) which is used to pattern the underlying dielectric layer 130. The double exposure can affect a greater width of the photomask than would normally be exposed by the light mask. For example, light bleed in the exposed area can affect the surrounding areas. In other embodiments, the overlapping areas 138o may have a line width d3 which is about 10% to 30% less than the line width d2 and/or line width d3. This decrease in line width d3 may result from double exposing a negative photomask in the overlapping area. In the negative photomask, the areas of the photomask which are retained are exposed while the areas which are removed are protected. The double exposure can affect a greater portion of the photomask than would normally be exposed by the light mask. For example, light bleed in the exposed area can affect the surrounding areas, including into the overlapping area.

In FIG. 19B, a line width d1 of the metallization pattern 138a coming from a first patterning process may have the same line width d2 of the metallization pattern 138b coming from a second patterning process. The overlapping areas 138o may have a line width d3 which is about the same width the line width d1 and/or line width d2. Whereas the double exposure of the photomask resulted in a widening in FIG. 19A resulted in a widening, in FIG. 19B, the double exposure may not result in a widening. For example, the exposure intensity of the overlapping area can be controlled to prevent widening or the light masks used can be adjusted to have narrower exposure in the overlapping areas to compensate for the double exposure.

In FIG. 19C, a line width d1 of the metallization pattern 138a coming from a first patterning process may have the same line width d2 of the metallization pattern 138b coming from a second patterning process. The overlapping areas 138o may have a line width d3 which is up to about 100% wider than the line width d2 and/or line width d3. An offset represented by the distance d4 demonstrates a slight pattern misalignment by up to about 50% of the line width d1 and/or the line width d2 (whichever is smaller). A corresponding offset represented by the distance d5 is equal to the distance d4 when the line width d1 equals the line width d2.

In FIG. 19D, a line width d1 of the metallization pattern 138a coming from a first patterning process may be smaller than the line width d2 of the metallization pattern 138b coming from a second patterning process. The overlapping areas 138o may have a line width d3 which is about the same as the wider one of the line width d1 and line width d2. An offset d4 is created between the metallization pattern 138a and the metallization pattern 138b. The embodiments of FIGS. 19C and 19D may also be combined. In such an embodiment, the corresponding width d5 in FIG. 19C is not equal to the width d4.

In FIG. 20, the process of forming the dielectric layer 130, vias 136, and metallization patterns 138 may be repeated as many times as desired to include additional layers of the redistribution structure 128. For example, as illustrated, the dielectric layer 140 may be deposited using materials and processes similar to those used for depositing the dielectric layer 130. The dielectric layer 140 may then be patterned using processes and materials similar to those described for the dielectric layer 130, for example with respect to FIGS. 5 through 8 or FIGS. 12 through 16. Then the vias 146 and metallization pattern 148 may be deposited using processes and materials similar to those discussed above with respect to the vias 136 and metallization pattern 138.

It should be understood that the redistribution structure 128 may be formed using other suitable processes. For example, the process described above conforms to a dual damascene process where both a trench and a via opening are formed in the dielectric layer 130, with the via opening underlying and connected to the trench. The conductive material is then filled into the trench and the via opening to form a metal line (e.g., metallization pattern 138) and a via (e.g., via 136), respectively. A single damascene process may also be used, in which a trench is first formed in a dielectric layer (e.g., dielectric layer 130), followed by filling the trench with a conductive material. A planarization process such as a CMP process is then performed to remove the excess portions of the conductive material higher than the top surface of the dielectric layer, leaving a metal line in the trench. Then a via is separately formed in a similar manner as the formation of the metal lines. Still other suitable processes may be used to form the redistribution structure 128. All such processes may utilize a stitching process, such as described above with respect to FIGS. 12 through 16 to pattern an area larger than the light mask used for photo patterning.

Referring still to FIG. 20, an insulating layer 170 may be deposited over the redistribution structure 128 and conductive connectors 172 formed through the insulating layer 170 to contact the top metal features of the redistribution structure 128. The insulating layer 170 may be any suitable insulating material such as PBO, polyimide, BCB, or the like, that may be patterned using a lithography mask. In other embodiments, the insulating layer 170 is formed of a nitride such as silicon nitride; an oxide such as silicon oxide, PSG, BSG, BPSG; or the like. The insulating layer 170 may be formed by spin coating, lamination, CVD, the like, or a combination thereof. The insulating layer 170 is then patterned to form openings exposing portions of the uppermost metallization pattern of the redistribution structure 128 (e.g., the metallization pattern 148). The patterning may be formed by an acceptable process, such as by exposing the insulating layer 170 to light when the insulating layer 170 is a photo-sensitive material or by etching using, for example, an anisotropic etch. If the insulating layer 170 is a photo-sensitive material, the insulating layer 170 can be developed after the exposure.

The conductive connectors 172 are formed in the openings of the insulating layer 170. In some embodiments, the conductive connectors 172 may include optional under bump metallurgies (UBMs) extending through the insulating layer 170 to physically and electrically couple the metallization pattern 148. The UBMs may be formed of the same material as the metallization pattern 148. The conductive connectors 172 may include ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 172 may include a conductive material such as solder, copper, aluminum, gold, nickel, silver, palladium, tin, the like, or a combination thereof. The conductive connectors 172 may be formed by sputtering, printing, electro plating, electroless plating, CVD, or the like. The conductive connectors 172 may be solder free and have substantially vertical sidewalls. In some embodiments, the conductive connectors 172 include a metal pillar and a metal cap layer formed on the top of the metal pillar. The metal cap layer may include nickel, tin, tin-lead, gold, silver, palladium, indium, nickel-palladium-gold, nickel-gold, the like, or a combination thereof and may be formed by a plating process.

Figure 21:
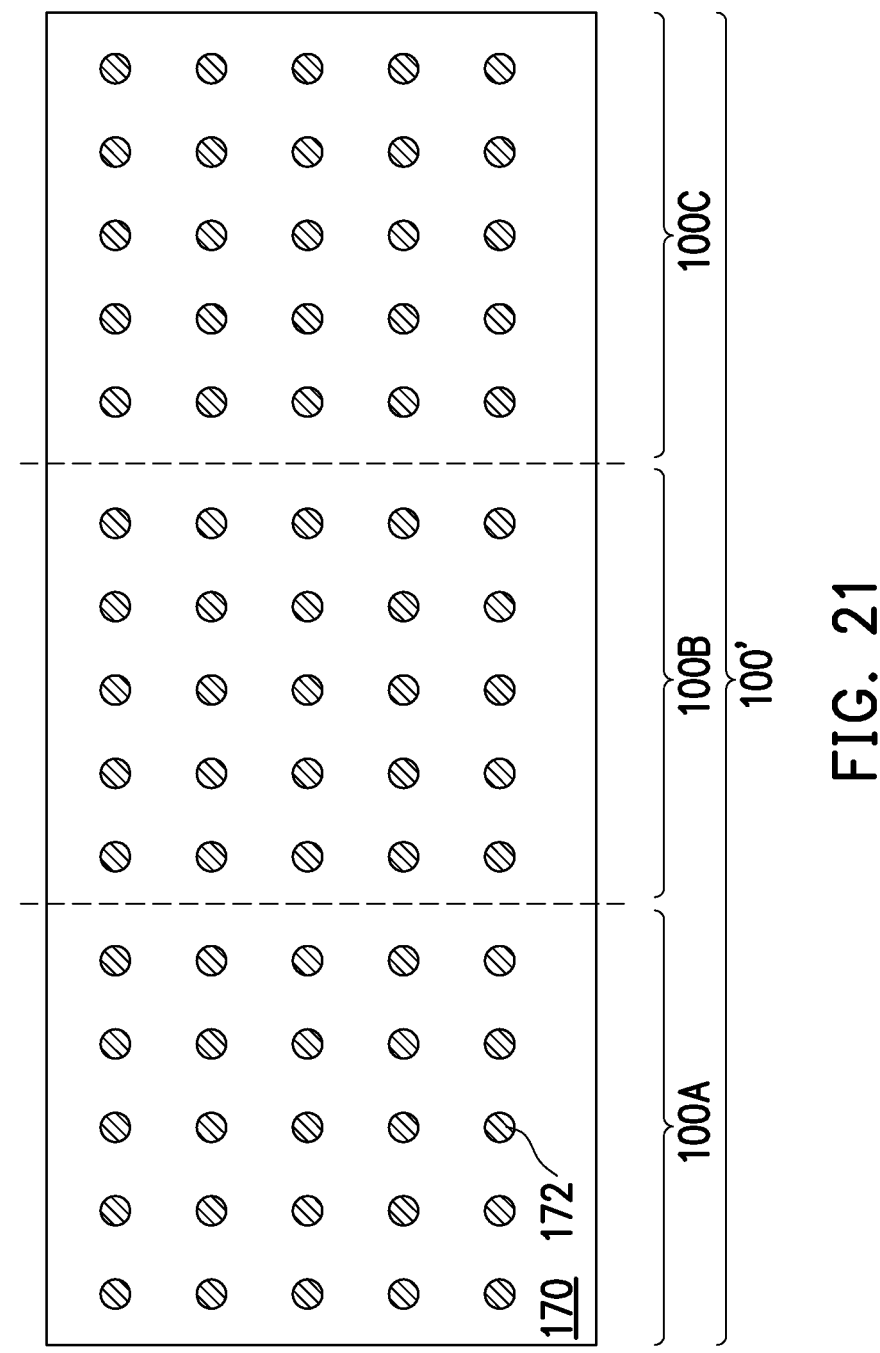

FIG. 21 illustrates a top down view of the structure of FIG. 20. The conductive connectors 172 are illustrated as being disposed in a regular pattern, however, it should be understood that the conductive connectors 172 may be disposed randomly or in varying patterns. The resulting structure illustrated in FIGS. 20 and 21 may include individual interposer regions 100A, 100B, 100C, and so forth, (such as illustrated with respect to FIG. 10) and/or may include a super chiplet interposer 100' made of two or more patterning regions (such as illustrated with respect to FIG. 17).

Figure 22:
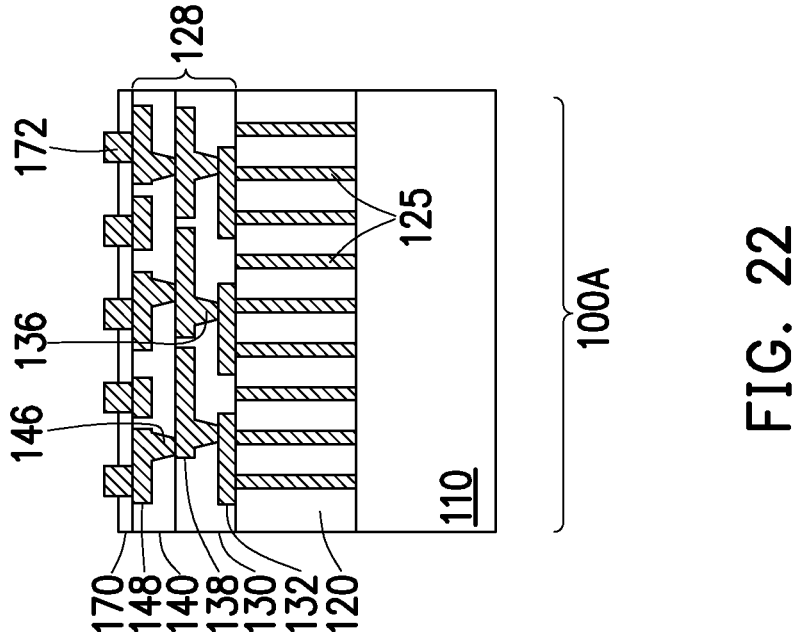

In FIG. 22, the structure of FIG. 20 may be singulated into chiplets, such as the chiplet interposers 100, which may correspond to interposer regions 100A, 100B, or 100C (and so forth), or super chiplet interposers 100' (corresponding to one or more stitched interposer/pattern regions 100A, 100B, and/or 100C (and so forth)). In some embodiments, forming the chiplet interposers 100 may include using a singulation process including sawing along scribe line regions, e.g., between the first interposer region 100A and the second interposer region 100B. The sawing singulates the first interposer region 100A from the second interposer region 100B. In other embodiments, the sawing may be between the super chiplet interposer 100' and an adjacent super package 100' which results from the stitching process described above. The resulting chiplet interposer 100 is provided as an example and may be from the first interposer region 100A or may include each of the first interposer/pattern region 100A, the second interposer/pattern region 100B, and the third interposer/pattern region 100C, in the super chiplet interposer 100' discussed above. One should understand, however, that the illustrated super chiplet interposer 100' is only an example and that any number of interposer/pattern regions may be combined in the stitching process described above into the super chiplet interposer 100', adjacent to each other horizontally and/or vertically.

Figure 23:
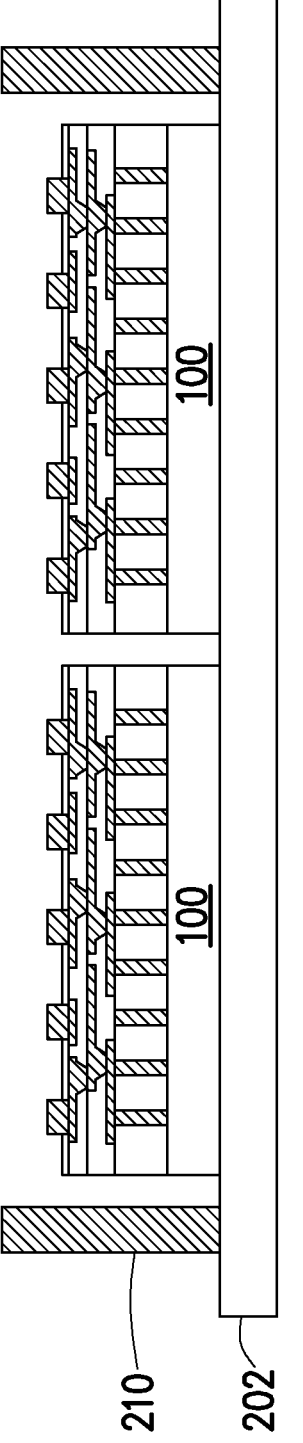
FIGS. 23 through 34 illustrate cross-sectional views of intermediate steps during a process for forming a package device utilizing a chiplet interposer, in accordance with some embodiments.

In FIG. 23, chiplet interposers 100 are mounted to a carrier substrate 202. The chiplet interposers 100 each correspond to the chiplet interposers 100 of FIG. 22. Although two chiplet interposers 100 are illustrated, fewer or more additional chiplet interposers 100 may be placed. Also, the chiplet interposers 100 may be identical or may be different. For example, one of the illustrated chiplet interposers 100 may correspond to package region 100B, while another of the illustrated chiplet interposers 100 may correspond to a super chiplet interposer 100', and so forth. A pick and place process may be used to pick up and position the chiplet interposers 100 on the carrier substrate 202. A release layer may be formed on the carrier substrate 202 which is used as both an adhesive but which can be easily removed in a subsequent step to remove the carrier substrate 202. The carrier substrate 202 may be a glass carrier substrate, a ceramic carrier substrate, or the like. The carrier substrate 202 may be a wafer, such that multiple packages can be formed on the carrier substrate 202 simultaneously.

The release layer may be formed of a polymer-based material, which may be removed along with the carrier substrate 202 from the overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate, or may be the like. The top surface of the release layer may be leveled and may have a high degree of planarity.

Also shown in FIG. 23 are optional through vias 210. The through vias 210 may be formed before or after placing the chiplet interposers 100. The through vias 210 are formed on the carrier substrate 202 and extend away from the carrier substrate 202 in a vertical direction perpendicular to the major surface of the carrier substrate 202. As an example to form the through vias 210, a seed layer (not shown) may be formed over the carrier substrate 202. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist may then be formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 210.

Figure 24:
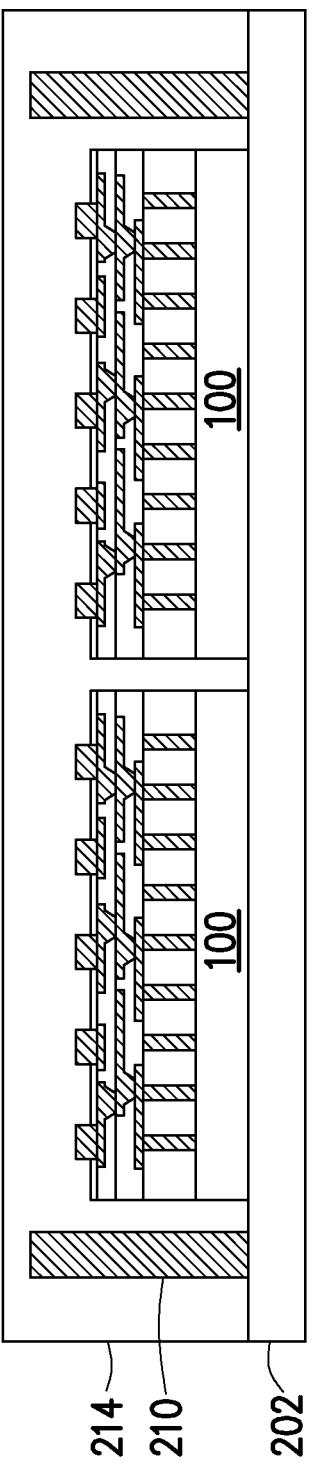

In FIG. 24, an encapsulant 214 may be deposited over and between the chiplet interposers 100 and through vias 210. After formation, the encapsulant 214 encapsulates the through vias 210 and chiplet interposers 100. The encapsulant 214 may be a molding compound, epoxy, or the like. The encapsulant 214 may be applied by compression molding, transfer molding, or the like, and may be formed over the carrier substrate 202 such that the through vias 210 and/or the chiplet interposers 100 are buried or covered. The encapsulant 214 is further formed in gap regions between the chiplet interposers 100 and between the chiplet interposers 100 and the through vias 210. The encapsulant 214 may be applied in liquid or semi-liquid form and then subsequently cured.

Figure 25:
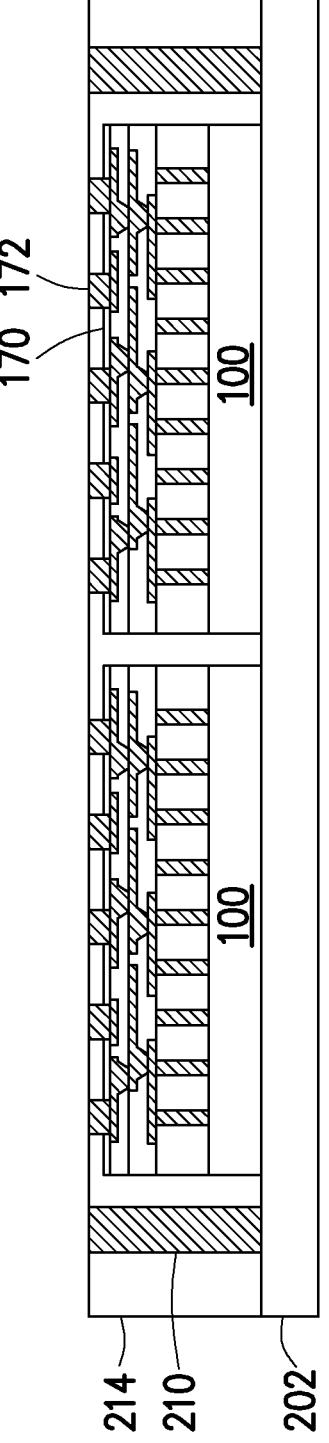

In FIG. 25, a planarization process is performed on the encapsulant 214 to expose the through vias 210 and the conductive connectors 172. The planarization process may also remove material of the through vias 210 and conductive connectors 172 until the conductive connectors 172 and through vias 210 are exposed. Top surfaces of the through vias 210, conductive connectors 172, and encapsulant 214 are substantially coplanar after the planarization process within process variations. The encapsulant 214 may continue to surround the conductive connectors 172 in some embodiments, while in other embodiments, the conductive connectors 172 may be leveled to have an upper surface level with the upper surface of the insulating layer 170, some of which may also be removed by the planarization process. The planarization process may be, for example, a chemical-mechanical polish (CMP), a grinding process, or the like. In some embodiments, the planarization may be omitted, for example, if the through vias 210 and/or conductive connectors 172 are already exposed.

Figure 26:
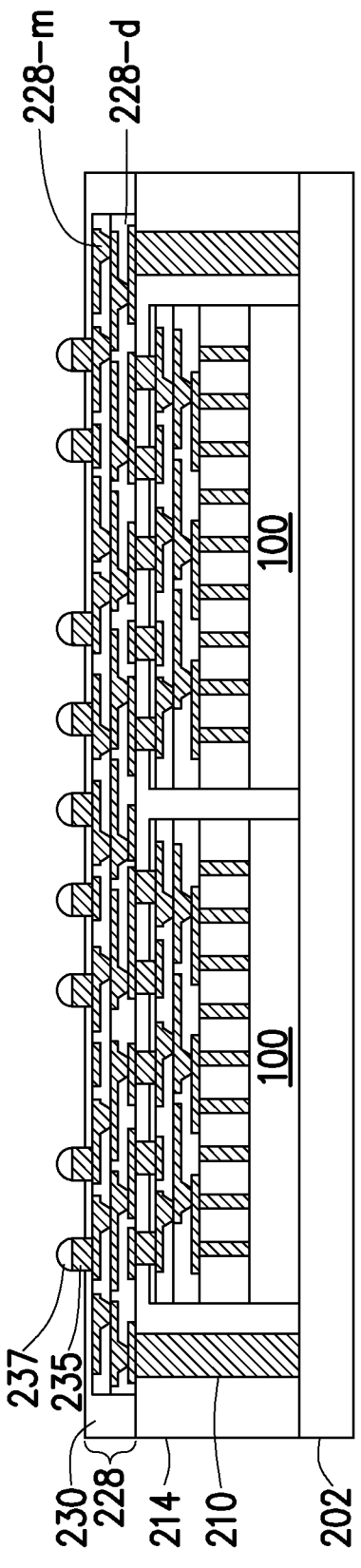

In FIG. 26, a front-side redistribution structure 228 is formed over the encapsulant 214, through vias 210, and chiplet interposers 100. The front-side redistribution structure 228 includes dielectric layers 228-d and metallization patterns 228-m. The front-side redistribution structure 228 may be formed using similar processes and materials as the redistribution structure 128 described above, including using an optional stitching process to perform multiple patterning steps which are stitched together, as described above.

An encapsulant 230 may be deposited over the redistribution structure 228. In some embodiments, such as illustrated in FIG. 26, the redistribution structure 228 may have a lateral extent which is smaller than the lateral extent of the carrier substrate 202. In such embodiments, the encapsulant may be on sidewalls of the redistribution structure 228. In other embodiments, the redistribution structure 228 may extend to the lateral extents of the carrier substrate 202. The encapsulant 230 may be formed using processes and materials similar to those described above with respect to the encapsulant 214. The material composition of the encapsulant 230 may be the same as or different from the material composition of the encapsulant 214. In some embodiments, the encapsulant 230 may be made of a dielectric material, such as silicon oxide, silicon nitride, silicon oxynitride, silicon oxycarbide, the like, or combinations thereof, and may be deposited by spin coating or the like. In some embodiments, the encapsulant 230 may be formed first, then an opening may be made in the encapsulant 230, the redistribution structure 228 formed in the opening, and an additional layer of the encapsulant 230 formed over the redistribution structure 228.

Openings may then be formed in the encapsulant 230 to expose the top metallization pattern 228-m of the redistribution structure 228. Conductive connectors 235 may be formed in the openings on the top metallization pattern 228-*m*. The conductive connectors 235 may be formed using processes and materials similar to those described above with respect to the conductive connectors 172, including optional under bump metallurgies (UBMs). A solder bump 237 may also be formed on the conductive connectors 235 in embodiments where the conductive connectors 235 do not include a solder bump. The solder bump 237 may be formed by any suitable process, such as by solder printing or plating, followed by a reflow process.

Figure 27:
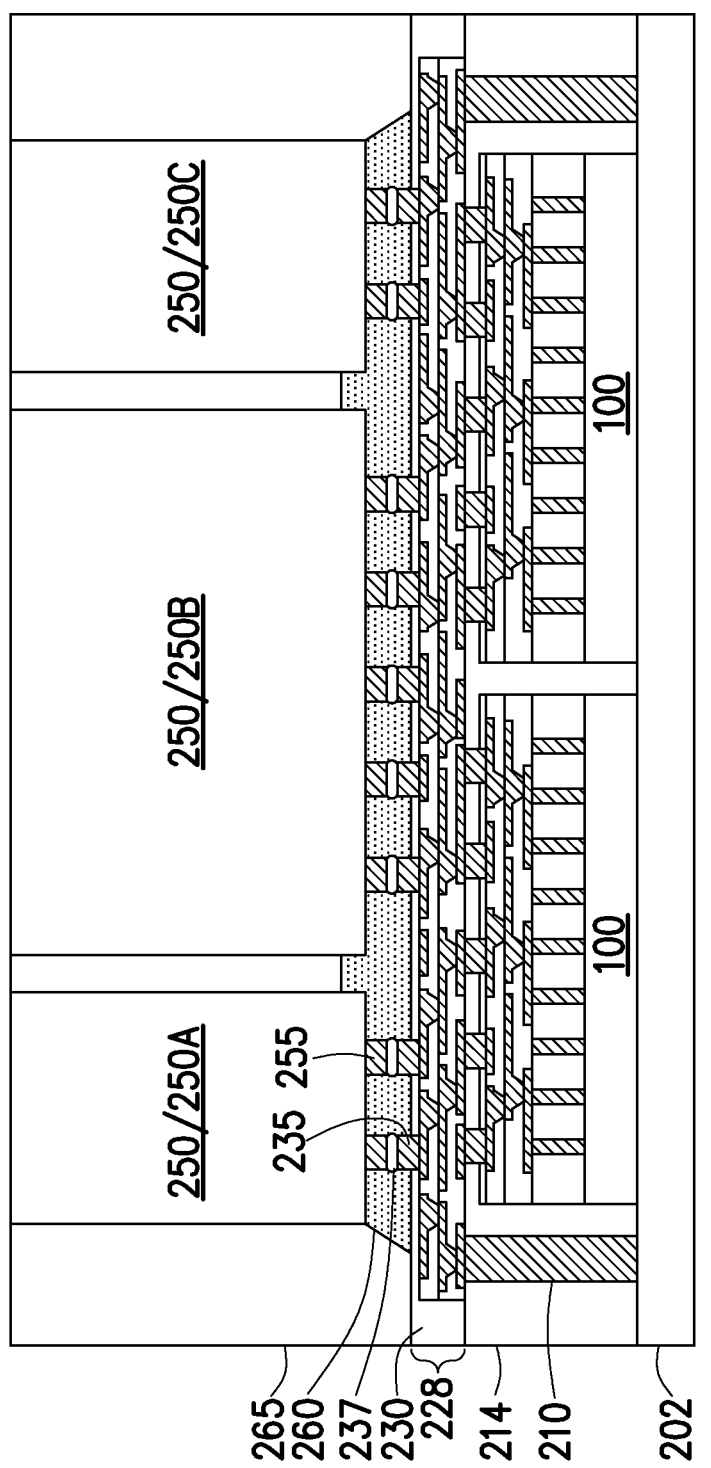

In FIG. 27 devices 250 may be mounted to the conductive connectors 172 by the solder bump 237. Devices 250 may include devices 250A, devices 250B, and devices 250C. Devices 250 may include integrated circuit dies, system on integrated circuit (SOIC) devices, chiplet devices, and so forth. For instance, devices 250 may include a logic device (e.g., central processing unit (CPU), graphics processing unit (GPU), system-on-a-chip (SoC), application processor (AP), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or combinations thereof.

Each of the devices 250 (e.g., devices 250A, 250B, and 250C) may be of the same type or different types, for example of those types of devices listed above. The devices 250 may include front-side connectors 255. A pick and place process may be used to pick up and position the devices 250 to align the front-side connectors 255 to the conductive connectors 235, and a bonding process may occur, for example, by reflowing the solder bumps 237 to physically and electrically couple the devices 250 to the conductive connectors 235.

After the devices 250 are mounted to the conductive connectors 235, an optional underfill 260 may be deposited under the devices 250, between the devices 250 and the redistribution structure 228, and around the joints between the conductive connectors 235 and the front-side connectors 255. In some embodiments, the underfill 260 may extend upward between the mounted devices 250, even to the upper surface of the mounted devices 250. The underfill 260 may reduce stress and protect the joints resulting from the reflowing of the solder bumps 237. The underfill may be formed by a capillary flow process after the devices 250 are attached, or may be formed by a suitable deposition method before the devices 250 are attached.

After the optional underfill is deposited, an encapsulant 265 may be deposited over the redistribution structure 228 and between the devices 250. The encapsulant 265 may be deposited using processes and materials similar to those used to deposit the encapsulant 214, discussed above with respect to FIG. 24. In particular, the encapsulant 265 may be deposited to a thickness so as to completely cover the devices 250, following which, a planarization process, such as a CMP process, may be used to level the upper surfaces of the encapsulant 265 with the upper surfaces of the devices 250. In some embodiments, the devices 250 may be thinned by the planarization process. In some embodiments, the underfill 260 may be omitted and the encapsulant 265 may function both as the underfill 260 and the encapsulant 265.

Figure 28:
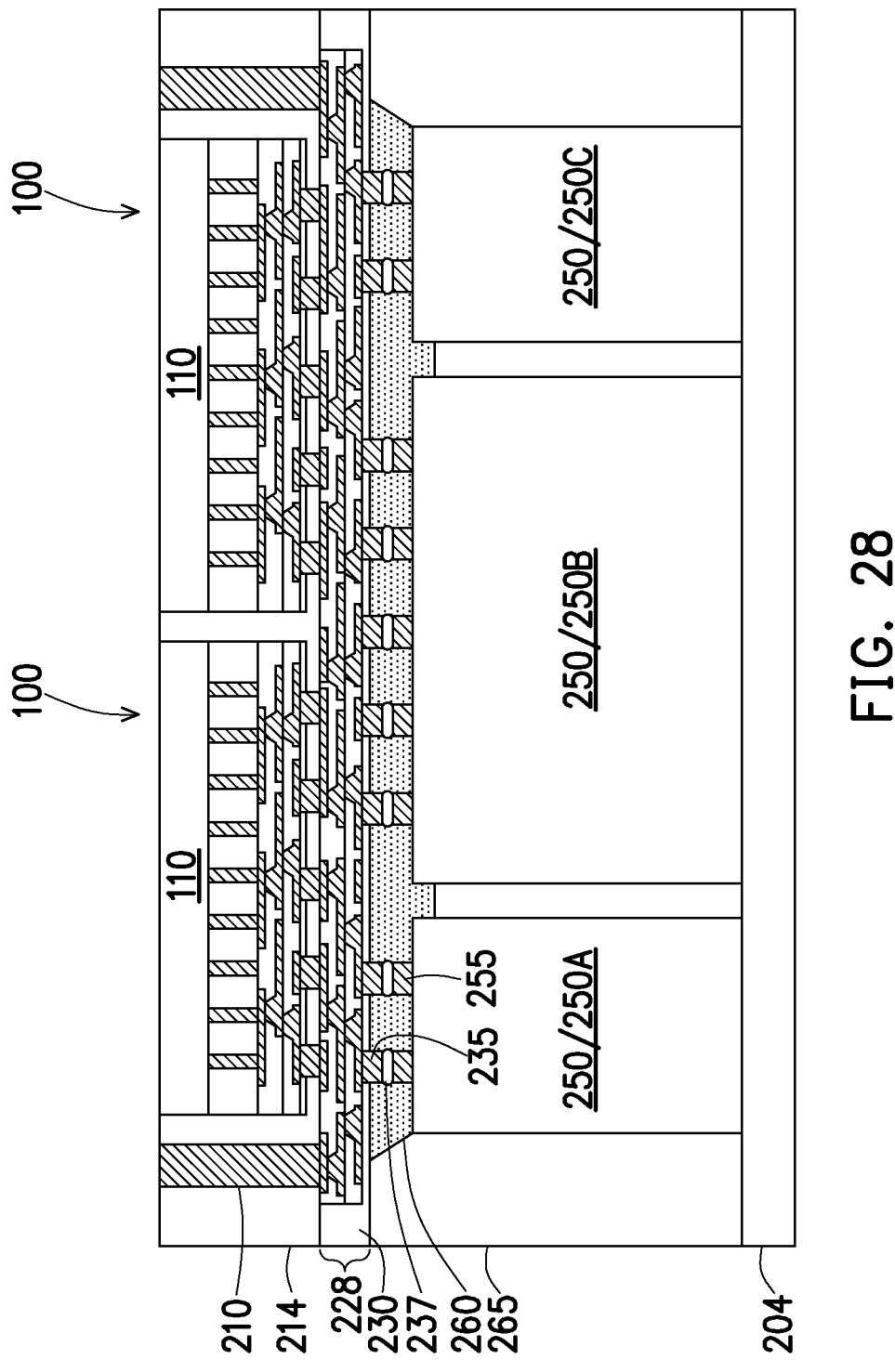

In FIG. 28, the carrier substrate 202 may be removed by a debonding process and the structure flipped over and attached to a mounting platform 204. The mounting platform 204 may be another carrier substrate similar to the carrier substrate 202, a tape, mounting frame, or the like. In an example debonding process, the de-bonding includes projecting a light such as a laser light or an UV light on the release layer so that the release layer decomposes under the heat of the light and the carrier substrate 202 can be removed. The structure is then flipped over and placed on a tape (not shown). If a release layer is not used, the structure may be flipped over and placed on the mounting platform 204 and then the carrier substrate 202 may be mechanically removed by upward pressure or by grinding the carrier substrate 202 in a grinding process. The removal of the carrier substrate 202 exposes the carrier substrate 110 of the chiplet interposer 100.

Figure 29:
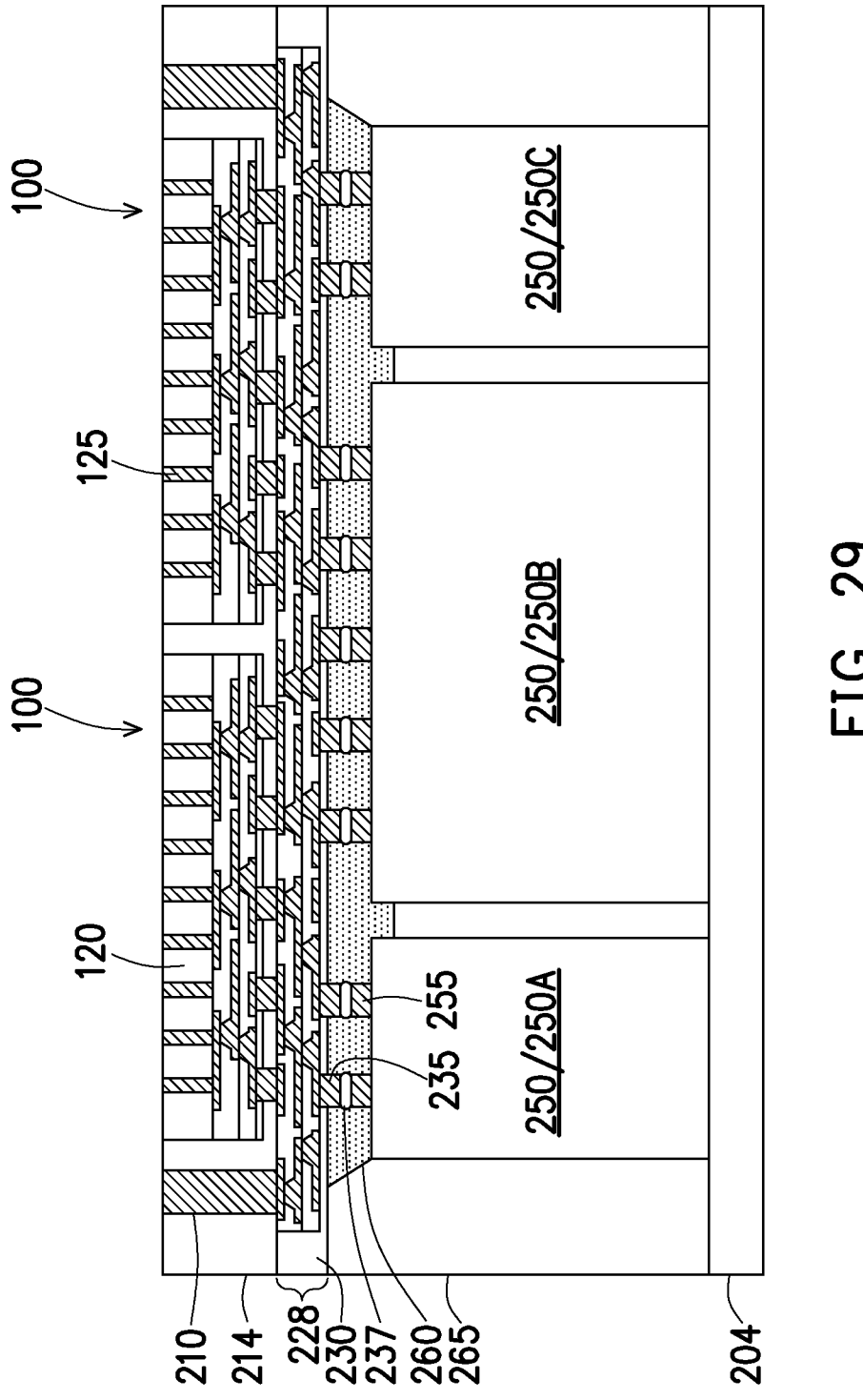

In FIG. 29, the chiplet interposer 100 is modified by removing the carrier substrate 110 of the chiplet interposer 100. The carrier substrate 110 of the chiplet interposer 100 may be removed through a leveling process which removes the carrier substrate 110 and levels the (now) upper surfaces of the through vias 210 with an upper surface of the encapsulant 214 and the chiplet interposers 100. The leveling process may include a planarization process such as a grinding process, a CMP process, an etching process, the like, or combinations thereof. In some embodiments, a release layer 112 may be used between the dielectric fill 120 and the carrier substrate 110. In such embodiments, the release layer 104 may be used to more easily release the carrier substrate 110, for example by performing an etch back of the encapsulant 214 and through vias 210, until the carrier substrate 110 is exposed. Then the carrier substrate 110 may be removed by projecting a light such as a laser light or an UV light on the release layer 112 so that the release layer 112 decomposes under the heat of the light and the carrier substrate 110 can be removed. Following the removal of the carrier substrate 110 in this manner, a CMP process may still be used to level the upper surfaces of the encapsulant 214, through vias 210, dielectric fill 120, and through vias 125. After removing the carrier substrate 110, the thickest layer of the chiplet interposer 100 is the dielectric fill 120, which functions as the substrate of the chiplet interposer 100. In some embodiments, one major surface of the chiplet interposer 100 may comprise the dielectric fill 120 and another major surface of the chiplet interposer 100 may comprise the redistribution structure 128.

Figure 30:
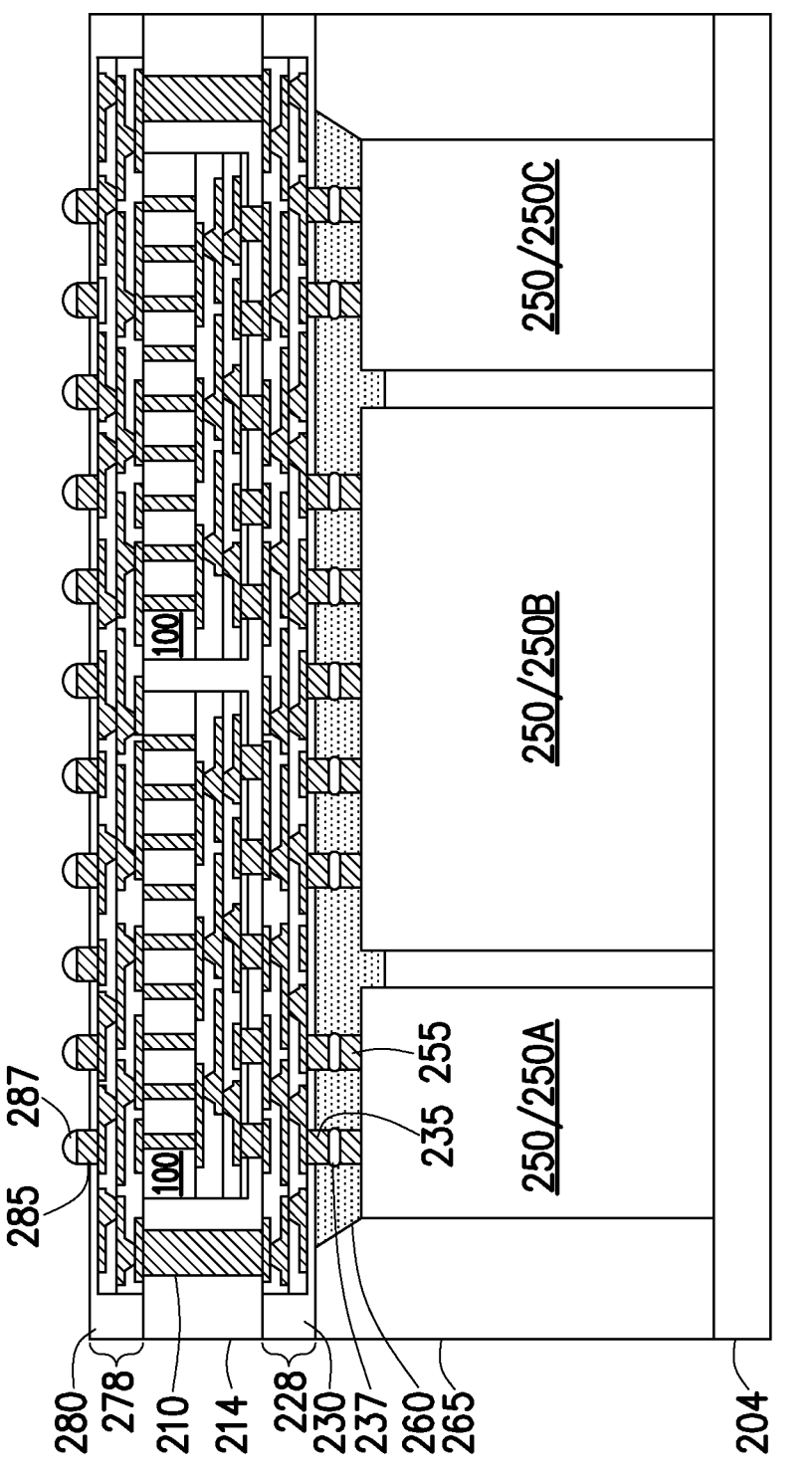

In FIG. 30, an optional redistribution structure 278 may be formed over the chiplet interposers 100. The redistribution structure 278 may be formed using processes and materials similar to those discussed above with respect to the redistribution structure 228 of FIG. 26. An encapsulant 280 may be deposited over and/or around the redistribution structure 278. The encapsulant 280 may be formed using processes and materials similar to those discussed above with respect to the encapsulant 230 of FIG. 26. Openings may then be formed in the encapsulant 280 to expose the top metallization pattern of the redistribution structure 278. Conductive connectors 285 may be formed in the openings on the top metallization pattern of the redistribution structure 278. The conductive connectors 285 may be formed using processes and materials similar to those described above with respect to the conductive connectors 172, including optional under bump metallurgies (UBMs). A solder bump 287 may also be formed on the conductive connectors 285 in embodiments where the conductive connectors 285 do not include a solder bump. The solder bump 287 may be formed by any suitable process, such as by solder printing or plating, followed by a reflow process.

Figure 31:
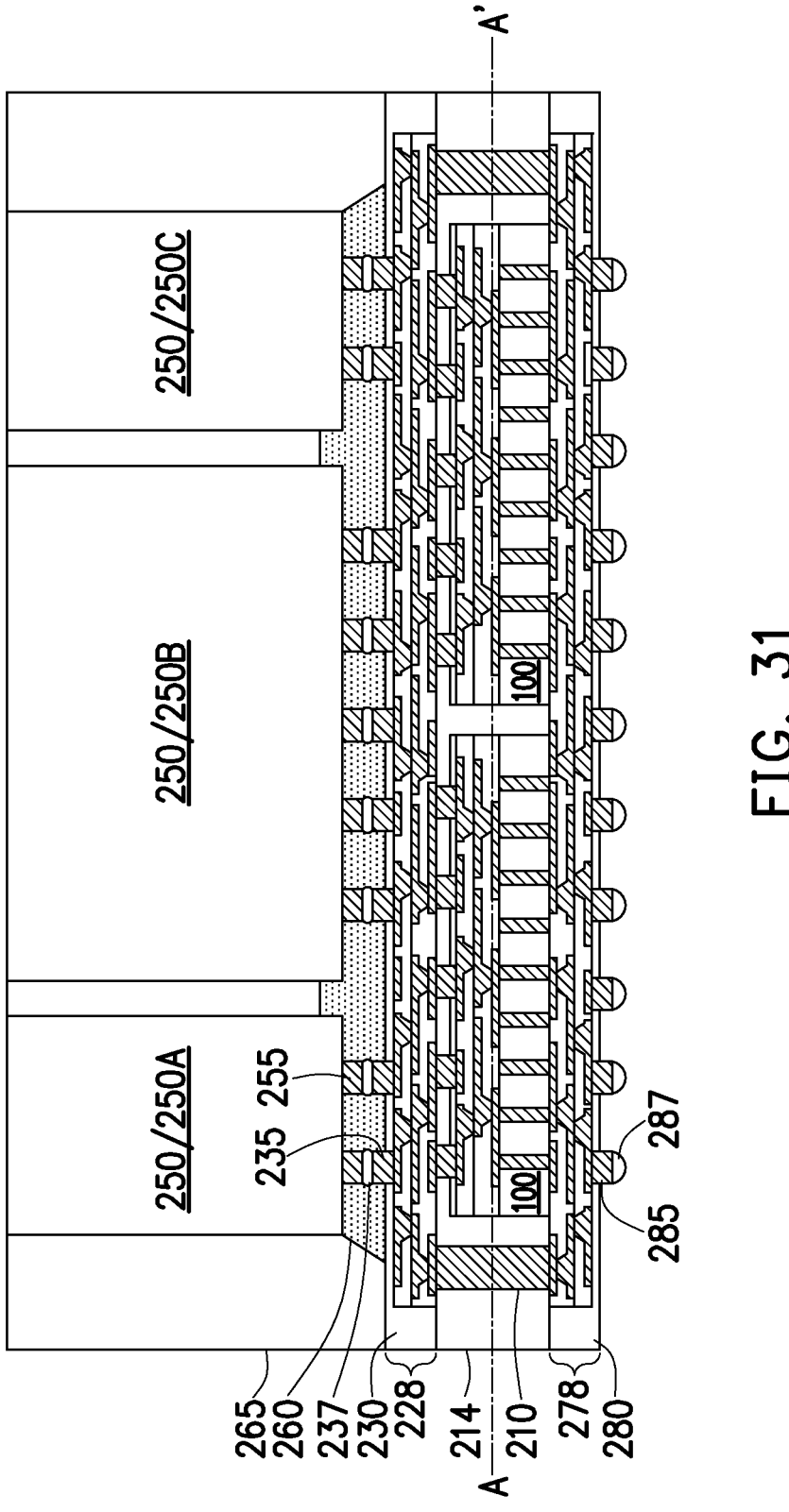

In FIG. 31, the mounting platform 204 may be removed and the structure flipped over. The completed structure may be a package device 300 including multiple devices 250 and one or more chiplet interposers 100 that help redistribute signals from/to the devices 250 to/from the conductive connectors 285. The optional stitching process may be used to form super packages which include metallization patterns which extend beyond the lateral boundaries of a light mask (e.g., reticle) for photo patterning.

Figure 32:
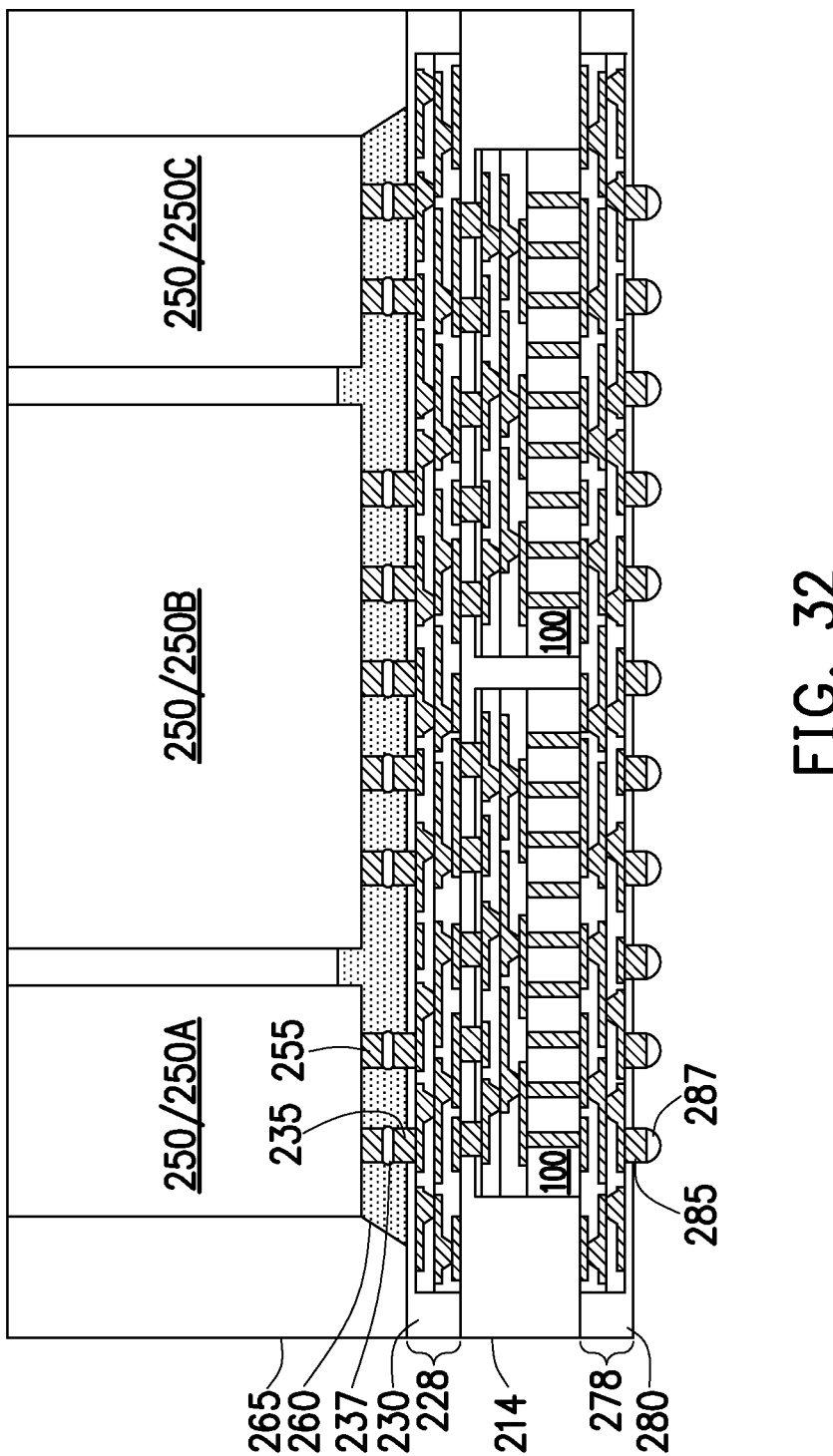

FIG. 32 illustrates the package device 300, in accordance with another embodiment. In FIG. 32, the through vias 210 are omitted. In such embodiments, the process of forming the through vias 210 may be omitted and the encapsulant 214 may be formed to laterally surround the chiplet interposers 100 (see FIG. 24).

Figure 33:
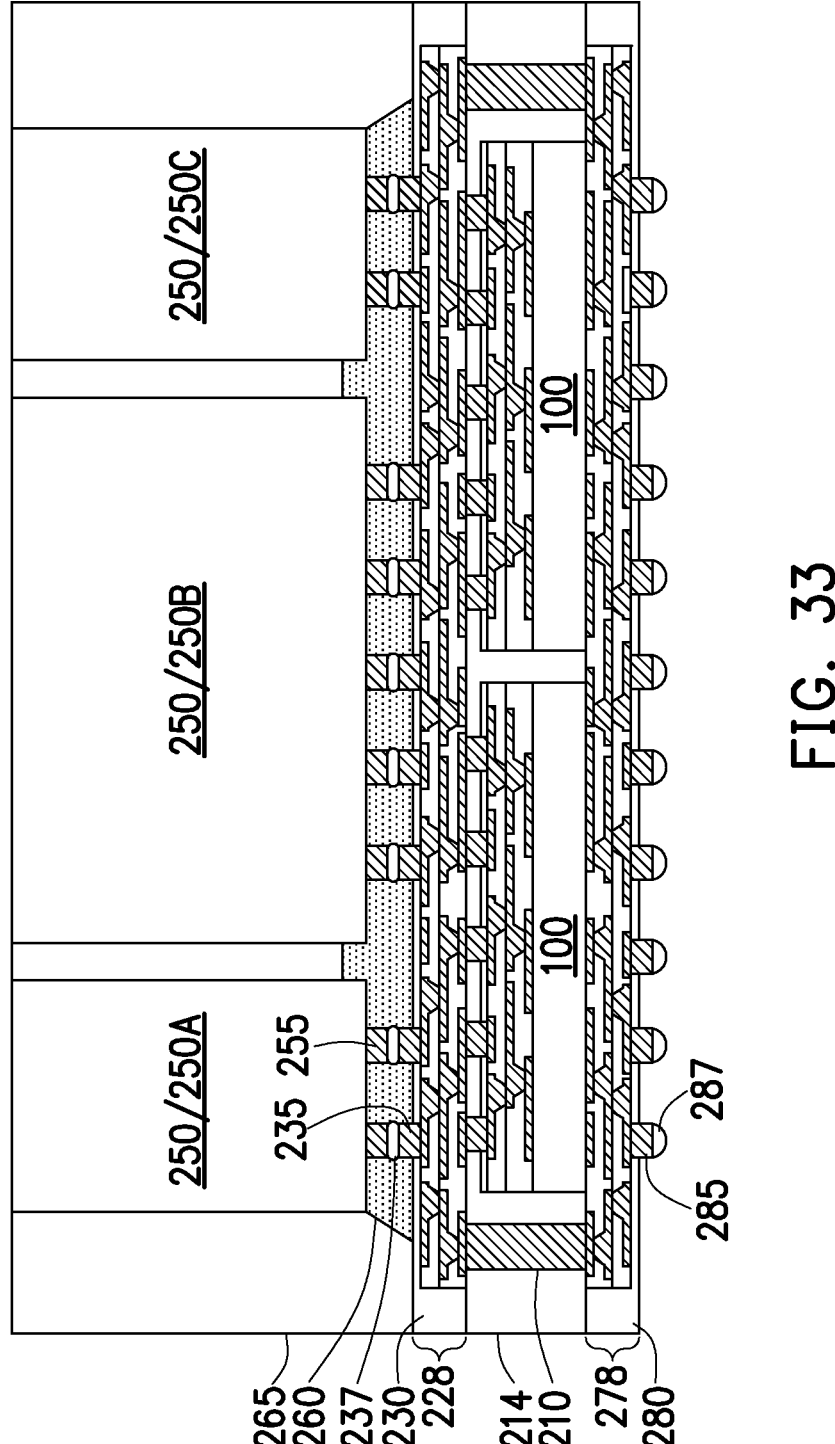

FIG. 33 illustrates the package device 300, in accordance with another embodiment. In FIG. 33, the through vias 125 (see FIG. 2) within the chiplet interposers 100 may be omitted. In such embodiments, the process of forming the through vias 125 (see FIG. 1 and its accompanying description) may be omitted and the dielectric fill 120 may be deposited over the carrier substrate 110.

Figure 34:
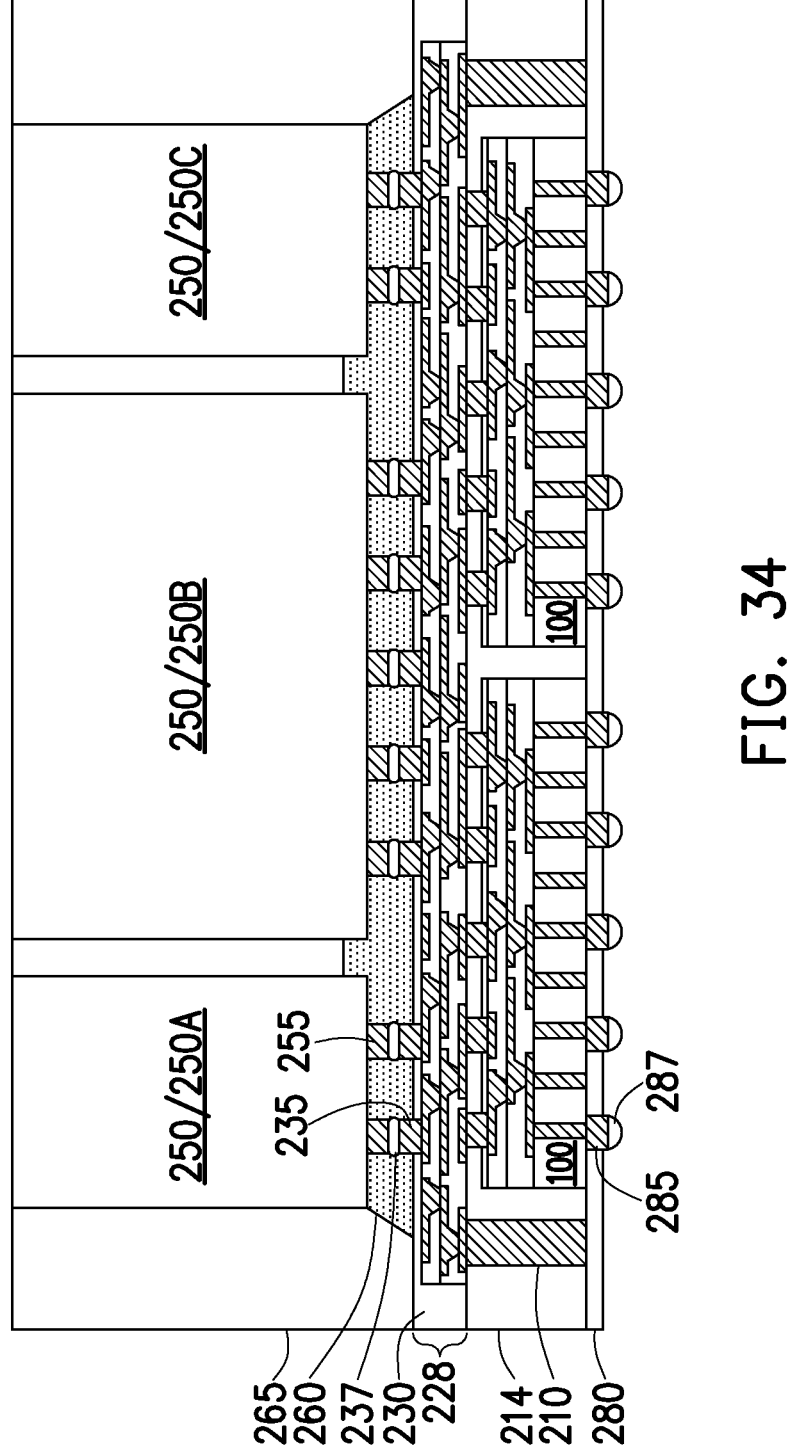

FIG. 34 illustrates the package device 300, in accordance with another embodiment. In FIG. 34, the redistribution structure 278 may be omitted. In such embodiments, the process of forming the redistribution structure 278 (see FIG. 30 and its accompanying description) may be omitted and the encapsulant 280 may be formed directly on the through vias 125, the through vias 210, the encapsulant 214, and the dielectric fill 120.

Each of the package devices 300 illustrated in FIGS. 31 through 34 utilize a chiplet interposer 100 which lacks a silicon substrate, such as the carrier substrate 110. Instead, the acting "substrate" of the interposer 100 is a dielectric fill 120 which may also have optional through vias 125. Because the chiplet interposer 100 does not have a silicon substrate, the stress concentration of the chiplet interposer 100 is less than other interposer technologies. For example, the Young's modulus of a silicon substrate may be between about 130 and 180 GPa, depending on thickness, crystalline orientation, and axis direction. In contrast, the Young's modulus of the dielectric fill 120 may be between about 50 to about 100 GPa, such as between about 65 and 75 GPa. Thus, the chiplet interposer 100 exhibits a stress concentration which is markedly less than other interposer technologies. The reduced stress modulus also allows for larger footprint interposers and the successful use of the stitching processes described above.

FIGS. 35 through 45 illustrate intermediate steps in the process of forming a package device, in accordance with some embodiments. In the illustrated process, like references refer to like features previously described. In FIGS. 35 through 45 devices 250 are attached to a carrier first and the chiplet interposers 100 are attached during a subsequent process.

Figure 35:
FIGS. 35 through 45 illustrate cross-sectional views of intermediate steps during a process for forming a package device utilizing a chiplet interposer, in accordance with some embodiments.

In FIG. 35, a carrier substrate 302 is provided. Devices 250, such as device 250A and device 250B are attached to the carrier substrate 302. The carrier substrate 302 may be a similar material as the carrier substrate 110, and the devices 250 may be attached to the carrier substrate 302 using a release layer similar to the release layer 112, discussed above.

Figure 36:
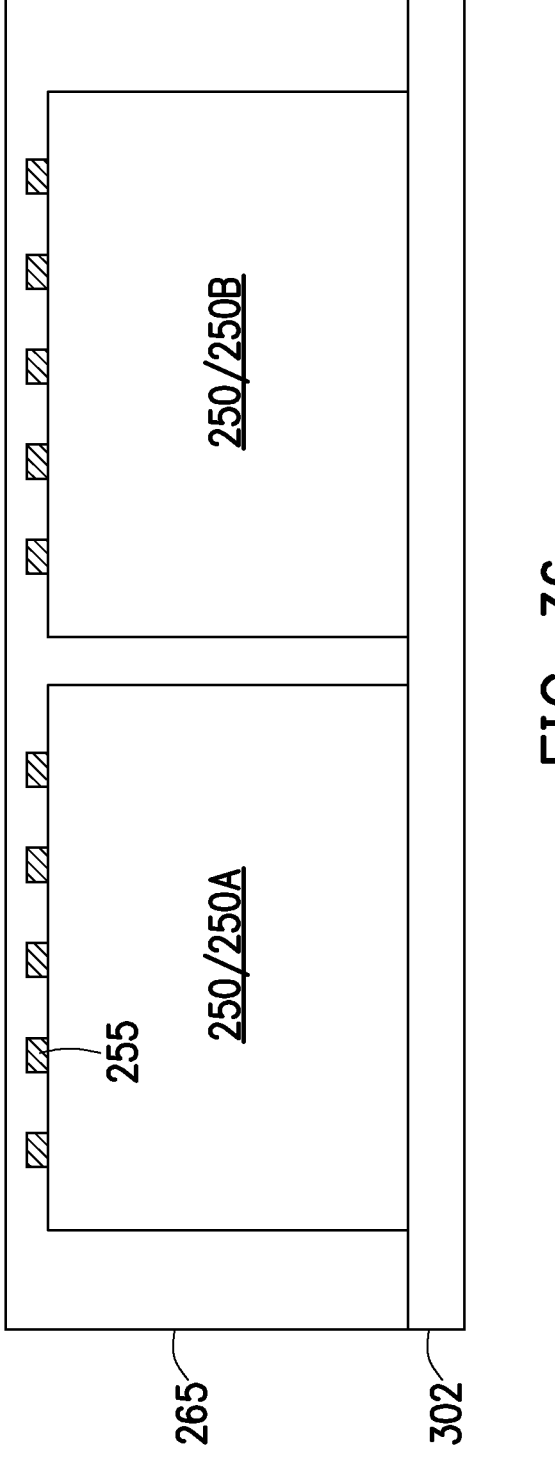

In FIG. 36, an encapsulant 265 is deposited over the devices 250 and laterally surrounds the devices 250. In some embodiments, the encapsulant 265 may cover connectors 255 of the devices 250, such as illustrated in FIG. 36. In some embodiments, the connectors 255 may not protrude from the devices 250 and the encapsulant may be disposed on an upper surface of the devices 250, but not laterally surrounding the connectors 255. The encapsulant 265 may be formed using processes and materials similar to the encapsulant 214, described above with respect to FIG. 24.

Figure 37:
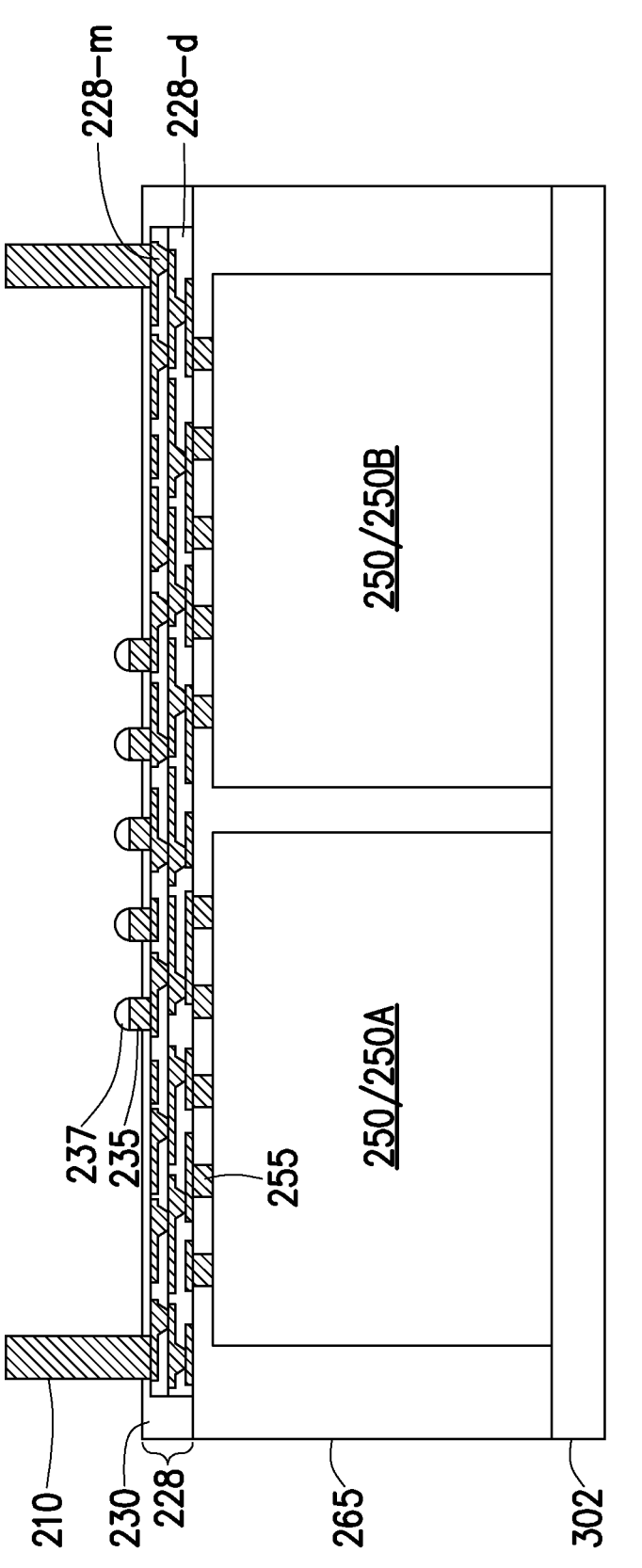

In FIG. 37, a planarization process, such as a CMP process is used to level upper surfaces of the encapsulant 265 and connectors 255. In embodiments where the connectors 255 are embedded in the devices 250, the planarization process may also level the encapsulant 265 with the upper surface of the rest of the devices 250. The planarization process in such embodiments may expose the connectors 255 from the encapsulant 265.

Next in FIG. 37, a redistribution structure 228 is formed over the encapsulated devices 250. The redistribution structure 228 is used to route signals to and from the connectors 255 of the devices 250. The redistribution structure 228 is similar to the redistribution structure 228 described above, and may be formed using like processes and materials. An encapsulant 230 laterally encapsulates the redistribution structure 228 in some embodiments. Conductive connectors 235 and solder bumps 237 are formed over the redistribution structure 228. The conductive connectors 235 and solder bumps 237 may be formed using processes and materials similar to those described above. Through vias 210 are also formed over the redistribution structure 228. The through vias 210 may be formed using processes and materials similar to the through vias 210 discussed above. It should be noted, however, that the through vias 210 may be deposited on the metallization pattern 228-*m* (or an under bump structure formed on the metallization pattern 228-*m*). The depositing of the through vias 210 may for example, be done by a plating process, such as by electro or electro-less plating.

Figure 38:
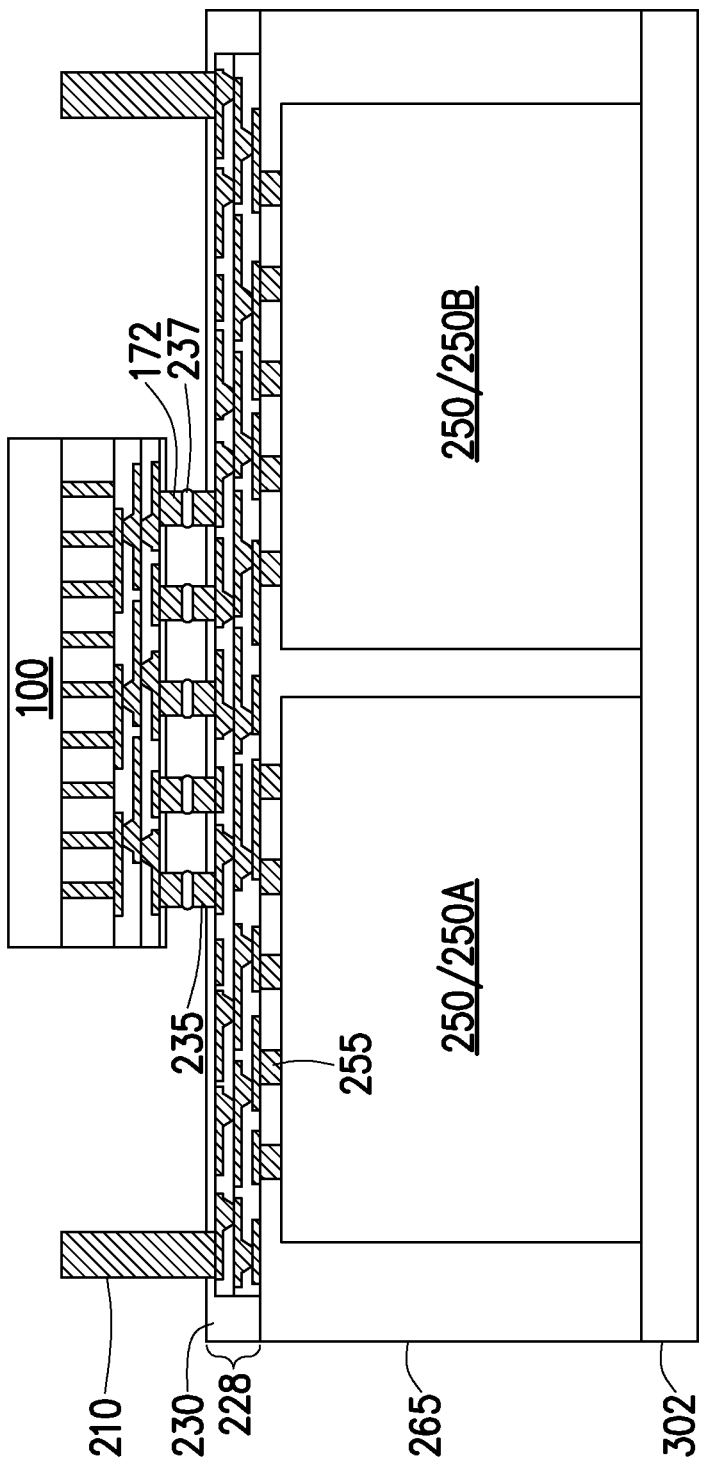

In FIG. 38, a chiplet interposer 100 is attached to the conductive connectors 235 by way of the solder bumps 237. The chiplet interposer 100 may have a carrier (such as the carrier substrate 110, as described above) attached to it for handling purposes. It should be understood that, although one of the chiplet interposers 100 is illustrated, any number of such chiplet interposers 100 may be used. In addition the chiplet interposer 100 may be any of the chiplet interposers 100 discussed above, including a super chiplet interposer 100' containing multiple patterning region disposed therein which are joined together by a stitching process.

Figure 39:
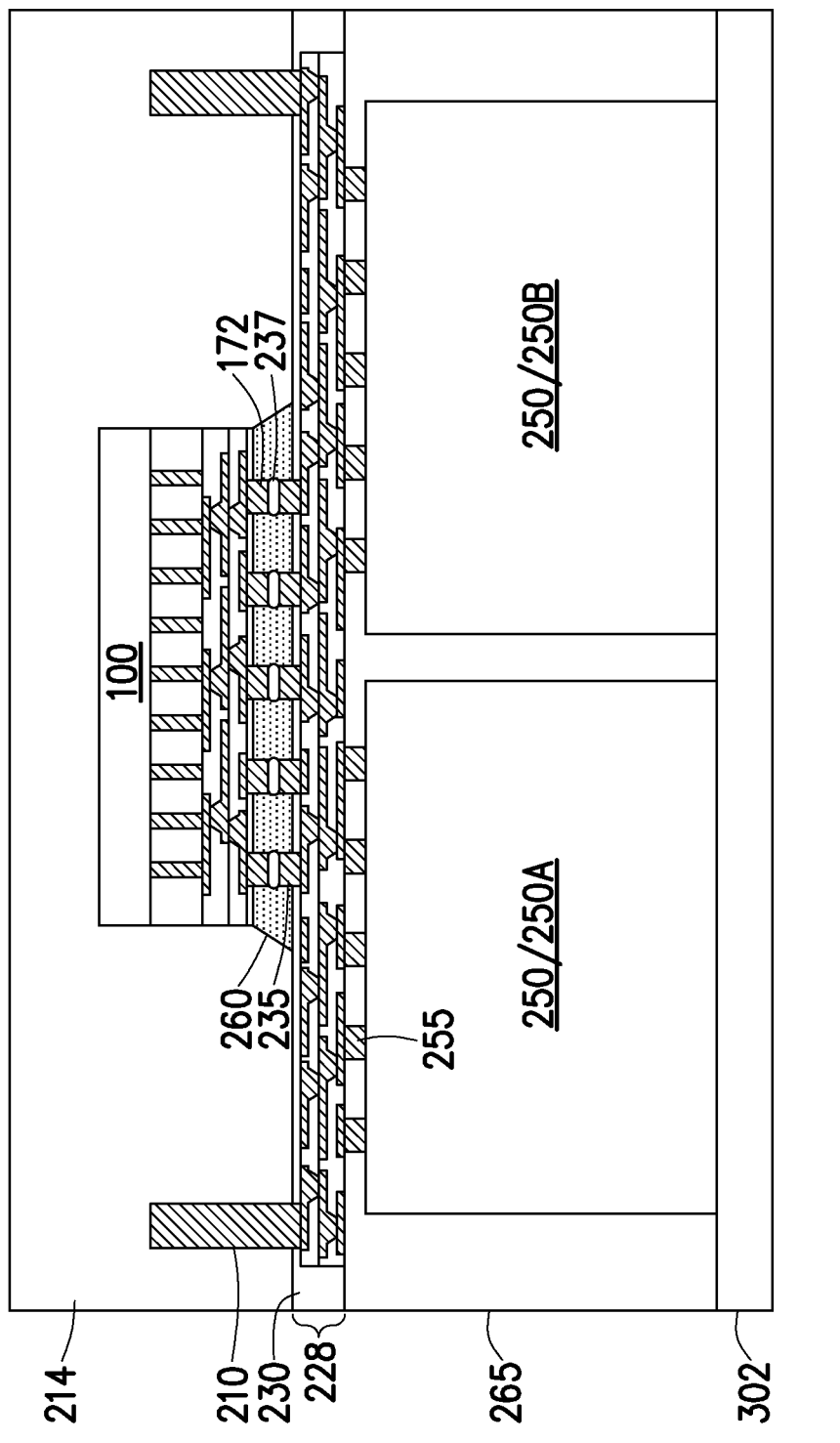

In FIG. 39, an underfill 260 may optionally be deposited or injected by a capillary flow process between the chiplet interposers 100 and the redistribution structure 228 to surround and support the connection between the conductive connectors 235 and the conductive connecters 172. An encapsulant 265 is deposited over and laterally surrounding the through vias 210 and the chiplet interposers 100. In embodiments which omit the underfill 260, the encapsulant 265 may be utilized as an underfill as well.

Figure 40:
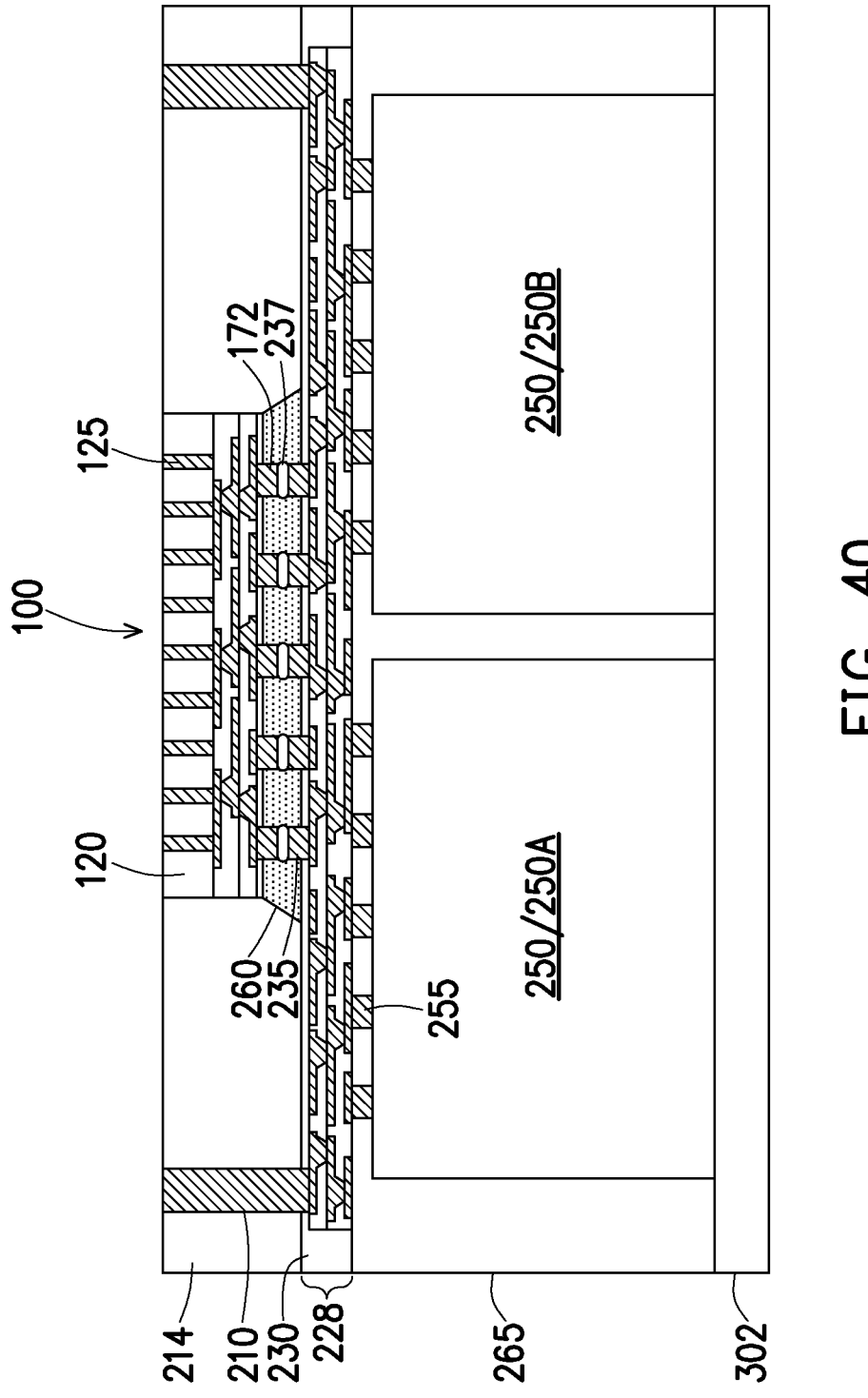

In FIG. 40, a leveling process may be performed to level an upper surface of the dielectric fill 120 of the chiplet interposer 100 with the encapsulant 265 and through vias 210. The chiplet interposer 100 is also modified by removing the carrier substrate 110 of the chiplet interposer. The carrier substrate 110 may be removed, for example, as a part of the leveling process or as a part of a separate process. The leveling process may include grinding, etching, a CMP process, the like, or combination thereof. In some embodiments, a release layer 112 may be used between the dielectric fill 120 and the carrier substrate 110. In such embodiments, the release layer 104 may be used to more easily release the carrier substrate 110, for example by performing an etch back of the encapsulant 214 and through vias 210, until the carrier substrate 110 is exposed. Then the carrier substrate 110 may be removed by projecting a light such as a laser light or an UV light on the release layer 112 so that the release layer 112 decomposes under the heat of the light and the carrier substrate 110 can be removed. Following the removal of the carrier substrate 110 in this manner, a CMP process may still be used to level the upper surfaces of the encapsulant 214, through vias 210, dielectric fill 120, and through vias 125. After removing the carrier substrate 110, the thickest layer of the chiplet interposer 100 is the dielectric fill 120, which functions as the substrate of the chiplet interposer 100. In some embodiments, one major surface of the chiplet interposer 100 may comprise the dielectric fill 120 and another major surface of the chiplet interposer 100 may comprise the redistribution structure 128.

Figure 41:
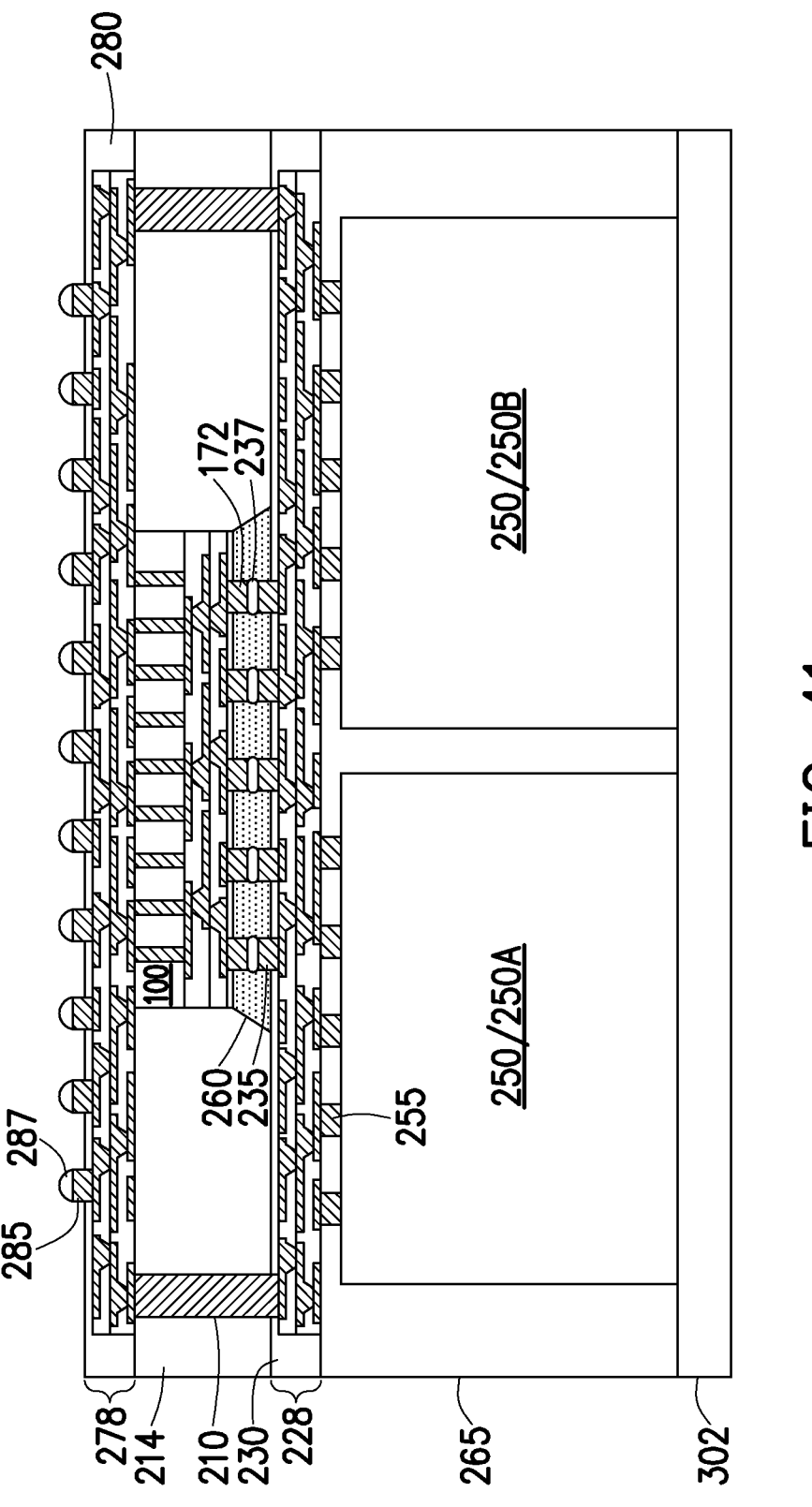

In FIG. 41, an optional redistribution structure 278 may be formed over the chiplet interposers 100. The redistribution structure 278 may be formed using processes and materials similar to those discussed above with respect to the redistribution structure 228 of FIG. 26. An encapsulant 280 may be deposited over and/or around the redistribution structure 278. The encapsulant 280 may be formed using processes and materials similar to those discussed above with respect to the encapsulant 230 of FIG. 26. Openings may then be formed in the encapsulant 280 to expose the top metallization pattern of the redistribution structure 278. Conductive connectors 285 may be formed in the openings on the top metallization pattern of the redistribution structure 278. The conductive connectors 285 may be formed using processes and materials similar to those described above with respect to the conductive connectors 172, including optional under bump metallurgies (UBMs). A solder bump 287 may also be formed on the conductive connectors 285 in embodiments where the conductive connectors 285 do not include a solder bump. The solder bump 287 may be formed by any suitable process, such as by solder printing or plating, followed by a reflow process.

Figure 42:
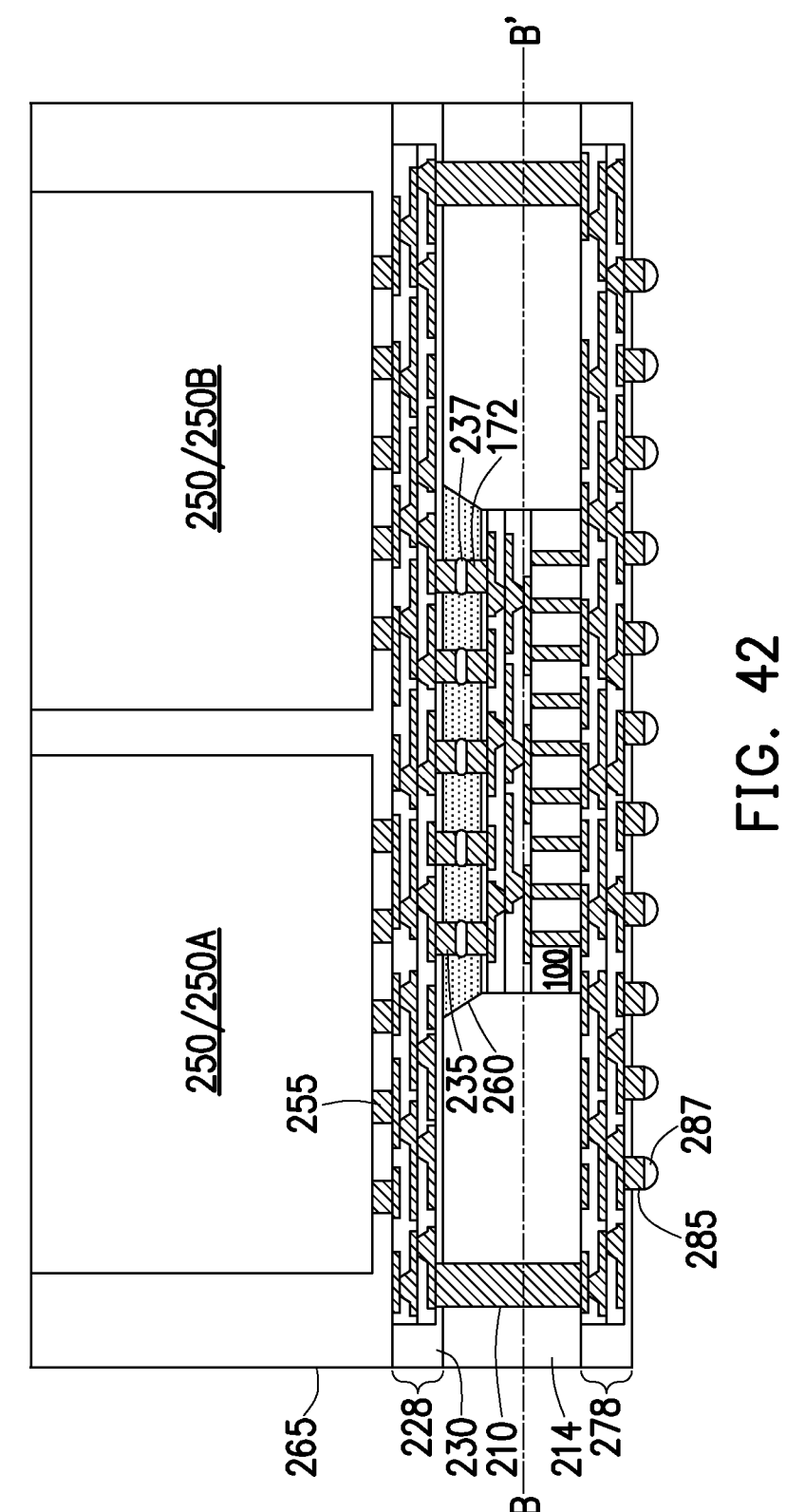

In FIG. 42, the carrier substrate 302 may be removed by a debonding process and the structure flipped over. In an example debonding process, the de-bonding includes projecting a light such as a laser light or an UV light on the release layer so that the release layer decomposes under the heat of the light and the carrier substrate 302 can be removed. If a release layer is not used, the structure may be flipped over and then the carrier substrate 302 may be mechanically removed by upward pressure or by grinding the carrier substrate 302 in a grinding process.

The completed structure illustrated in FIG. 42 may be a package device 400 including multiple devices 250 and one or more chiplet interposers 100 that help redistribute signals from/to the devices 250 to/from the conductive connectors 285. The optional stitching process may be used to form super chiplet interposers 100' as the chiplet interposers 100 which include metallization patterns which extend beyond the lateral boundaries of a light mask (e.g., reticle) for photo patterning.

Figure 43:
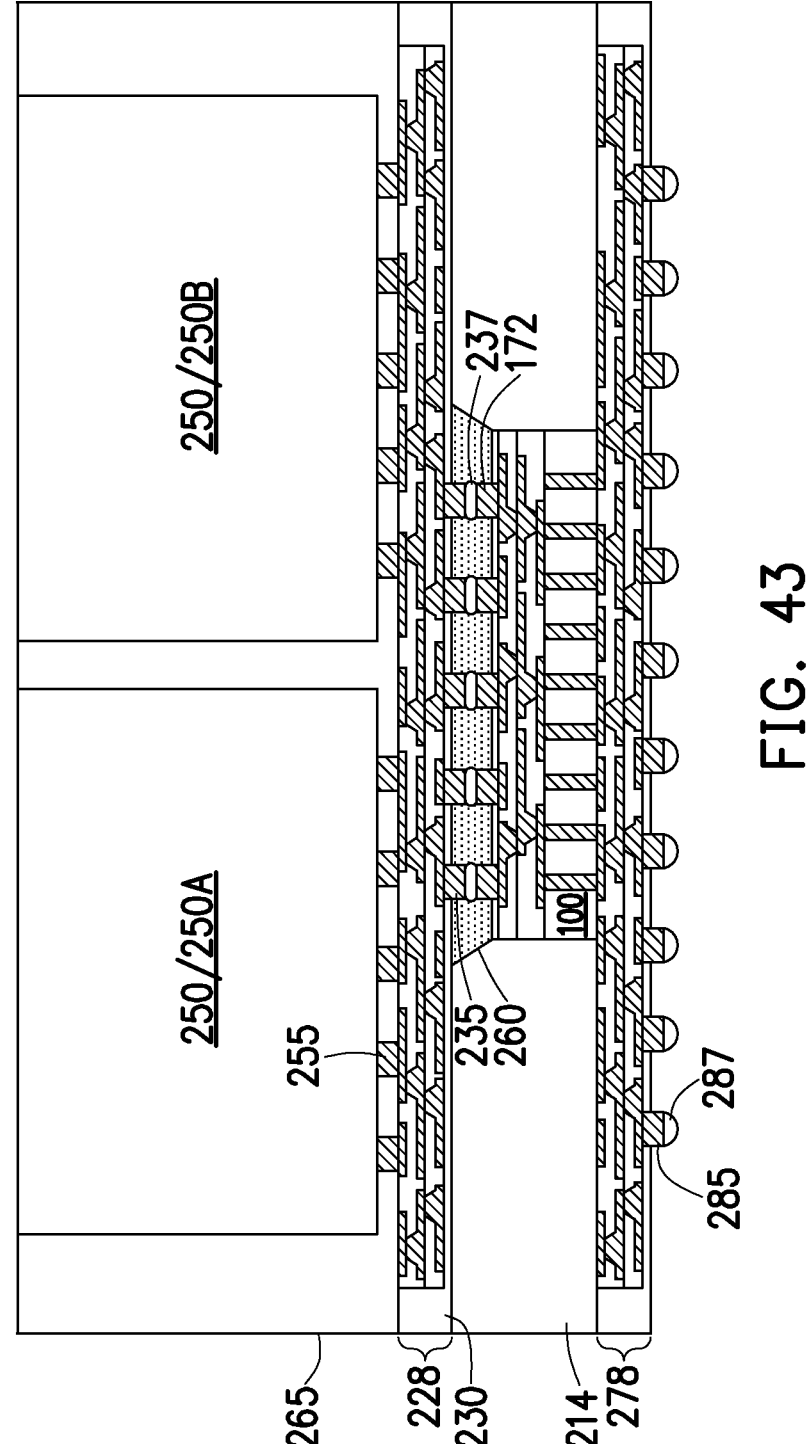

FIG. 43 illustrates the package device 400, in accordance with another embodiment. In FIG. 43, the through vias 210 are omitted. In such embodiments, the process of forming the through vias 210 may be omitted and the encapsulant 214 may be formed to laterally surround the chiplet interposers 100 (see FIG. 39).

Figure 44:
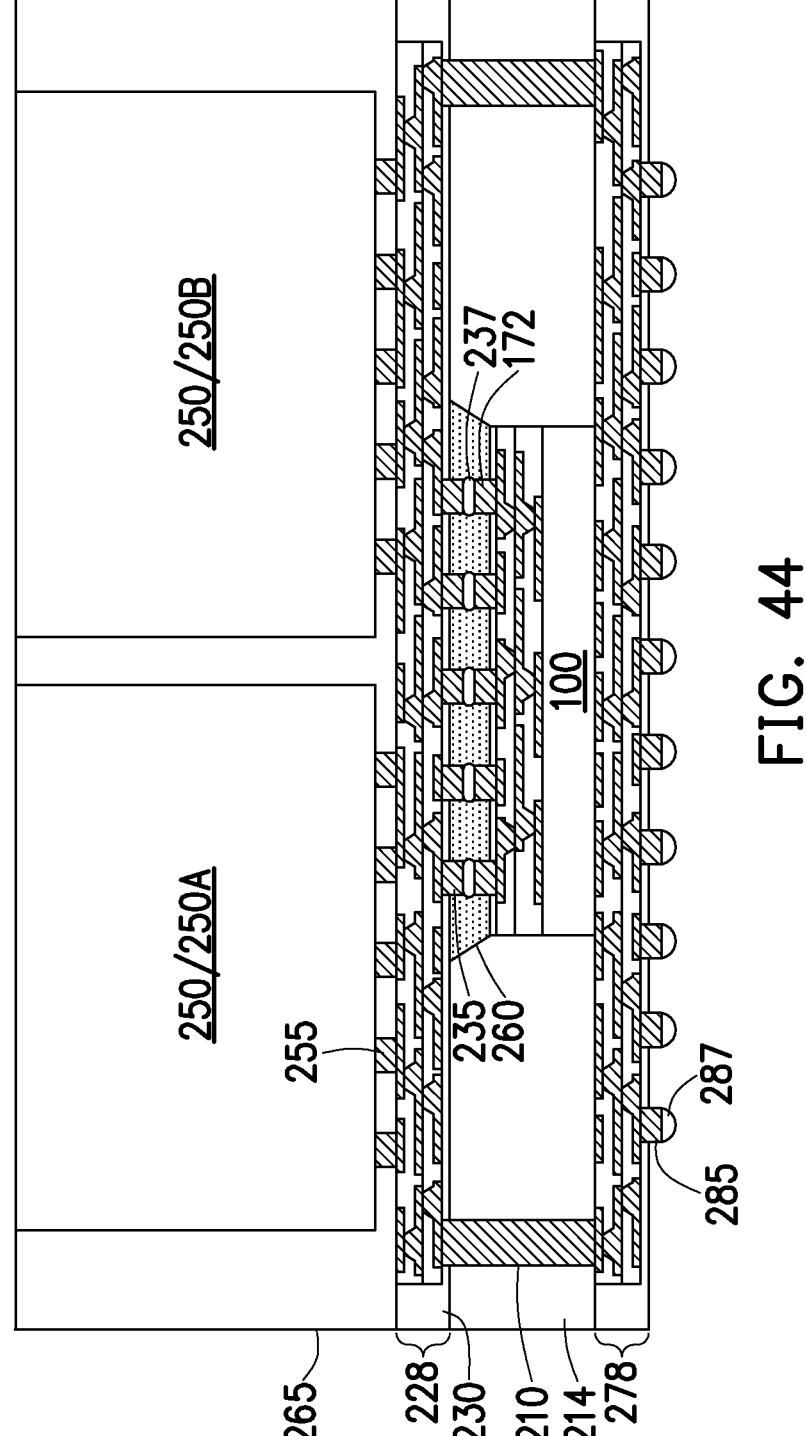

FIG. 44 illustrates the package device 400, in accordance with another embodiment. In FIG. 44, the through vias 125 (see FIG. 2) within the chiplet interposers 100 may be omitted. In such embodiments, the process of forming the through vias 125 (see FIG. 1 and its accompanying description) may be omitted and the dielectric fill 120 may be deposited over the carrier substrate 110.

Figure 45:
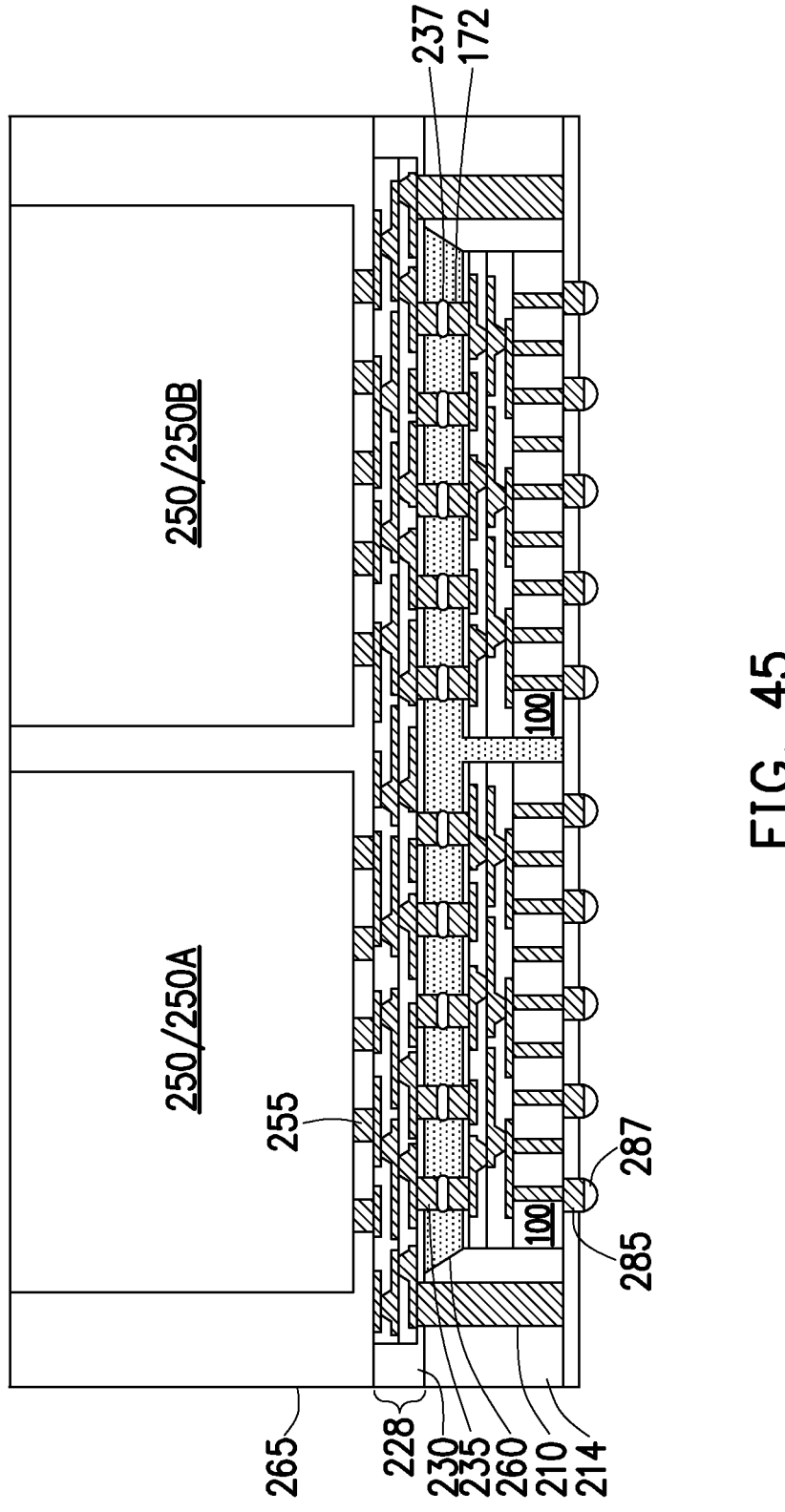

FIG. 45 illustrates the package device 400, in accordance with another embodiment. In FIG. 45, the redistribution structure 278 may be omitted. In such embodiments, the process of forming the redistribution structure 278 (see FIG. 41 and its accompanying description) may be omitted and the encapsulant 280 may be formed directly on the through vias 125, the through vias 210, the encapsulant 214, and the dielectric fill 120.

Each of the package devices 400 illustrated in FIGS. 35 through 45 utilize a chiplet interposer 100 which lacks a silicon substrate, such as the carrier substrate 110. Instead, the acting "substrate" of the interposer 100 is a dielectric fill 120 which may also have optional through vias 125. Because the chiplet interposer 100 does not have a silicon substrate, the stress concentration of the chiplet interposer 100 is less than other interposer technologies. For example, the Young's modulus of a silicon substrate may be between about 130 and 180 GPa, depending on thickness, crystalline orientation, and axis direction. In contrast, the Young's modulus of the dielectric fill 120 may be between about 50 to about 100 GPa, such as between about 65 and 75 GPa. Thus, the chiplet interposer 100 exhibits a stress concentration which is markedly less than other interposer technologies. The reduced stress modulus also allows for larger footprint interposers and the successful use of the stitching processes described above.

With regard to the package devices 300 and 400, other features and processes may also be included. For example, testing structures may be included to aid in the verification testing of the package devices 300 and 400. The testing structures may include, for example, test pads formed in a redistribution layer or on a substrate that allows the testing of the package devices 300 and 400, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs. Subsequent processes may mount the package devices 300 and/or 400 to a device substrate.

Figure 46:
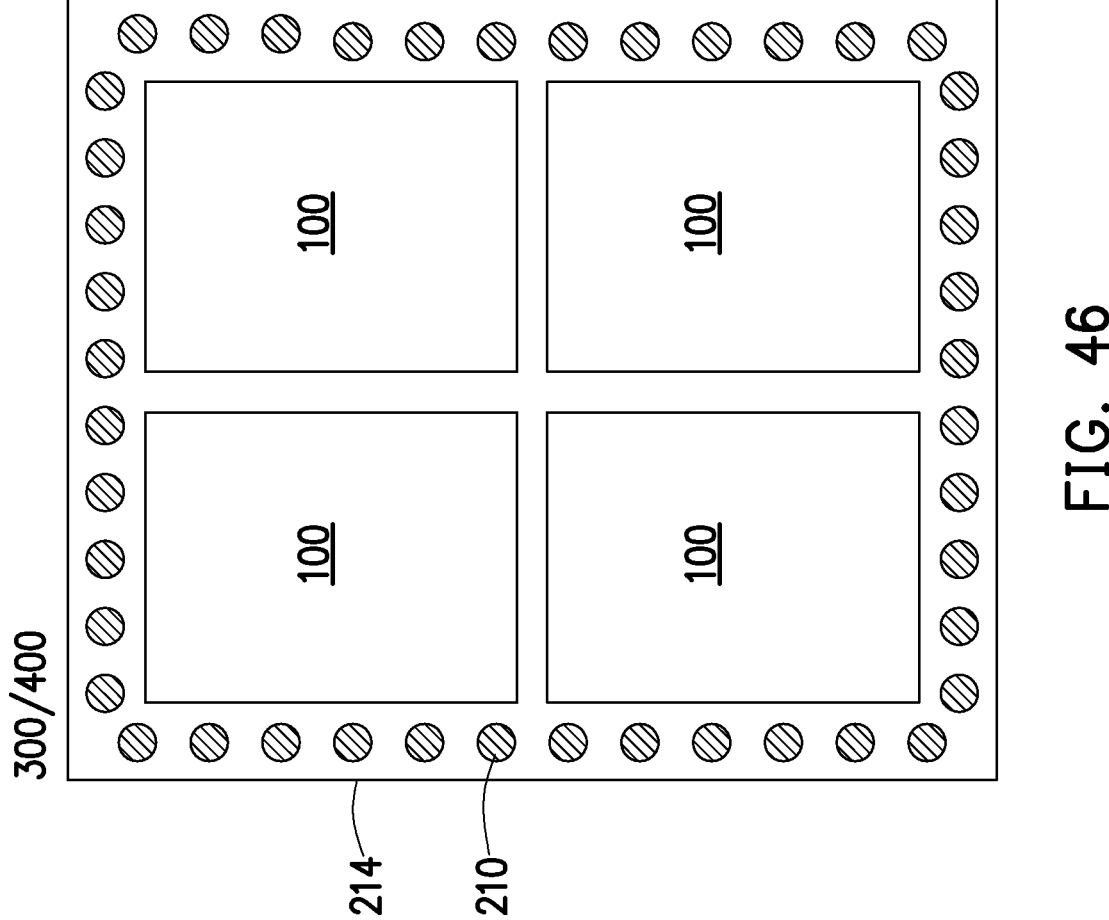
FIGS. 46 through 51 illustrate top down views of various configurations regarding the utilization of one or more chiplet interposers, in accordance with various embodiments.
Figure 47:
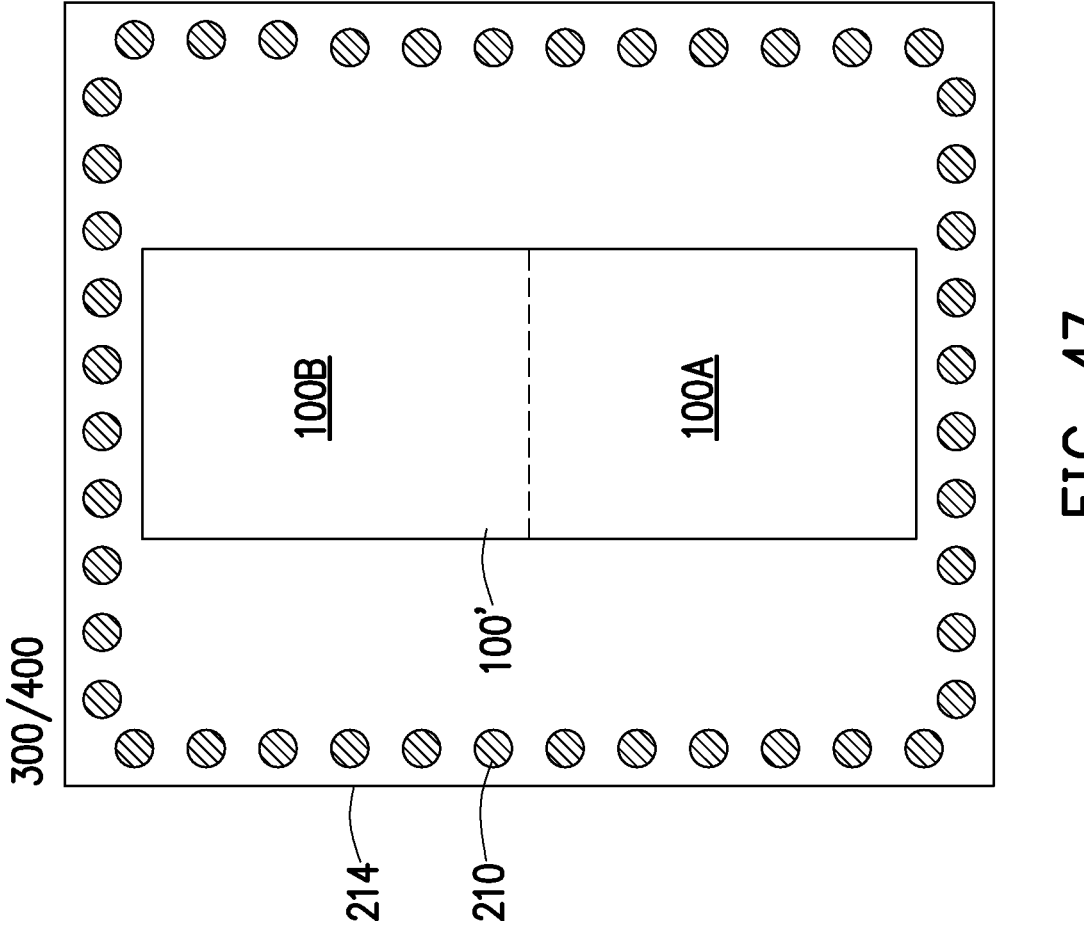

FIGS. 46 through 52 are horizontal cross sectional views through the chiplet interposer 100 layer of the package device 300 and package device 400. FIG. 46 is an example cross sectional view taken along the line A-A' in FIG. 31 (for the package device 300), and FIG. 47 is an example cross sectional view taken along the line B-B' in FIG. 42 (for the package device 400). Each of FIGS. 46 through 52 illustrate various configurations for the chiplet interposer 100 in similar structures along similar horizontal cross-sectional planes. It should be understood that the cross-sectional views are merely examples and that they may be combined in any suitable manner to achieve a particular layout or configuration. For example, more or fewer chiplet interposers 100 may be incorporated than those depicted. Additionally, super chiplet interposers 100' may be used and combined with other chiplet interposers, as illustrated in FIGS. 46 through 52.

In FIG. 46, a horizontal cross sectional view through the chiplet interposer 100 is illustrated, in accordance with some embodiments. As noted in FIG. 46, device 300/400 may have multiple chiplet interposers 100. In the example of FIG. 46, four chiplet interposers 100 are disposed in the layer of the encapsulant 214. More or fewer chiplet interposers 100 may be used. Because the chiplet interposers 100 are comprised of a dielectric fill 120 and not a silicon substrate layer (e.g., carrier substrate 110), the stress concentration of each of the multiple chiplet interposers 100 is small, leading to greater reliability due to decrease warpage and delamination risks. The chiplet interposers 100 may each have the same interposer design, different interposer designs, or combinations of the same interposer design and different interposer designs. The chiplet interposers 100 may also include a mix of interposers with one patterning region or super chiplet interposers 100' with multiple patterning regions (side by side).

In FIG. 47, a horizontal cross sectional view through the chiplet interposer 100 is illustrated, in accordance with some embodiments. In the embodiment illustrated in FIG. 47 a super chiplet interposer 100' is included as the chiplet interposer 100. The super chiplet interposer 100' may have multiple patterning regions, such as patterning region 100A and 100B. Device 300/400 may have multiple chiplet interposers 100, including multiple super chiplet interposers 100', chiplet interposers 100, or combinations thereof. In the example of FIG. 47, one super chiplet interposer 100' is disposed in the layer of the encapsulant 214. More or fewer chiplet interposers 100 may be used. Because the super chiplet interposers 100' are comprised of a dielectric fill layer 120 and not a silicon substrate layer (e.g., carrier substrate 110), the stress concentration of each of the super chiplet interposers 100' is small, leading to greater reliability due to decrease warpage and delamination risks. Where multiple chiplet interposers 100 (including super chiplet interposers 100') are used, the chiplet interposers 100 may each have the same interposer design, different interposer designs, or combinations of the same interposer design and different interposer designs.

Figure 48:
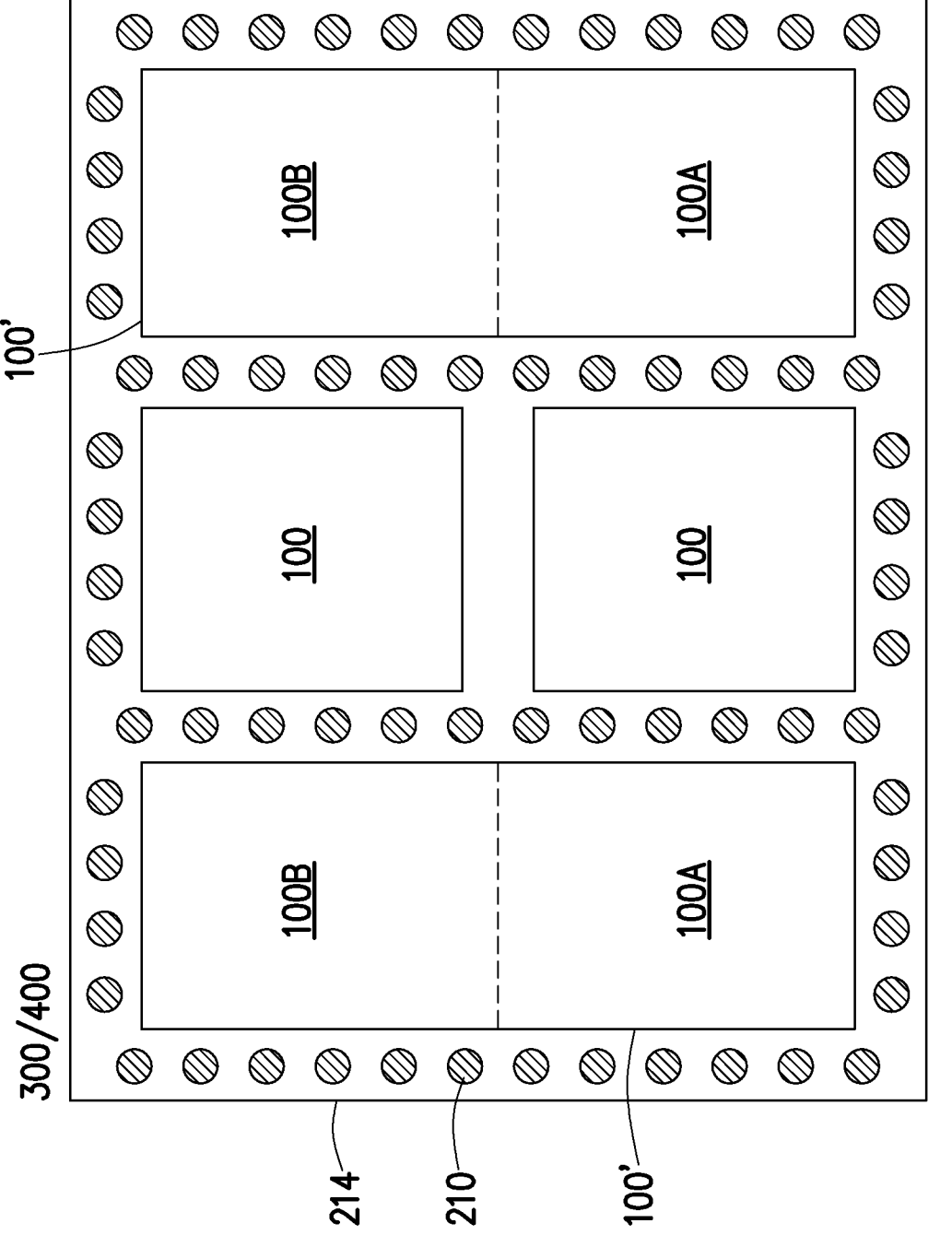

In FIG. 48, a horizontal cross sectional view through chiplet interposers 100 is illustrated, in accordance with some embodiments. In the embodiment illustrated in FIG. 48 a mix of chiplet interposers 100 and super chiplet interposer 100' are included. The super chiplet interposer 100' may have multiple patterning regions, such as patterning region 100A and 100B. In the example of FIG. 48, two super chiplet interposer 100' are disposed in the layer of the encapsulant 214 and two chiplet interposers 100 are disposed in the layer of the encapsulant 214. More or fewer chiplet interposers 100 (and/or super chiplet interposers 100') may be used. Because the chiplet interposers 100 and/or super chiplet interposers 100' are comprised of a dielectric fill 120 and not a silicon substrate layer (e.g., carrier substrate 110), the stress concentration of each of the chiplet interposers 100 and/or super chiplet interposers 100' is small, leading to greater reliability due to decrease warpage and delamination risks. The multiple chiplet interposers 100 and/or super chiplet interposers 100' may each, respectively, have the same interposer design, different interposer designs, or combinations of the same interposer design and different interposer designs.

Figure 49:
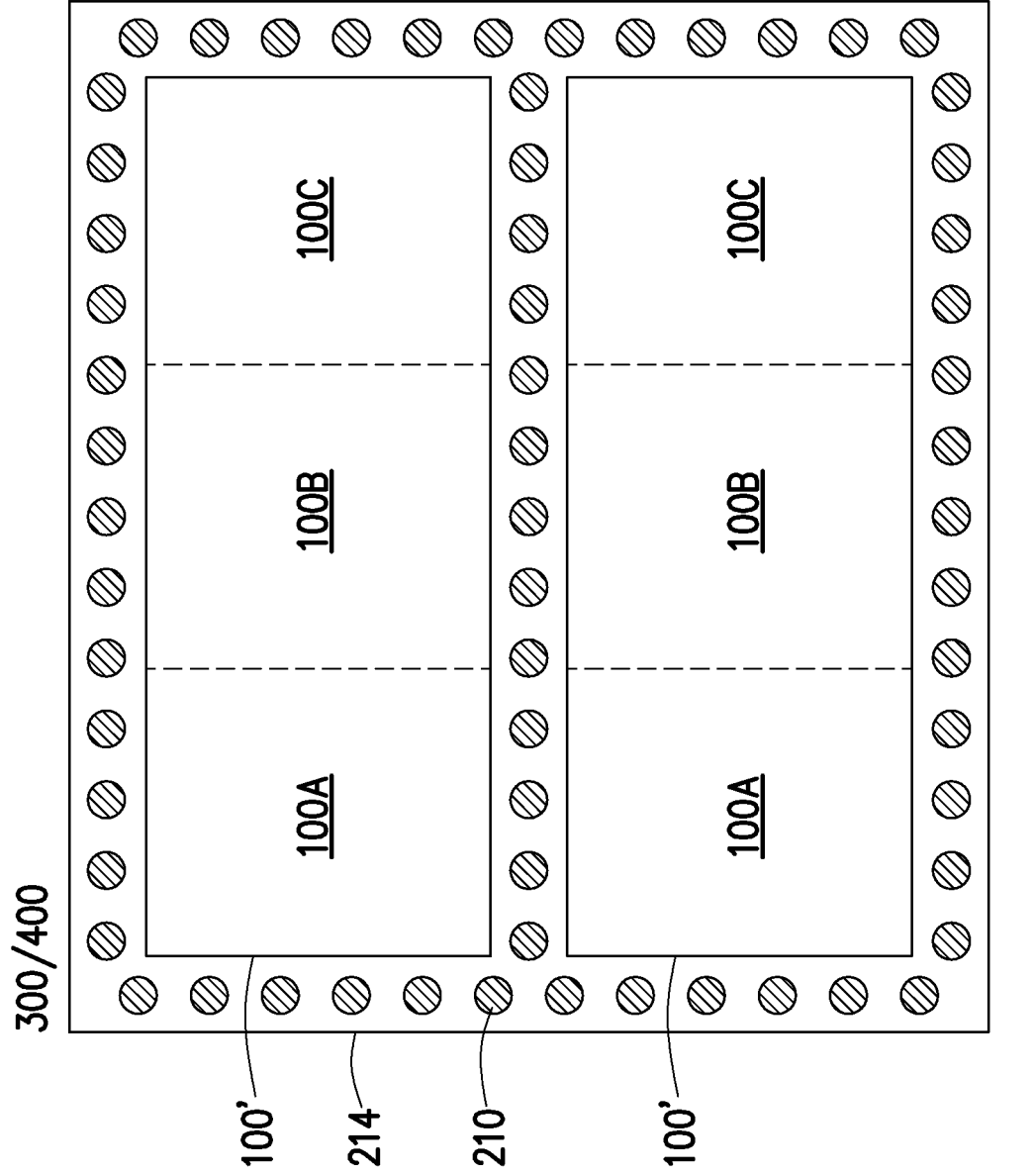

In FIG. 49, a horizontal cross sectional view through the chiplet interposer 100 is illustrated, in accordance with some embodiments. In the embodiment illustrated in FIG. 49 two super chiplet interposers 100' are included. The super chiplet interposers 100' may have multiple patterning regions, such as patterning region 100A, 100B, and 100C. Device 300/400 may have multiple chiplet interposers 100, including multiple super chiplet interposers 100', chiplet interposers 100, or combinations thereof. In the example of FIG. 49, two super chiplet interposers 100' are disposed in the layer of the encapsulant 214. More or fewer chiplet interposers 100 and/or super chiplet interposers 100' may be used. Because the super chiplet interposers 100' are comprised of a dielectric fill layer 120 and not a silicon substrate layer (e.g., carrier substrate 110), the stress concentration of each of the super chiplet interposers 100' is small, leading to greater reliability due to decrease warpage and delamination risks. Where multiple chiplet interposers 100 and/or super chiplet interposers 100' are used, the chiplet interposers 100 may each have the same interposer design, different interposer designs, or combinations of the same interposer design and different interposer designs.

Figure 50:
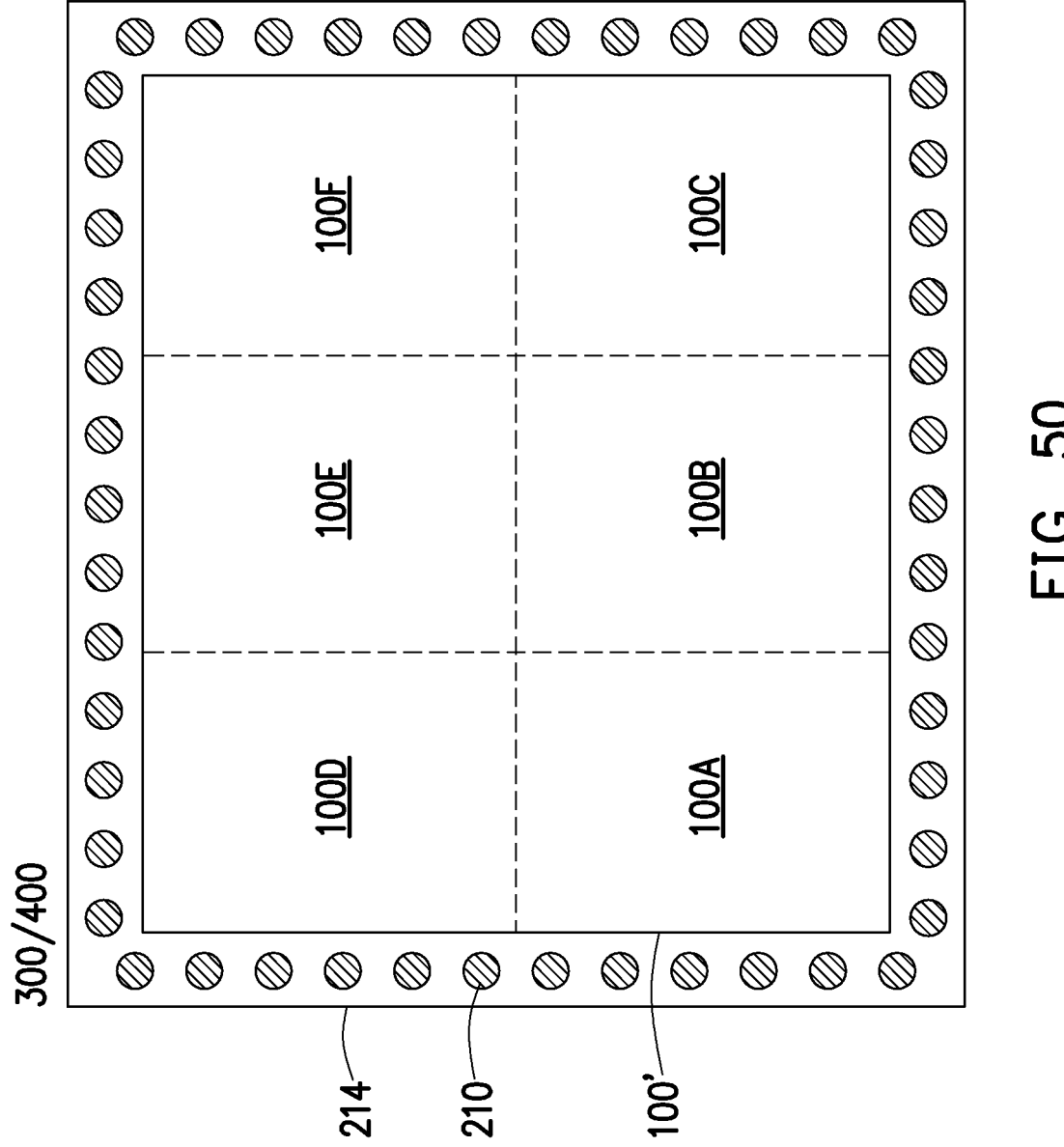
Figure 51:
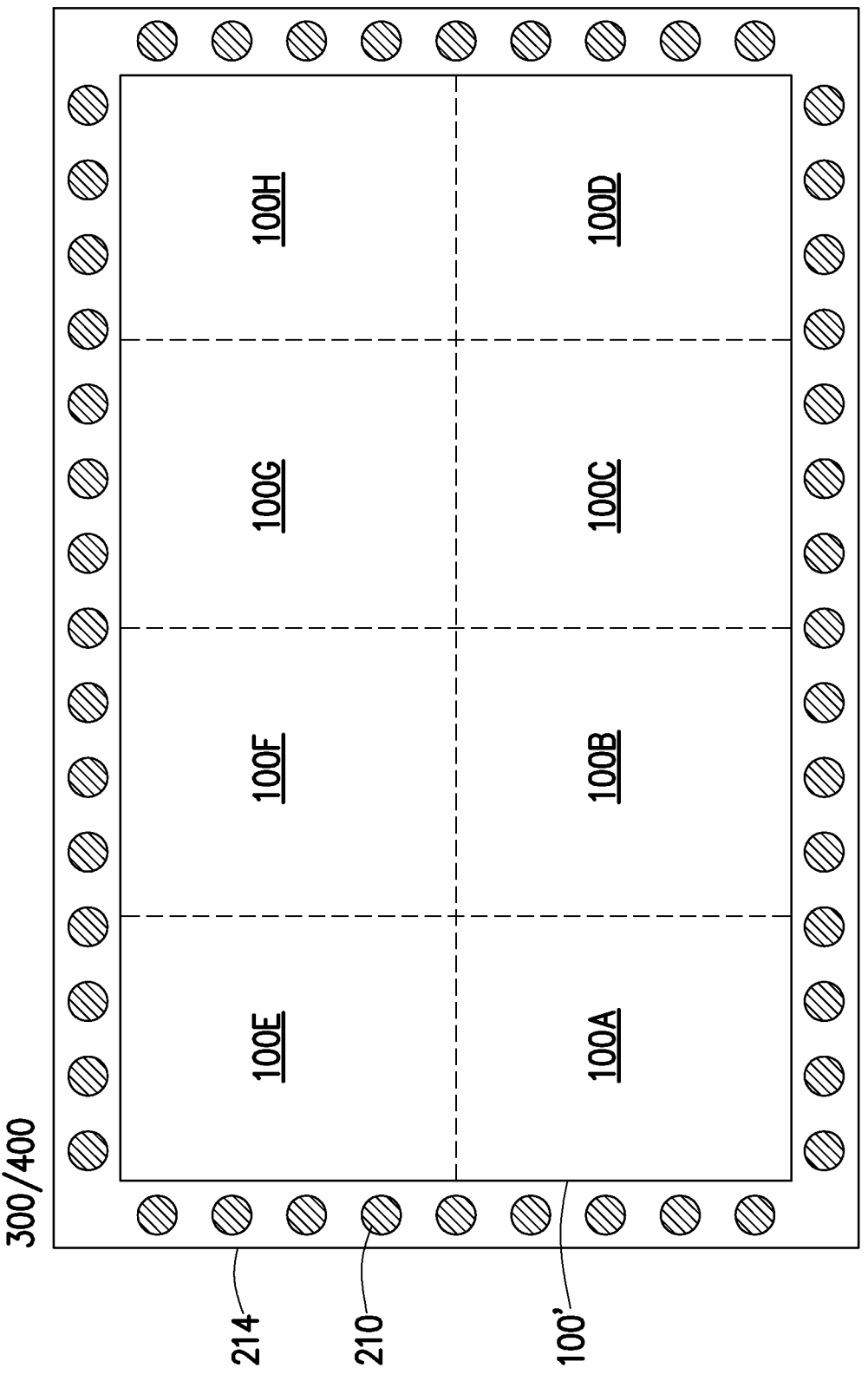

In FIGS. 50 and 51, horizontal cross sectional views through the chiplet interposers 100 are illustrated, in accordance with some embodiments. In the embodiments illustrated in FIGS. 50 and 51 a super chiplet interposer 100' is included as the chiplet interposer 100. In FIG. 50, the super chiplet interposer 100' may have multiple patterning regions, such as patterning regions 100A, 100B, 100C, 100D, 100E, and 100F. In FIG. 51, the super chiplet interposer 100' may have multiple patterning regions, such as patterning regions 100A, 100B, 100C, 100D, 100E, 100F, 100G, and 100H. Device 300/400 may have multiple chiplet interposers 100, including multiple super chiplet interposers 100', chiplet interposers 100, or combinations thereof. In the examples illustrated in FIGS. 50 and 51, one super chiplet interposer 100' is disposed in the layer of the encapsulant 214. More or fewer chiplet interposers 100 may be used. Because the super chiplet interposers 100' are comprised of a dielectric fill 120 and not a silicon substrate layer (e.g., carrier substrate 110), the stress concentration of each of the super chiplet interposers 100' is small, leading to greater reliability due to decrease warpage and delamination risks. Where multiple chiplet interposers 100 (including super chiplet interposers 100') are used, the chiplet interposers 100 may each have the same interposer design, different interposer designs, or combinations of the same interposer design and different interposer designs.

The examples provided in FIGS. 46 through 51 are intended as non-limiting examples. They may be combined to form different configurations and layouts which use the chiplet interposers 100 and/or super chiplet interposers 100'. For the super chiplet interposers 100', any number of pattern regions may be stitched together. Though the super chiplet interposers 100' are illustrated as being rectangular, pattern regions may be stitched together into other shapes, such as an el shape, a tee shape, a plus shape, a rectangular ring shape, and so forth.

Embodiments advantageously utilize one or more chiplet interposers for signal routing in a package device. The chiplet interposer provides distinct advantages over other interposer technologies. In particular, the chiplet interposer lacks a silicon substrate portion. Instead, the acting "substrate" of the chiplet interposer is a dielectric fill material that is formed over a carrier substrate which is later removed. Redistribution structures can be formed on either side of the dielectric fill "substrate" to provide signal routing capabilities, and through vias disposed in the dielectric fill can transmit the signals from one side of the interposer to the opposite side of the interposer. By removing the silicon substrate portion of the interposer and relying only on the dielectric fill as the "substrate," the stress concentration of the interposer is reduced. As result, warpage in the completed package is reduced and the possibility of delamination of the encapsulant surrounding the chiplet interposers is reduced. Embodiments further provide advantages regarding the patterning of the chiplet interposer. When the redistribution structures are formed over the dielectric fill, two or more adjacent areas of the metallization pattern of the redistribution structure can be stitched together to provide a metallization pattern having a larger footprint than would normally be possible for a given light mask size.

One embodiment is a method including attaching a first interposer to a package structure, the first interposer including a dielectric fill formed on a carrier substrate. The method also includes laterally encapsulating the first interposer in a first encapsulant. The method also includes attaching a first device to the package structure. The method also includes laterally encapsulating the first device in a second encapsulant. The method also includes removing portions of the first encapsulant and removing the carrier substrate of the first interposer to expose the dielectric fill. The method also includes forming external connectors on the package structure, one or more of the external connectors electrically coupled to the first device by way of the first interposer. In an embodiment, through vias are formed extending through the dielectric fill of the first interposer. In an embodiment, through vias are formed extending through the first encapsulant. In an embodiment, a redistribution structure is formed over the first interposer, the redistribution structure being wider than the first interposer, the redistribution structure interposed between the first interposer and the external connectors. In an embodiment, a first section of a first photopatternable material is exposed to a first light mask pattern, a second section of the first photopatternable material is exposed to a second light mask pattern, where the first section overlaps the second section, the first section and second section together forming a first pattern; and a metallization pattern is formed based on the first pattern. In an embodiment, the metallization pattern in an overlapping area of the first section and the second section has a wider line width than the metallization pattern in the first section or the second section. In an embodiment, a second interposer is attached to the package structure, the second interposer adjacent the first interposer, the second interposer including a second dielectric fill formed on a second carrier substrate, and the second carrier substrate is removed to expose the second dielectric fill. In an embodiment, the first interposer is attached to the package structure following attaching the first device to the package structure.

Another embodiments is a package including a first device, the first device laterally encapsulated by a first encapsulant. The package also includes a first interposer, the first interposer including a dielectric fill layer, the first interposer free of a silicon layer, the first interposer laterally encapsulated by a second encapsulant. The package also includes external connectors, one or more of the external connectors electrically coupled to the first device by way of the first interposer. In an embodiment, the dielectric fill layer of the first interposer includes a set of through vias disposed in the dielectric fill layer. In an embodiment, the first interposer includes a first redistribution structure and a second redistribution structure, the first redistribution structure and the second redistribution structure disposed on opposing sides of the dielectric fill layer. In an embodiment, the package includes a through via extending through the second encapsulant. In an embodiment, the first interposer includes a redistribution structure, the redistribution structure including a first metallization pattern, the first metallization pattern including an overlapping conductor, the overlapping conductor having a first width, a first metal line of the first metallization pattern having a second width, the first metal line extending continuously into the overlapping conductor, the first width being greater than the second width. In an embodiment, a second metal line of the first metallization pattern extends continuously into the overlapping conductor at a side of the overlapping conductor opposite to the first metal line, the first metal line offset the second metal line, the first metal line parallel to the second metal line.

Another embodiment is a package device including one or more embedded devices. The package device also includes a first encapsulant layer, the first encapsulant layer encapsulating the one or more embedded devices. The package device also includes one or more chiplet interposers, each of the one or more chiplet interposers having a substrate including a first material having a Young's modulus between 50 GPa and 100 GPa. The package device also includes a second encapsulant layer, the second encapsulant layer encapsulating the one or more chiplet interposers. The package device also includes a first redistribution structure disposed between the first encapsulant layer and the second encapsulant layer. The package device also includes and external connectors, where one or more of the external connectors are electrically coupled to the one or more embedded devices and to the one or more chiplet interposers. In an embodiment, the one or more chiplet interposers each include a dielectric fill layer. In an embodiment, the dielectric fill layer of at least one of the one or more chiplet interposers includes through vias traversing a thickness of the dielectric fill layer. In an embodiment, the package device further includes a second redistribution structure disposed between the external connectors and the one or more chiplet interposers, the second redistribution structure electrically coupling a first chiplet interposer of the one or more chiplet interposers with a second chiplet interposer of the one or more chiplet interposers. In an embodiment, the package device further includes a through via extending through the second encapsulant layer, the through via physically and electrically coupling the first redistribution structure directly to the second redistribution structure. In an embodiment, a first interposer of the one or more chiplet interposers includes a stitched redistribution structure, the stitched redistribution structure including a first metallization pattern having a first portion, a second portion, and an overlapping portion corresponding to an overlapping area of the first portion and the second portion, where a first metal line width of the first metallization pattern in the first portion is less than a second metal line width of the first metallization pattern in the overlapping portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first device, the first device laterally encapsulated by a first encapsulant;
   a first interposer, the first interposer comprising a dielectric fill layer, the first interposer free of a silicon layer, the first interposer laterally encapsulated by a second encapsulant;
   a first redistribution structure coupled to the first device and the first interposer, wherein the first redistribution structure is between the first device and the first interposer, the first redistribution structure laterally encapsulated by a third encapsulant; and external connectors, one or more of the external connectors are electrically coupled to the first device by way of the first interposer.

2. The package of claim 1, further comprising a set of through vias disposed in the dielectric fill layer.

3. The package of claim 1, wherein the first interposer includes a second redistribution structure on the dielectric fill layer, and further comprising:

a third redistribution structure, wherein the second first redistribution structure and the third redistribution structure are disposed on opposing sides of the dielectric fill layer.

4. The package of claim 3, wherein a width of the second redistribution structure is less than a width of the third redistribution structure.

5. The package of claim 4, wherein the third redistribution structure extends over the second encapsulant.

6. The package of claim 5, further comprising:

a second interposer, wherein the second interposer is laterally encapsulated by the second encapsulant, wherein the second interposer is electrically between the second redistribution structure and the first device.

7. The package of claim 1, further comprising a through via extending through the second encapsulant.

8. The package of claim 1, wherein the first interposer comprises a second redistribution structure, the second redistribution structure comprising a first metallization pattern, the first metallization pattern including an overlapping conductor, the overlapping conductor having a first width, a first metal line of the first metallization pattern having a second width, the first metal line extending continuously into the overlapping conductor, the first width being greater than the second width.

9. The package of claim 8, wherein a second metal line of the first metallization pattern extends continuously into the overlapping conductor at a side of the overlapping conductor opposite to the first metal line, the first metal line being offset from the second metal line, the first metal line being parallel to the second metal line.

10. A package device comprising:

one or more embedded devices;

a first encapsulant layer, the first encapsulant layer encapsulating the one or more embedded devices;

one or more chiplet interposers, each of the one or more chiplet interposers having a substrate comprising a first material having a Young's modulus between 50 GPa and 100 GPa;

a second encapsulant layer, the second encapsulant layer encapsulating the one or more chiplet interposers;

a first redistribution structure disposed between the first encapsulant layer and the second encapsulant layer;

a third encapsulant layer, the third encapsulant layer laterally encapsulating the first redistribution structure; and external connectors, wherein one or more of the external connectors are electrically coupled to the one or more embedded devices and to the one or more chiplet interposers.

11. The package device of claim 10, wherein the one or more chiplet interposers each comprise a dielectric fill layer.

12. The package device of claim 11, wherein the dielectric fill layer of at least one of the one or more chiplet interposers comprises through vias traversing a thickness of the dielectric fill layer.

13. The package device of claim 10, further comprising a second redistribution structure disposed between the external connectors and the one or more chiplet interposers, the second redistribution structure electrically coupling a first chiplet interposer of the one or more chiplet interposers with a second chiplet interposer of the one or more chiplet interposers.

14. The package device of claim 13, further comprising a through via extending through the second encapsulant layer, the through via physically and electrically coupling the first redistribution structure directly to the second redistribution structure.

15. The package device of claim 10, wherein a first interposer of the one or more chiplet interposers includes a stitched redistribution structure, the stitched redistribution structure comprising a first metallization pattern having a first portion, a second portion, and an overlapping portion corresponding to an overlapping area of the first portion and the second portion, wherein a first metal line width of the first metallization pattern in the first portion is less than a second metal line width of the first metallization pattern in the overlapping portion.

16. A package device comprising:

a first chiplet and a second chiplet, each of the first chiplet and the second chiplet comprising an insulating layer and a first redistribution structure, the first chiplet and the second chiplet being free of active devices;

a first encapsulant laterally adjacent the first chiplet and the second chiplet;

a second redistribution structure over the first chiplet, the second chiplet, and the first encapsulant;

a second encapsulant laterally adjacent the second redistribution structure;

a plurality of device dies attached to the second redistribution structure, wherein the second redistribution structure is between the plurality of device dies and the first chiplet;

a third encapsulant laterally adjacent the plurality of device dies; and a third redistribution structure over the first chiplet, the second chiplet, and the first encapsulant, wherein the first chiplet and the second chiplet are between the third redistribution structure and the second redistribution structure.

17. The package device of claim 16, further comprising:

through vias extending through the first encapsulant, the through vias electrically coupling the second redistribution structure to the third redistribution structure.

18. The package device of claim 16, wherein the first chiplet further comprises:

a dielectric layer on a surface of the first redistribution structure; and through vias extending through the dielectric layer to electrically coupled couple the first redistribution structure to the third redistribution structure.

19. The package device of claim 16, wherein the first chiplet further comprises:

a stitched redistribution structure, the stitched redistribution structure comprising a first metallization pattern having a first portion, a second portion, and an overlapping portion corresponding to an overlapping area of the first portion and the second portion, wherein a first metal line width of the first metallization pattern in the first portion is less than a second metal line width of the first metallization pattern in the overlapping portion.

20. The package device of claim 19, wherein a third metal line width of the second portion is less than the second metal line width.

* * * * *